United States Patent
Nagai

(10) Patent No.: US 7,075,055 B2
(45) Date of Patent: Jul. 11, 2006

(54) MEASURING DEVICE

(75) Inventor: Toshiaki Nagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 202 days.

(21) Appl. No.: 10/648,483

(22) Filed: Aug. 27, 2003

(65) Prior Publication Data

US 2006/0065820 A1    Mar. 30, 2006

(30) Foreign Application Priority Data

Aug. 30, 2002  (JP) .............................. 2002-253539

(51) Int. Cl.
*G02F 1/01* (2006.01)
*H10J 40/14* (2006.01)

(52) U.S. Cl. ...................... 250/225; 356/369

(58) Field of Classification Search ................ 250/216, 250/225; 324/244.1; 356/364–369
See application file for complete search history.

(56) References Cited

U.S. PATENT DOCUMENTS 5,004,307 A    4/1991  Kino et al.
5,394,381 A *  2/1995  Fukumoto et al. ....... 369/13.24
5,939,709 A    8/1999  Ghislain et al.

OTHER PUBLICATIONS

M. H. Kryder et al.; Journal of Applied Physics, vol. 40, No. 6, pp. 2469-2474.
M. R. Freeman et al.; J. Appl. Phys. 79 (8), Apr. 15, 1996.
Nonaka et al.; Semiconductor and Material Department Meeting of Electronic Society, 1983, p. 48.
Patent Abstracts of Japan, Pub. No. 05215828, dated Aug. 27, 1993.
Patent Abstracts of Japan, Pub. No. 06236586, dated Aug. 23, 1994.
W.W. Clegg et al.; Journal of Magnetism and Magnetic Materials, vol. 95, pp. 49-57, 1991.
R.J.M. van de Veerdonk et al.; Journal of Magnetism and Magnetic Material, vol. 235, pp. 138-142, 2001.
H. Ohmori, Journal of Magnetic Society of Japan, vol. 23, No. 12, pp. 2111-2117, 1999.
E. Betzig et al.; Applied Physics Letters, vol. 61, No. 2, Jul. 1992.

* cited by examiner

*Primary Examiner*—Stephone B. Allen
*Assistant Examiner*—Suezu Ellis
(74) *Attorney, Agent, or Firm*—Armstrong, Kratz, Quintos, Hanson & Brooks, LLP.

(57) ABSTRACT

Provided is a measuring device which has a focusing unit for focusing light flux from a light source and irradiating it to a magnetic substance to be measured, a half-turn asymmetric element acting only on the light flux reflected by the magnetic substance to be measured and acting in such a manner that its action on polarization distribution in a cross section of the light flux has asymmetry nature about half-turn around an optical axis in order to obtain sensitivity to in-plane magnetization vector components of the magnetic substance to be measured, and a polarization split detector for detecting a light amount of a polarization component in one direction or separated each component of polarization components orthogonal to each other of the light which receives action of the half-turn asymmetric element so that the in-plane magnetization vector component in one direction can be measured separately from other components.

28 Claims, 28 Drawing Sheets

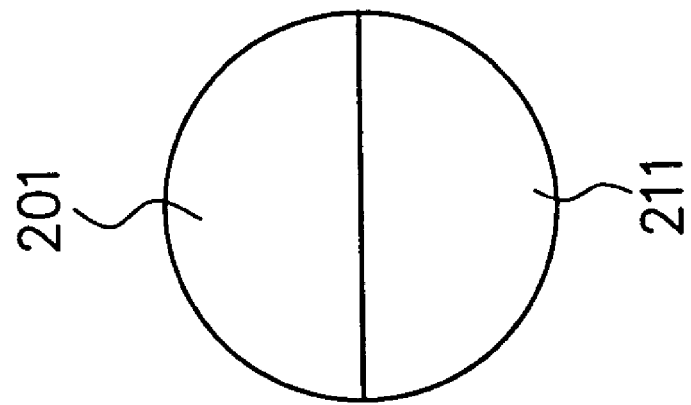
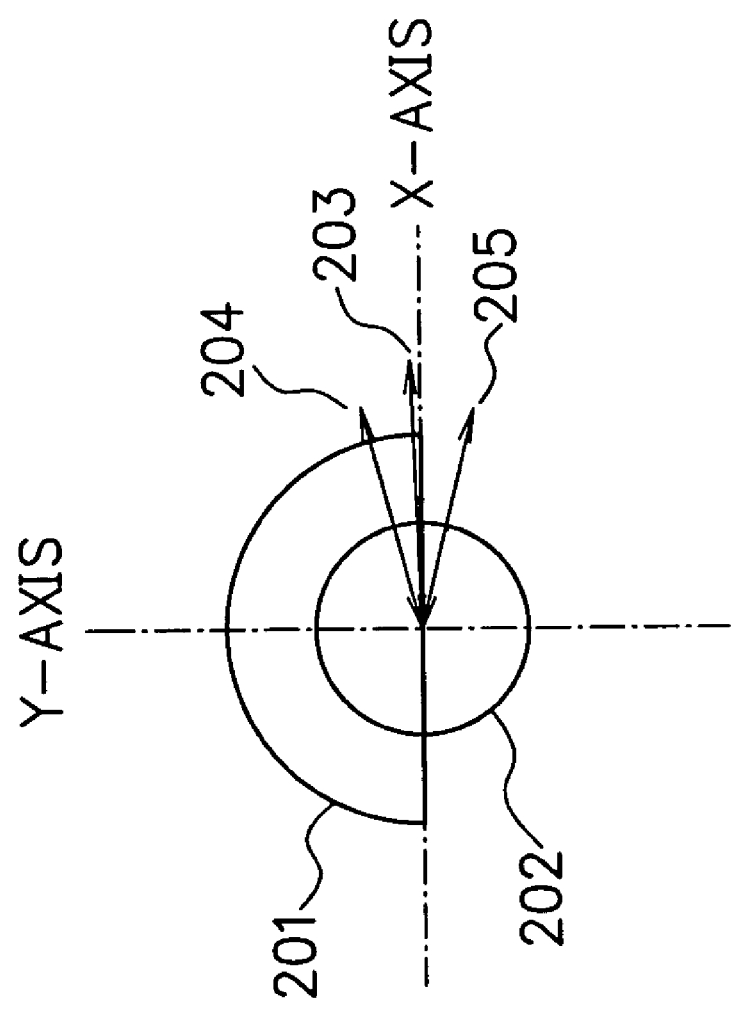

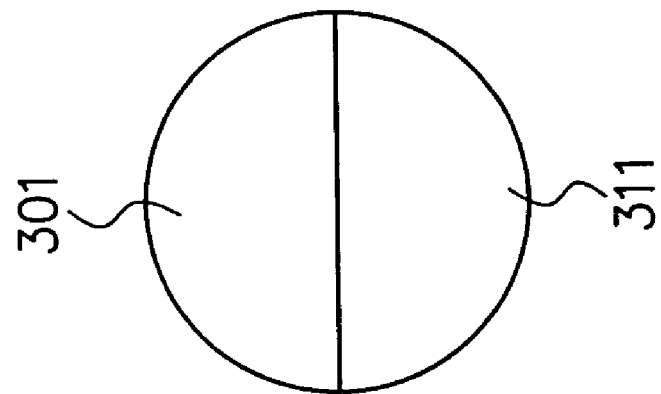
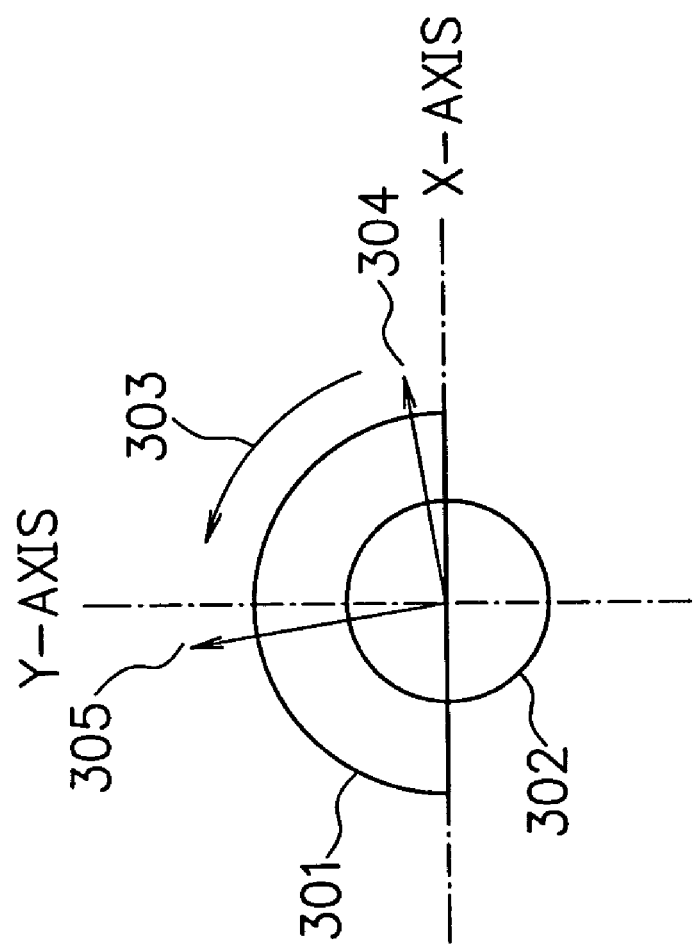

F I G. 15
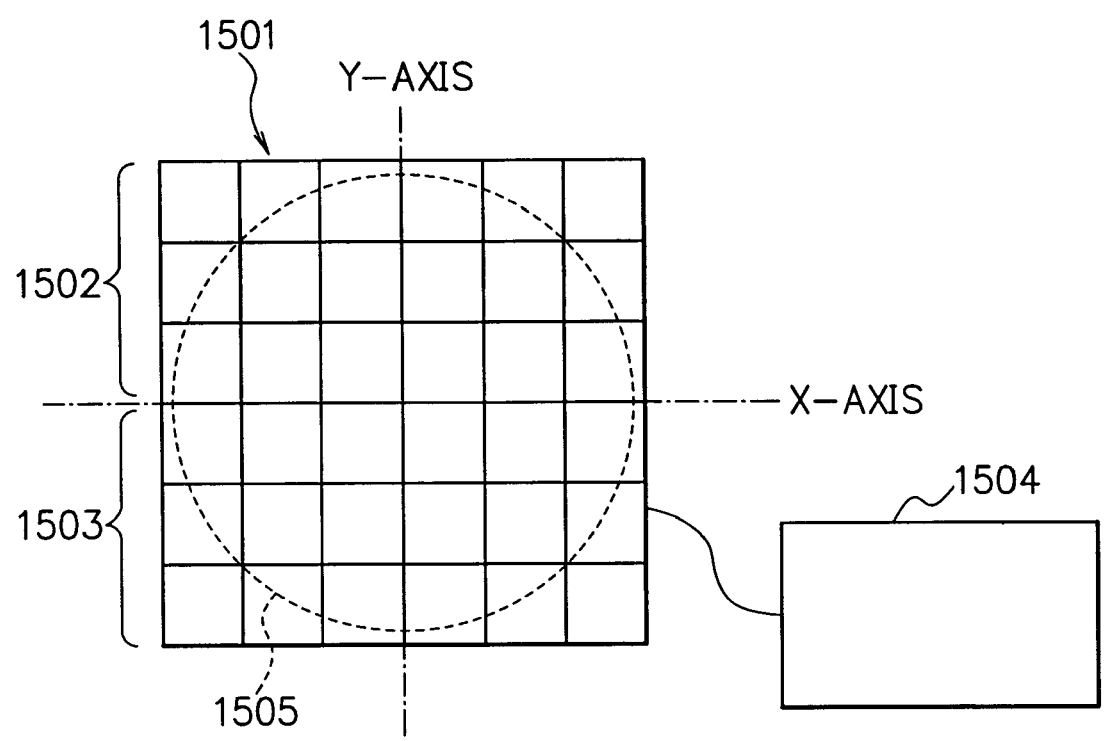

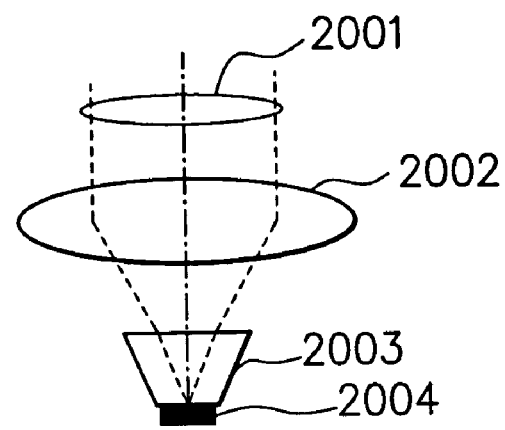
F I G. 20A
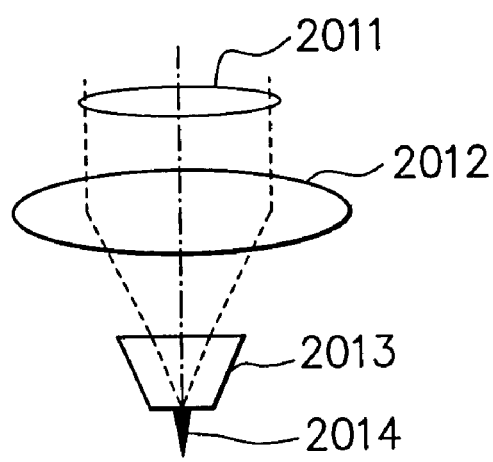
F I G. 20B
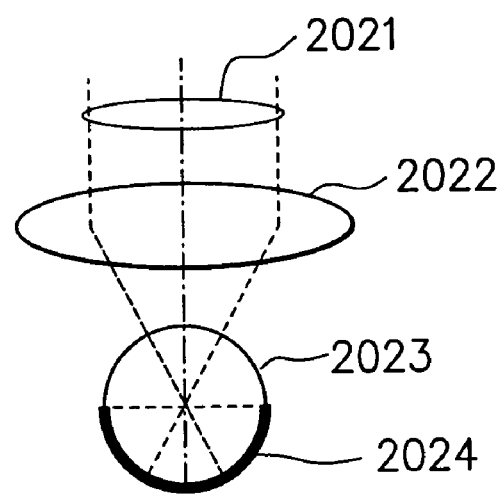
F I G. 20C

MEASURING DEVICE

CROSS-REFERENCE TO RELATED APPLICATIONS

This application is based upon and claims the benefit of priority from the prior Japanese Patent Application No. 2002-253539, filed on Aug. 30, 2002, the entire contents of which are incorporated herein by reference.

BACKGROUND OF THE INVENTION

1. Field of the Invention

The present invention relates to a measuring device, and particularly to a measuring device for detecting magneto-optical effects such as a magnetic Kerr effect and a Faraday effect.

2. Description of the Related Art

In order to measure a magnetization state of a magnetic substance, a method of irradiating light to the magnetic substance and detecting change in polarization state and reflectivity of the reflected light due to a magnetic Kerr effect is widely being used. For example, with a device called a Kerr effect measuring device, a Kerr effect magnetic domain observing device, and the like, M-H characteristics can be measured and magnetic domains can be observed by a camera, and a linearly polarized light source in which output of a lamp light source is passed through a polarizer or a laser light source is used. Further, there is a device called a micro Kerr measuring device, a scanning-type Kerr effect microscope, and the like for observing a magnetization state of a fine region, in which magnetization at a laser focusing spot can be measured by using the laser light source and focusing light by an object lens to detect polarization of the reflected light by a sample, and a magnetized distribution image can be obtained by conducting the magnetization measurement while scanning the sample or the position of the laser spot.

Furthermore, using a pulsed light source in these devices, a method of conducting stroboscopic image-observation of magnetized distribution which changes at high speed (for example, M. H. Kryder and F. B. Humphrey, "Dynamic Kerr Observations of High-Speed Flux Reversal and Relaxation Processes in Permalloy Thin Films", Journal of Applied Physics Volume 40, Number 6, pp. 2469–2474) and a method of measuring high-speed magnetization responses at a laser focusing position (for example, M. R. Freeman and J. F. Smyth "Picosecond time-resolved magnetization dynamics of thin-film heads" J. Appl. Phys. 79(8), 15 Apr. 1996) are also used.

Moreover, the magnetic Kerr effect is also used for reading magnetic recording data of a magnetic medium in a magneto-optical recording device.

When collimated light having linear polarization is incident, the magnetic Kerr effect is classified into three kinds of a polar Kerr effect, a longitudinal Kerr effect, and a transverse Kerr effect according to relationship between a magnetized direction of the magnetic substance and a plane of incidence of the light.

The polar Kerr effect occurs when the magnetized direction of the magnetic substance is perpendicular to a surface of the magnetic substance, and rotation and ellipticity of polarization of a reflected light are caused according to magnetization value when linearly polarized light of P-polarization or S-polarization is incident.

The longitudinal Kerr effect occurs when the magnetized direction of the magnetic substance is parallel to the surface of the magnetic substance and the plane of incidence, and rotation and ellipticity of polarization of the reflected light are caused according to magnetization value when the linearly polarized light of P-polarization or S-polarization is incident.

The transverse Kerr effect occurs when the magnetized direction of the magnetic substance is parallel to the surface of the magnetic substance and perpendicular to the light incident plane, and it is a phenomenon that reflectivity changes according to magnetization value, and rotation and ellipticity of polarization are not caused when the linearly polarized light of P-polarization is incident while change according to magnetization value is not caused when the linearly polarized light of S-polarization is incident.

In the Kerr effect measuring device for measuring magnetic characteristics of a magnetic film, which does not require high spatial resolution, these three kinds of Kerr effects can be separately measured by irradiating the collimated light from the laser light source to the magnetic film as it is in the P-polarization state or the S-polarization state without being focused, and observing change in polarization rotation, ellipticity of polarization, and light amount of the reflected light.

On the other hand, in the micro Kerr measuring device for observing the magnetization state of the fine region with high spatial resolution, the light from the lamp light source or the laser light source is focused by a focusing lens and irradiated to the magnetic substance, and the reflected light is focused by the same focusing lens to conduct observation. In this case, the focused light to be irradiated to the magnetic substance includes incident planes having continuously different azimuth angles and, further, includes beam components having continuously different incident angles for the light having the respective incident planes. Furthermore, considering the focused light separated by the respective incident planes, even if the light from the light source is linearly polarized light having a fixed polarization azimuth, a P-polarization component and an S-polarization component exist at different ratios according to the azimuth angles of the incident planes. Therefore, considering the focused light flux separately by each of the different incident planes, only the polar Kerr effect is caused by a perpendicular magnetization vector component from the definition while there exists an incident plane where both of the longitudinal Kerr effect and the transverse Kerr effect exist together caused by an in-plane magnetization vector component irrespective of the relationship between its direction and the polarization azimuth of the light of the light source. The transverse Kerr effect does not cause polarization rotation of the reflected light of P-polarization and S-polarization but causes effective rotation of the polarization azimuth of polarized light having a general azimuth because of change in reflectivity of the P-polarization component thereof. Accordingly, even if a polarization detection system for detecting polarization rotation of the reflected light is used, the transverse Kerr effect generally exerts influence on each of the incident planes when a focusing and irradiation optical system is used. As stated above, when the light is focused by the object lens and irradiated to the magnetic substance, the polar Kerr effect, the longitudinal Kerr effect, and the transverse Kerr effect are complicatedly mixed, and special conditions become necessary for measuring only one component among the perpendicular magnetization vector component and two orthogonal in-plane magnetization vector components completely separately.

In order to measure the magnetic component perpendicular to the surface of the magnetic substance to be measured with high spatial resolution, the laser light outputted as linearly polarized light is made incident in an axially symmetric manner with respect to the optical axis center of a pupil of the object lens without deviation, and focused and irradiated to the surface of the magnetic substance, and its reflected light is focused by the same object lens while keeping the axial symmetry nature so as to detect change of polarization state thereof uniformly in the whole of the light flux. In this case, the longitudinal Kerr effect and the transverse Kerr effect generated by the in-plane magnetization vector components cancel each other as the whole of the light having the different incident angles and planes, which is focused in the axially symmetric manner, and the polar Kerr effect, namely, the perpendicular magnetization vector component remains.

In measuring the in-plane magnetization vector components, a method of deviating a position of the incident light on the object lens pupil is general, in which, for example, the light is made incident on a half of the object lens pupil with its light incident angle being deviated from the perpendicular direction to the surface of the magnetic substance, and the reflected light is taken from the other half of the object lens pupil to detect the polarization state so that measurement is conducted using the longitudinal Kerr effect and the transverse Kerr effect (for example, Semiconductor and Material Department Meeting of Electronic Communication Society, 1983, p. 48, "Magnetized distribution measurement of micropermalloy patterns", Nonaka et al., and Japanese Patent Application Laid-open No. Hei 5-215828 "Magnetic Domain Structure Analyzing Device".

Moreover, described in Japanese Patent Application Laid-Open No. Hei 6-236586, "Magneto-Optical Recording Medium, Magneto-optical Recording And Reproducing Method Using The Same, And Magneto-Optical Recording And Reproducing Device" is a method of reading magnetized recording information in two directions in a flat plane using two kinds of light sources having different polarization azimuths.

In addition, also used is a method of separately detecting the perpendicular magnetization vector component and the in-plane magnetization vector components, in which the laser light is made incident on the object lens pupil without being deviated from the optical axis center when the light is incident on the object lens and the reflected light is focused by the object lens, similarly to the measurement of the polar Kerr effect, and components of the focused incident/reflected light by the object lens are separately detected using a two-divided or four-divided photo-detector and a detection signal of each divided part of the photo-detector is electrically added and subtracted so that the each component of magnetization vector is detected (for example, W. W. Clegg, N. A. E. Heyes, E. W. Hill, and C. D. Wright, "Development of a scanning laser microscope for magneto-optic studies of thin magnetic films", J. Magn. Magn. Mat., vol. 95, pp. 49–57, 1991, R. J. M. Veerdonk, Ganping Ju et al., "Real-time observation of sub-nanosecond magnetic switching in perpendicular multilayers" Journal of Magnetism and Magnetic Materials 235 (2001) p. 138–142, Journal of Magnetic Society of Japan, Vol. 23, No. 12, 1999, "Techniques for Analysis of Magnetic Recording Heads and Magnetoresistive Heads" Hiroyuki Ohmori.

In the method of deviating intensity distribution of the light incident on the object lens pupil, for example, the method in which the light is made incident on the half of the pupil with its light incident angle being deviated from the perpendicular direction to the surface of the magnetic substance, and the reflected light is taken from the other half of the object lens pupil to detect the polarization state so that the in-plane magnetization vector components are measured using the longitudinal Kerr effect and the transverse Kerr effect, there is a disadvantage that the polar Kerr effect by the perpendicular magnetization vector component is also detected at the same time. Further, it is easy to make a light beam having the diameter approximately half of that of the pupil incident on the half of the pupil in order to efficiently use the light from the light source but, in this case, spatial resolution is degraded because actually-used effective numerical aperture NA among the NA of the object lens becomes substantially small. If the light beam from the light source having the diameter approximately the same or larger than the diameter of the object lens pupil is made incident on the object lens with a half thereof being shielded, the effective NA can be made somewhat larger than in the aforesaid method, but there still exists a problem that spatial resolution is degraded and light usage efficiency also considerably lowers.

Furthermore, described in Japanese Patent Application Laid-open No. Hei 6-236586 is the method of reading magnetized recording information in two directions in the flat plane using the two kinds of light sources having different polarization azimuths, and a method for realizing it has the structure in which two heads as light sources are provided or two light sources having different wave-length are used and the light sources for outputting two polarized light are independently placed to separate light into two polarization optical paths and thereafter detect two polarization rotation by two independent polarization rotation detectors. In this case, since the two light sources operate incoherently and independently, an obtained light intensity focusing spot becomes a spot resulting from overlaying light intensity focusing spots which are independently formed by the respective two light sources, which reduces the effective NA similarly to the above description and lowers focusing performance. Furthermore, a realizing method for making detectivity to the perpendicular magnetization vector component zero is not described. Moreover, a method for realizing measurement of the perpendicular magnetization vector component is not described nor a method for realizing measurement of the perpendicular magnetization vector component separately from the in-plane magnetization vector components is not described. In addition, since the two independent light sources and polarization detectors are used, the structure is complicated and not easy to adjust.

Further, in the method of separately detecting the perpendicular magnetization vector component and the in-plane magnetization vector components using the two-divided or four-divided photo-detector, an amplifier such as an I/V conversion amplifier for amplifying an output current signal of each element of the divided photo-detector, or the like becomes necessary, and each output of the amplifier is needed to be added and subtracted, which degrades an S/N because amplifier noise is also added at this time. For example, when two outputs of an amplifier having the same noise power are added or subtracted, a noise voltage becomes $\sqrt{2}$ times as compared with a case of one I/V conversion amplifier even though noise generated by an add-subtract circuit (here, gain of the add-subtract circuit is supposed to be 1 for convenience of the explanation) is neglected and, when four outputs are added or subtracted, the noise voltage becomes twice. Since the magnetic Kerr effect is feeble, a fine signal buried in circuit noise or other noise needs to be extracted by signal processing, and a problem that measurement accuracy directly lowers arises if noise is thus increased.

Furthermore, the light incident position on the two-divided or four-divided photo-detector needs to be precisely adjusted so that a divisional detection ratio of the light becomes a predetermined ratio, that is, the light is equally distributed to each divided part in general, and this adjustment becomes difficult if an element having a small light receiving area is used. Moreover, in the case of a differential polarization detecting optical system in which two of the divided photo-detectors are used and two orthogonal polarization components are detected to obtain difference therebetween, light amount noise is canceled and a high S/N is easily obtained but, in this case, light incident positions on the two divided detectors have to be adjusted at the same time, which becomes more difficult.

Meanwhile, in the case of a photo-detector having a large light receiving area, since junction capacitance of the detector becomes large and high-speed response is not easily obtained as well as it is difficult to realize an I/V amplifier capable of giving the high-speed response while having large input capacitance, a problem that a high-speed light receiving and detection system cannot be formed arises. In addition, it is also difficult to realize an add-subtract circuit which accurately operates at a high frequency.

Further, in the method of using the two-divided or four-divided photo-detector, the center of the reflected light flux reflected by one point of the magnetic substance needs to be aligned with the center of the divided photo-detector. Therefore, the method of using the divided photo-detector can be applied to a scanning-type laser microscope using a point light source, but it is impossible to simultaneously irradiate the light from the light source to a certain region of the sample, focus the reflected light by an imaging lens, and receive its image by a CCD camera so as to observe in-plane magnetized distribution in an image. For example, even if pixels adjacent to each other of the CCD camera are handled as the divided photo-detector, the light reflected by immediately adjacent spots on the magnetic substance and focused near these pixels is mixed. Accordingly, the method of using the divided photo-detector cannot be applied to a general microscope observing method in which an image is collectively observed by a camera, even if the photo-detector is made in an array form. Furthermore, visual observation through an eyepiece lens is also impossible.

In addition, in the method of using the two-divided or four-divided photo-detector, two orthogonal axes for measuring the in-plane magnetization vector components are fixed to directions determined by divided directions of the photo-detector. Further, a complicated mechanism becomes necessary to make orientation of the photo-detector rotatable in order to freely rotate the axes.

SUMMARY OF THE INVENTION

It is an object of the present invention to provide a measuring device of high spatial resolution and a high S/N having simple structure and capable of measuring in-plane magnetization and/or magnetic field vector components, or capable of measuring in-plane magnetization and/or magnetic field vector components separately from perpendicular magnetization and/or magnetic field vector component.

According to one aspect of the present invention, in a magnetization measuring device which comprises: a light source; a focusing unit for focusing light flux from the light source and irradiating it to a magnetic substance to be measured; and a polarization split detector for detecting a light amount of a polarization component in one direction or separated each component of polarization components orthogonal to each other by a photo-detector in order to detect change in polarization state or light amount of the light flux reflected by the magnetic substance to be measured due to a magneto-optical effect, a half-turn asymmetric polarizing element acting only on the reflected light from the magnetic substance to be measured and acting in such a manner that its action on polarization distribution in a cross section of incident light flux has asymmetry nature about half-turn around an optical axis is included so that a measuring device capable of measuring in-plane magnetization vector components of the magnetic substance to be measured is provided. Since the numerical aperture (NA) of the focusing unit can be maximally utilized and light utilization efficiency can be also increased, an S/N of measurement can be increased with high spatial resolution.

Further, the half-turn asymmetric polarizing element is made to be a half-turn asymmetric reflectional symmetry polarizing element whose action on the incident light flux has reflectional symmetry nature with respect to a certain plane including the optical axis in addition to the aforesaid half-turn asymmetric polarizing element so that a measuring device capable of measuring only one component of in-plane magnetization vectors among magnetization vectors, which include three-dimensional components of the magnetic substance to be measured, separately from other two orthogonal components. Since the photo-detector can be simply structured, an S/N of measurement can be increased.

Furthermore, an image detection element can be also used as the photo-detector according to the principle of this measurement, and a magnetization image observing device is provided which is capable of observing in-plane magnetization component, or capable of separately observing one component of in-plane magnetization among the three components of the magnetization vectors with high spatial resolution and a high S/N.

Moreover, a unit for moving or rotating a position of the half-turn asymmetric reflectional symmetry polarizing element is included to switch a position or a rotation angle of the polarizing element so that a measuring device is provided which is capable of separately measuring each component of the three-dimensional magnetization vectors of the magnetic substance to be measured by switching.

BRIEF DESCRIPTION OF THE DRAWINGS

FIGS. 2A and 2B are diagrams showing examples of a divisional half-wave element as a typical example of a half-turn asymmetric polarizing element according to a second embodiment of the present invention;

FIGS. 3A and 3B are diagrams showing examples of a divisional polarization rotation element as a typical example of the half-turn asymmetric polarizing element according to a third embodiment of the present invention;

FIG. 15 is a diagram showing an example of a spatial phase modulator according to an eleventh embodiment of the present invention;

FIGS. 20A to 20C are diagrams showing examples of a magnetic field probe according to a sixteenth embodiment of the present invention;

DETAILED DESCRIPTION OF THE PREFERRED EMBODIMENTS

Figure 1:
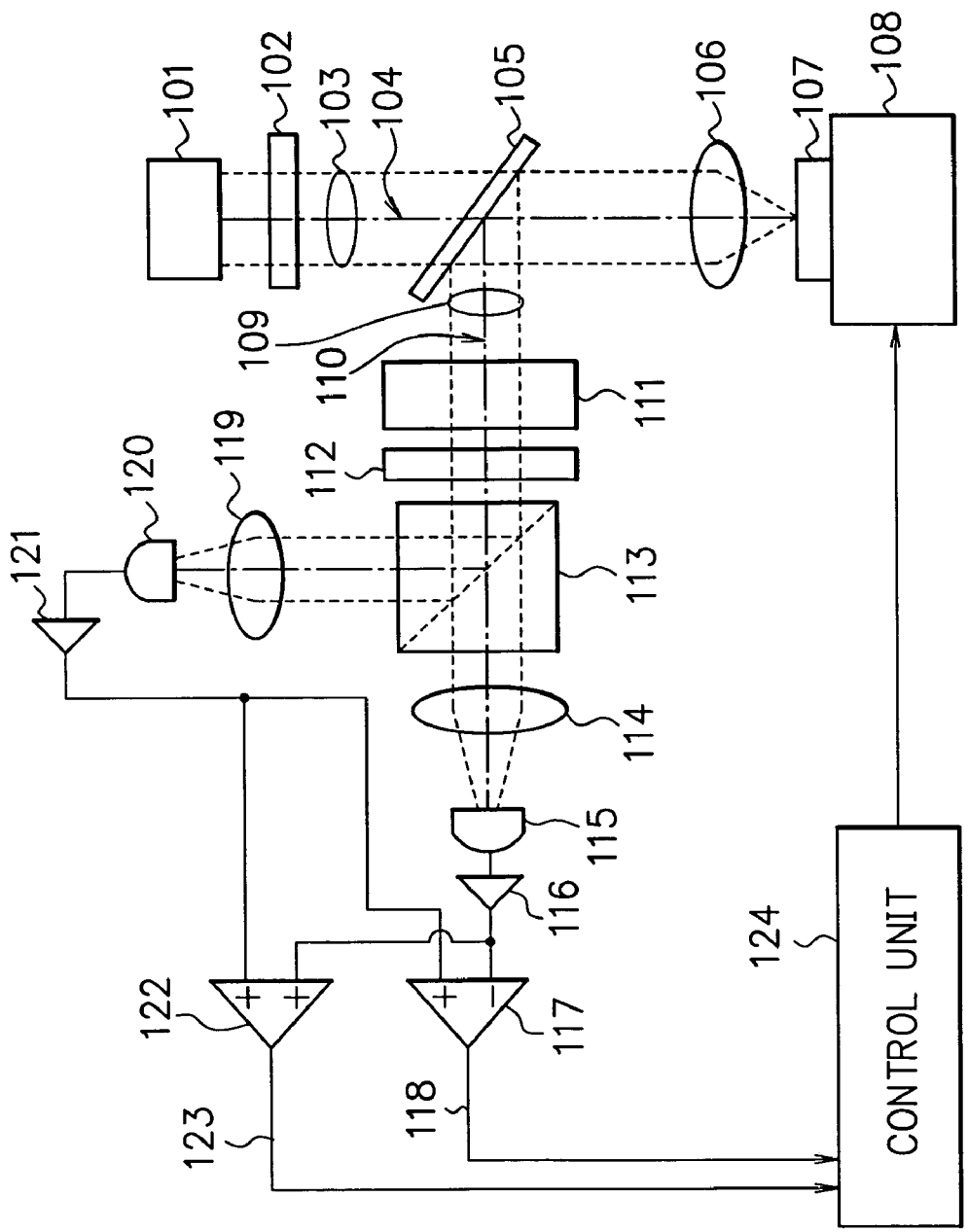
FIG. 1 is a diagram showing a constitutional example of a measuring device according to a first embodiment of the present invention.

Embodiments of the present invention relate to methods of measuring in-plane magnetization vector components with high spatial resolution, and particularly to a measurement method while suppressing degradation in focusing performance and spatial resolution, a measurement method of measuring a perpendicular magnetization vector component and two in-plane magnetization vector components completely separately, a measurement method of measuring the in-plane magnetization vector components and the perpendicular magnetization vector component by switching, a method with simple structure, and a method in which an optical axis is easily adjusted. Further, they can be applied to measurement of a magnetic field.

At first, necessary matters for explaining the embodiments of the present invention will be described. When whether or not a perpendicular magnetization vector component and in-plane magnetization vector components are detected is searched in measuring a magneto-optical effect, basic characteristics are found utilizing spatial rotational symmetry nature, spatial inversion symmetry nature, and particularly reflectional symmetry nature of the physical law. The spatial rotational symmetry nature is the cause of a law of conservation of angular momentum. The reflectional symmetry nature is the cause of a law of parity conservation, and known not to hold in a week interaction as to cause beta decay, but the law of parity conservation holds in a range of an electromagnetic interaction phenomenon as to be handled here. If the physical law has rotation symmetry nature and the reflectional symmetry nature, it can be said that "when a certain phenomenon is allowed under the physical law, a phenomenon resulting from rotation of the phenomenon by any angle or reflection thereof is also allowed under the same physical law". Further, assuming that a solution to a physical equation under the initial conditions is unique, it can be said that "a result of a phenomenon starting from a rotational or reflectional symmetry initial state also becomes the rotational or reflectional symmetry state". At this time, it should be noted that a magnetization vector and a magnetic field vector act not as normal polar vectors such as electric field vectors but as axial vectors. A sign of the polar vector is changed by spatial inversion but that of the axial vector is not changed. When reflection is caused with respect to a certain plane (referred to as a reflectional plane), a sign of a component of the polar vector perpendicular to a mirror is changed by the reflection and that of a component parallel to the reflectional plane is not changed while a sign of a component perpendicular to the mirror of the axial vector is not changed and that of a component parallel to the mirror is changed.

A magneto-optical effect handled here is a linear effect of magnetization and a magnetic field, and it is supposed that the effect caused by a magnetization vector in any direction is allowed to be considered by separating the magnetization vector into components of any direction. A magnetic Kerr effect and a Faraday effect are linear effects of magnetization and the magnetic field.

A polarization split detector used here for detecting the magneto-optical effect has uniform characteristics in a cross section of incident light flux and outputs, as detection output, light intensity of a separated polarization component in one direction, or difference or linear combination of light intensity of two orthogonal polarization components (referred to as differential polarization detection (detector) when it outputs this difference). Therefore, detection output characteristics of the polarization split detector are not changed by half-turn around an optical axis of the incident light.

Further, it is supposed that the polarization split detector outputs an amount of change (including the case of zero proportional coefficient) proportional to change (including both positive and negative change) in magnetization value in any direction, and a term of the square of the magnetization or larger can be neglected as compared with the output (a constant irrelevant to the magnetization may be included). In other words, when Mx, My, and Mz are three orthogonal components of magnetization and A, B, C, and D are constants (including zero), the output can be represented by the following formula.

Output of the polarization split detector=A+B×Mx+C×My+D×Mz.

Since the magneto-optical effect to be measured is generally a fine effect, this characteristic is included except a special case. However, for example, in the case where so-called cross-Nicol arrangement in which a polarization azimuth of a linearly polarized light source is made perpendicular to a polarization azimuth of an analyzer is complete, the term proportional to the magnetization becomes zero and a signal proportional to the square of the magnetization is obtained, and therefore such measurement arrangement is to be avoided.

When reflected light by a magnetic substance to be measured is detected, the polarization split detector actually needs to be placed at a position where the reflected light is split from an optical path of a light source by a beam splitter or the like. However, if a beam splitter not having polarizing characteristics for transmission and reflection is used, the arrangement can be considered as substantially equivalent to virtual arrangement in which the reflected light is received by the polarization split detector arranged coaxially with an optical axis of the light source and a focusing unit as it is without being split (light amount loss at a fixed ratio by the split is considered), and rotational and reflectional operation can be easily considered.

When the light flux is bent by the beam splitter or the like, the X-Y coordinates set in the cross sections of the light flux before and after the bending are to be set so that the X-Y coordinates coincide by being bent perpendicularly to the optical axis together with the light flux without being rotated. The reference of an azimuth angle in the cross section of the light flux is set with reference to X-Y coordinates set as described above, and an azimuth of a X-axis is defined as 0 degree. X-Y coordinates and azimuth angle reference set in a plane of the magnetic substance to be measured are also to be set so that they coincide with X-Y coordinates and azimuth angle reference set in a cross section of the light flux incident perpendicularly thereto.

Further, for simplification, a magnetization state of the magnetic substance to be measured is considered as uniform in a laser focusing spot or a resolution limit of a microscope.

Incidentally, in this specification, a fast axis or a slow axis of a linear phase shifter such as a half-wave element is referred to as a neutral axis and its azimuth is referred to as a neutral axis azimuth. It should be noted that the term "principal axis" is used for a long axis and a short axis of an ellipse. There are some cases where an azimuth angle of the neutral axis and the principal axis azimuth is defined as represented in a range of ±90 degrees, 0 to 180 degrees, or the like, but such limitation of the range is not provided here because of inconvenience. In other words, azimuth angles having difference of an integral multiple of 180 degrees are equal. Furthermore, a term "optical axis" used here means an optical axis used in the geometrical optics, and is different from an optic axis of a double refraction crystal and the fast axis and slow axis described above.

Reflection generally means reflection with respect to a certain flat plane in a three-dimensional space but, here, reflection in a two-dimensional flat plane with respect to a straight line (also referred to as a reflectional line) in the flat plane is used to mean "conversion in the two-dimensional flat plane caused by reflection in a three-dimensional space with respect to a flat plane including the reflectional line and a line perpendicular to the two-dimensional flat plane" other than the aforesaid meaning.

A reflectional symmetry line means the reflectional line when this two-dimensional reflectional symmetry nature is exhibited.

Moreover, in this specification, the following expressions and terms are used in the meanings below.

An expression that an optical element acting on one input light flux to generate one output light flux has symmetry natureabout certain conversion, such as half-turn symmetry nature (around an optical axis) and reflectional symmetry nature (with respect to a certain plane including the optical axis), or is unchanged means that polarization state distribution and intensity distribution of the output light flux of the optical element are unchanged, in spite of the conversion made to the optical element, for any polarization state distribution and intensity distribution of the input light flux in a cross section of the light flux inputted into a predetermined region of the optical element. For example, since a normal microscope object lens has rotationally symmetric structure around an optical axis, it is not changed by rotation of any angle around the optical axis.

In this case, particularly if the polarization state distribution and intensity distribution of the input light are also symmetric (unchanged) about the conversion, the polarization state distribution and intensity distribution of the output light of the optical element are also symmetric (unchanged) about the conversion.

When a polarization optical element somewhat acing on polarization state distribution of input light flux has (does not have) the aforesaid symmetry nature, the action on the input light flux is also expressed as "to act so that its action on polarization distribution in a cross section of the light flux has (does not have) symmetry nature about the conversion" and, particularly when the polarization optical element has (does not have) half-turn symmetry nature, it is referred to as a "half-turn symmetric (asymmetric) polarizing element". When this "half-turn asymmetric polarizing element" further has reflectional symmetry nature, it is referred to as a "half-turn asymmetric reflectional symmetry polarizing element". For example, the linear phase shifter such as a half-wave plate uniformly acting on incident light flux is a half-turn symmetric polarizing element because it is characterized by generated phase difference between orthogonal neutral axes.

A polarization rotation element means an element which causes rotation of a fixed angle to any input polarization state and makes output, and it is differentiated from an element such as the half-wave plate whose output polarization has different rotation angle depending on an azimuth of input polarization.

First Embodiment

FIG. 1 is a diagram showing an example of the structure of a measuring device according to a first embodiment of the present invention. It is supposed that a laser light source is used as a linearly polarized light source 101, and its output light flux has circular or elliptic intensity distribution and has polarization azimuths in azimuths of principal axes of the ellipse. The case without half-wave plates 102 and 112 will be first explained. Light from the light source 101 is focused by an object lens 106 as a focusing unit after passing through a beam splitter 105, and incident on a magnetic substance to be measured 107, and the reflected light is focused by the object lens 106 and reflected by the beam splitter 105 to be guided to a detector.

The optical system described above has an optical axis 104. Alternatively, it is also suitable to reflect the light from the light source 101 by the beam splitter 105, focus and irradiate it to the magnetic substance to be measured 107, and detect the reflected light passed through the beam splitter 105. A reflecting direction of the beam splitter 105 should be adjusted along a direction of a reflectional symmetry plane of the light source 101 or a direction perpendicular thereto so as not to disturb reflectional symmetry nature of the output light flux of the light source 101 by polarization characteristics of the beam splitter 105. Further, the beam splitter 105 is desirably of a nonpolarization-nonretardation property in order to avoid unnecessary polarization change. Furthermore, the object lens 106 is axially symmetric and its center axis is the optical axis 104 of this optical system, which coincides with optical axes of the incident and reflected light flux.

Reflected light 109 by the magnetic substance to be measured 107 is split into two orthogonal beams of linearly polarized light by a polarization beam splitter 113 after passing through a "half-turn asymmetric polarizing element" 111, focused by focusing lenses 114, 119, and detected by photo-detectors 115, 120 respectively. The "half-turn asymmetric polarizing element" 111 has, for example, a half-wave plate 201 in its upper half and a glass plate 211 in its lower half as shown in FIG. 2B. As shown in FIG. 2A, an azimuth angle of a neutral axis 203 of the half-wave plate 201 is 0 degree, that is, it coincides with an X-axis, and linearly polarized light having a polarization azimuth 205 is outputted when linearly polarized light in a polarization azimuth 204 is incident. The polarization azimuth 204 of the incident light and the polarization azimuth 205 of the output light are symmetric with respect to the neutral axis 203. On the other hand, the glass plate 211 passes the light as it is. The polarization beam splitter 113 splits the light into two orthogonal beams of linearly polarized light. The optical system described above has an optical axis 110.

If required, the half-wave plate 102 may be inserted at output of the light source 101, or the half-wave plate 112 may be inserted in an optical path before or after the "half-turn asymmetric polarizing element" 111, before the object lens 106, or the like. Conversely, they may be omitted.

As the photo-detectors 115, 120, for example, semiconductor photo-detectors (photodiodes) or photoelectron multipliers (photo multipliers) are used. The two photo-detectors 115, 120 output electric currents according to light amounts. The outputs are converted to voltages by I/V amplifiers 116, 121. A differential amplifier 117 outputs a differential polarization detection signal 118 between the two voltages to a control unit 124. An adder amplifier 122 outputs a sum signal 123 of the two voltages to the control unit 124.

The differential signal 118 is a signal obtained by detecting a magneto-optical effect as a result of magnetization of the magnetic substance to be measured 107. The sum signal 123 is not necessarily required, but it serves as a reflected light amount signal and enables measurement of a reflected light amount image.

Magnetized distribution and reflected light distribution of the magnetic substance to be measured 107 are obtained by moving a stage 108 through the control of the control unit 124 and scanning a position of the magnetic substance to be measured 107 for the aforesaid detection.

The insertion of the "half-turn asymmetric polarizing element" 111 in the optical path disturbs symmetry nature about half-turn of polarization detection characteristics of the optical system so that sensitivity to in-plane magnetization vector components can be given. Further, since the light is focused and irradiated to the magnetic substance to be measured 107 and the reflected light is focused by aligning a center axis of the output light of the laser light source 101 with the optical axis 104 of the optical system, that is, the center axis of the object lens 106, high focusing performance is obtained. Furthermore, the "half-turn asymmetric polarizing elements" 111 does not act on the optical path up to focusing and irradiation of the laser light, and therefore focusing performance is not degraded by disturbance of polarization distribution or wave front. Moreover, light utilization efficiency is high because there is also no need to conduct partial shielding for deviating light intensity distribution from the optical axis.

Incidentally, a half-wave plate, a polarization rotation element, or a Faraday element may be inserted at any position in the optical path with the aim of switching the polarization azimuth of the light source 101, adjusting a polarization azimuth, obtaining polarization rotation angle reference, or the like.

As the "half-turn asymmetric polarizing element" 111, countless kinds thereof can be made by dividing and bonding a double refraction element, the polarization rotation element, and the like, but a divisional half-wave element and a divisional polarization rotation element to be described below are typical and simple.

[Divisional Polarizing Operation to Reflected Light (Half-turn Asymmetry)]

(Structure 1)

This is the magnetization measuring device for measuring a magnetization state of the magnetic substance to be measured by focusing the light flux from the light source 101 by the focusing unit 106, irradiating it to the magnetic substance to be measured 107, and detecting change in polarization state or light amount of the reflected light caused by the magneto-optical effect by the polarization split detector 113 to 117, 119 to 121 for detecting a light amount of a polarization component in one direction or separated each component of polarization components orthogonal to each other, and the "half-turn asymmetric polarizing element" 111 which acts only on the light flux reflected by the magnetic substance to be measured and whose action on the polarization distribution in a cross section of the light flux has asymmetry nature about half-turn around the optical axis is made so that sensitivity to the in-plane magnetization vector components of the magnetic substance to be measured 107 is given.

It is supposed that the light flux from the light source 101 whose intensity distribution and polarization state distribution in the cross section of the light flux have half-turn symmetry nature around the optical axis of the optical system is perpendicularly focused and irradiated to the magnetic substance to be measured 107 by the focusing unit 106, and the reflected light is focused by the focusing unit and detected by the polarization split detector. In other words, the case without the "half-turn asymmetric polarizing element" 111 will be first considered.

An in-plane magnetization vector component in any direction is considered. The case when the magnetic substance 107 and the measuring device are rotated by 180 degrees around the optical axis is considered. An output value itself of the polarization split detector is a scalar and is not changed by the rotation, but magnetization of the magnetic substance to be measured 107 is inverted in direction because it is an axial vector. On the other hand, for the aforesaid reason, characteristics of the measuring device itself after the rotation are equivalent to characteristics of the measuring device before rotation. From the supposition described in "DETAILED DESCRIPTION OF THE PREFERRED EMBODIMIENTS", an amount of change in output of the polarization split detector caused by change in magnetization is inverted in sign because of inversion of magnetization, and therefore it has to be zero. Accordingly, the in-plane magnetization vector components are not detected and only a perpendicular magnetization vector component can be detected.

Since a polarization state at any one point is characterized by an elliptic shape drawn by rotation of an electric vector and a direction of the rotation, the polarization state at one point itself has half-turn symmetry nature around the point. Therefore, in the case of a generally used light source whose intensity distribution is circular or elliptic distribution and whose polarization state distribution is uniform, the intensity distribution and the polarization state distribution both have half-turn symmetry nature around the optical axis of the light flux, and only the perpendicular magnetization vector component is detected under the measuring conditions described above.

Accordingly, the half-turn asymmetric polarizing element 111 whose polarization characteristics do not have half-turn symmetry nature is inserted before the polarization split detector to disturb half-turn symmetry nature of a measuring system so that sensitivity to the in-plane magnetization vector components can be given.

Such an optical element can be made by, for example, dividing a linear phase shifter. Optical anisotropy of the linear phase shifter is characterized by orthogonal two kinds of neutral axis azimuths (a slow axis azimuth and a fast axis azimuth), and characteristics of the element at one point have half-turn symmetry nature around the point. Therefore, even if the whole of the reflected light flux is passed through a uniform linear phase shifter, the half-turn symmetry nature is not lost. However, an element not having half-turn symmetry nature can be made by making the linear phase shifter act only on a part of the light flux or dividing the element into plural elements, giving different neutral axis azimuths, and bonding them together.

This embodiment is characterized in that polarizing operation is performed only to the reflected light by the magnetic substance to be measured 107, which can prevent degradation in focusing performance caused by disturbance of polarization distribution or wave front of the incident light on the focusing lens 106. For example, in a magneto-optical recording device, since recording is conducted by heating a magnetic substance to the Currie temperature or higher through heat of a focusing spot, degradation in focusing performance directly decreases recoding density. Further, action for giving half-turn asymmetry nature to the optical system is performed not by partial shielding in the light flux but by the polarizing element such as the linear phase shifter, which makes it possible to prevent reduction in detection signal amount without light amount loss.

Second Embodiment

FIGS. 2A and 2B show examples of a divisional half-wave element as a typical example of the half-turn asymmetric polarizing element 111 (FIG. 1) according to a second embodiment of the present invention. In FIG. 2A, the divisional half-wave element is the upper-half semicircular divisional half-wave plate 201. It is supposed that the light source 101 outputs the linearly polarized light and a cross section of a light beam 202 has circular intensity distribution which is axially symmetric with respect to the optical axis, but the intensity distribution may have an elliptic shape whose principal axes are in the X- and Y-axis directions. A polarization azimuth of the light beam when there is no Kerr effect is substantially aligned with a neutral axis azimuth 203 of the divisional half-wave plate 201 and substantially a half of the light beam 202 is made to pass through the divisional half-wave plate 201. In the drawing, the neutral axis azimuth 203 of the divisional half-wave plate 201 is set to 0 degree (0 radian) with reference to the X-axis in the drawing so that a polarization azimuth of an incident light beam on the divisional half-wave plate 201 in the state without the Kerr effect (a state in which the magnetic substance to be measured 107 is not magnetized) becomes 0 degree. When the light having the polarization azimuth 204 whose polarization azimuth angle has become +δ radian after receiving a Kerr rotation angle of +δ radian is incident, an angle of the polarization azimuth 205 of the light passed through the half-wave plate 201 becomes −δ radian.

Here, supposing that differential polarization is detected by separating orthogonal ±45-degree polarization components, Kerr rotation is detected while ellipticity of polarization and change in reflectivity are not detected.

FIG. 2B shows the structure in which the glass plate 211 or the like having substantially the same thickness and not having double refraction nature is bonded to the lower side of the divisional half-wave plate 201, and it can be easily mounted on a holder and the like. Further, if the glass plate 211 made of a material having substantially the same light transmittance as light transmittance of the divisional half-wave plate 201 is used, optical characteristics except double refraction can be made uniform in the upper and lower halves, which can reduce measurement errors.

[Divisional Polarizing Operation to Reflected Light (Kerr Rotation Angle Inversion by Divisional Half-wave Plate)]

(Structure 2) The "half-turn asymmetry polarizing element" 111 in FIG. 1 is a divisional half-wave element which includes as a component the element 201 generating half-wave phase difference and acts ununiformly in the cross section of the light flux 202.

Here, the half-wave element 201 indicates an element having an action which causes the orthogonal polarization components of the light flux to generate phase difference of odd-numbered times of half-wave, and a half-wave plate made of quartz is general though it has another structure in some cases.

The half-wave element ununiformly acts in the cross section of the light flux so that symmetry nature of the optical system about half-turn can be disturbed. For example, the half-wave element should be acted only on one of symmetric regions about half-turn.

Only the Kerr rotation will be especially considered below. When the neutral axis azimuth angle of the half-wave element 201 is $\theta$ and the polarization azimuth angle (azimuth angles of elliptic principal axes in the case of elliptic polarization) of the incident light is $\phi$, a polarization azimuth angle $\phi'$ of the passed light is $\phi'=\theta+(\theta-\phi)=2\theta-\phi$. Supposing that the azimuth angle of the incident polarized light now receives Kerr rotation of $\delta$ to become $\phi+\delta$, polarization of the passed light becomes $\phi''=2\theta-(\phi+\delta)=\phi'-\delta$. Particularly, when $\phi=\theta$, $\phi'=\phi$ and $\phi''=\phi-\delta$, which indicates that polarization rotational action of the half-wave element is only action which inverts a sign of the Kerr rotation component $\delta$.

The light flux from the light source, whose intensity distribution and polarization state distribution in the cross section of the light flux have half-turn symmetry nature around the optical axis of the optical system, is perpendicularly focused and irradiated to the magnetic substance to be measured by the focusing unit, and the reflected light is focused by the focusing unit. Polarization state distribution in the cross section of the reflected light flux will be considered.

Change in polarization state and reflectivity due to the perpendicular magnetization vector component is equal at symmetric points about half-turn around the optical axis in the cross section of the reflected light flux. The half-wave element 201 is made to act only on one of the two regions and its neutral axis azimuth angle is aligned with the azimuth angle of the incident polarized light on this element in the case where there is no Kerr effect so that sensitivity of the polarization split detector to the Kerr rotation due to the perpendicular magnetization vector component can be canceled in both regions. If the whole of a cross sectional region passed by the reflected light flux before the polarization split detector is divided into two or more regions, and the divisional half-wave element is made so that the relationship described above substantially holds in each of the regions and inserted before the polarization split detector, it becomes possible to secure sensitivity to the in-plane magnetization vector components as well as to lower sensitivity to the Kerr rotation due to the perpendicular magnetization vector component.

(Structure 3) The divisional half-wave element 111 is structured to be divided by a straight line intersecting the optical axis in the cross sectional region, on which the light flux acts, as a boundary and to cause the half-wave plate 201 to generate half-wave phase difference only of the light acting on one of the regions.

The light flux from the light source for outputting linearly polarized light, whose (equalized intensity line of) intensity distribution in the light flux cross section has an elliptic shape and whose polarization azimuths are along the elliptic principal axis azimuths, is perpendicularly focused and irradiated to the magnetic substance to be measured by the focusing unit with its optical axis being aligned with the optical axis of the optical system, and the reflected light is focused by the focusing unit so as to consider polarization state distribution in the cross section of the light flux.

Virtual reflection with respect to a boundary plane including the optical axis and the polarization azimuth of the light source will be considered. The incident polarization distribution on the magnetic substance is symmetric about the reflection. The in-plane magnetization vector component perpendicular to the reflectional plane is not inverted by the reflection. Therefore, the polarization distribution in the cross section of the reflected light flux by this magnetization vector component becomes reflectionally symmetric, and symmetric points about the reflection have the Kerr rotations of the same absolute value and inverted orientations, and equal reflectivity.

On the other hand, since the in-plane magnetization vector component along the reflectional plane and the magnetization vector component perpendicular to the surface of the magnetic substance are inverted by the reflection, the symmetric points about the reflection in the cross section of the reflected light flux are equal to a state in which they are reflected after inverting their magnetization each other, and they have the same Kerr rotation while change in reflectivity with opposite signs.

When the straight boundary is set in the neutral axis azimuth of the divisional half-wave element and aligned with or made perpendicular to the polarization azimuth of the light source (or the incident polarization azimuth on the element when there is no Kerr effect), the Kerr rotation of only the light passing through one of the regions divided by the boundary is inverted.

If polarization split directions of the polarization split detection system are set to ±45-degree directions with respect to the reflectional plane and differential polarization between both polarization components is detected, the Kerr rotation is detected and change in reflectivity and ellipticity of polarization are not detected. Accordingly, at output of the differential polarization detector for the whole of the reflected light flux, only the in-plane magnetization vector component perpendicular to the reflectional plane considered here is detected.

In FIG. 2A, in the case of a Kerr effect by the in-plane magnetization vector component in the Y-axis direction, the effect is caused symmetrically about reflection with respect to the X-axis as a reflectional line, and therefore the Kerr rotation becomes in opposite directions at symmetric points about the reflection. Further, in the case of a Kerr effect by the perpendicular magnetization vector component and the in-plane magnetization vector component in the X-axis direction, the Kerr rotation becomes the same at the symmetric points about the reflection with respect to the X-axis. Therefore, when a Kerr rotation angle of one of the points is inverted by the divisional half-wave plate, detection of the perpendicular magnetization vector component and the in-plane magnetization vector component in the X-axis direction is canceled and only the in-plane magnetization vector component in the Y-axis direction is detected.

Third Embodiment

FIGS. 3A and 3B show examples of a divisional polarization rotation element as a typical example of the half-turn asymmetric polarizing element 111 (FIG. 1) according to a third embodiment of the present invention. The example of FIG. 3A shows a divisional optically active element 301 constituted of a semicircular optically active plate as the divisional polarization rotation element. The optically active element 301 can be made of optically active crystals such as quartz. This semicircular divisional optically active element 301 has action which gives +90-degree (π/2 radian) rotation 303 to polarization of the passing light. It is supposed that the light source 101 outputs linearly polarized light and a cross section of a light beam 302 has a circular shape and intensity distribution axially symmetric with respect to the optical axis, but the intensity distribution may have an elliptic shape whose principal axes are in the X- and Y-axis directions. An upper half of the light beam 302 passes through this divisional optically active element 301 and a lower half thereof passes as it is without receiving any action. A polarization azimuth angle of the light incident on the divisional optically active element 301 when there is no Kerr rotation is supposed to be 0 degree (0 radian). When the light having a polarization azimuth 304 whose polarization azimuth angle has become +δ radian after receiving a Kerr rotation angle of +δ radian is incident, a polarization azimuth angle 305 of the light passed through the divisional optically active element 301 becomes π/2+δ radian. If the differential amplifier 117 detects differential polarization between orthogonal polarization components of ±45 degrees of the light passed through the divisional optically active element 301 and the light passed over it, the Kerr rotation of the light passed through the divisional optically active element 301 and the light passed over it is detected with opposite signs to each other. Therefore, only the in-plane magnetization vector component in the Y-axis direction is detected.

In FIG. 3B, a glass plate 311 or the like having substantially the same thickness and not having optical activity is bonded to the lower side of the divisional optically active element 301, and this structure have the similar effect to that in FIG. 2B.

Incidentally, Faraday glass or a Faraday rotation element obtained by applying a magnetic field to magnetic garnet or the like can be also used in the same manner as described above since it serves the same function as the optically active element as long as the light is passed only from one side thereof.

[Divisional Polarizing Operation to Reflected Light (Detection Sensitivity Inversion by Polarization Rotator)]

(Structure 4)

The "half-turn asymmetric polarizing element" 111 in FIG. 1 includes as a component the divisional polarization rotation element 111 which includes the polarization rotation element 301 as a component and has ununiform polarization rotating action in the cross section of the light flux 302.

The polarization rotation element 301 here indicates an element for rotating any polarization state by a fixed angle, and differs from the half-wave element whose polarization rotation angle is different depending on the incident polarization azimuth. The polarization rotation element 301 can be made of a material such as quartz having optical activity. Hereinafter, the polarization rotation element 301 made using the optical activity is referred to as an optically active element. When the light is reciprocated in the optically active element using the optical activity, polarization rotation is canceled. There is also a polarization rotation element using a Faraday effect (referred to as a Faraday element here) but the polarization rotation becomes twice when the light is reciprocated, different from the optically active element. However, its function can be considered as equal to that of the optically active element as long as it is used so that the light is passed only from one side thereof.

The polarization rotation element ununiformly acts in the light flux cross section so that the symmetry nature of the optical system about half-turn can be disturbed. For example, the polarization rotation element should act only on one of the symmetric regions about half-turn.

Only the Kerr rotation will be especially considered below. Different from the half-wave element, the polarization rotation element does not invert the Kerr rotation of polarization. However, when the polarization azimuth (the azimuths of the principal axes of the ellipse in the case of the elliptic polarization) in the state without the Kerr effect is set to be rotated by the polarization rotation element to a symmetric angle with respect to the polarization split direction of the polarization split detector, the sign of the amount of change in output from the polarization split detector caused by the Kerr rotation can be inverted. Therefore, for example, if the polarization rotation element acts on one or both of the symmetric regions about half-turn around the optical axis so that angles of polarization azimuths in both regions from the polarization split direction of the polarization split detector when there is no Kerr effect have opposite signs to each other and equal absolute values, sensitivity of the polarization split detector to the Kerr rotation by the perpendicular magnetization vector component can be canceled in both regions. The whole of the cross sectional region passed by the reflected light flux before the polarization split detector is divided into two or more regions, and the divisional polarization rotation element is made so that the aforesaid relationship substantially holds in each of the regions and inserted before the polarization split detector, it becomes possible to secure sensitivity to the in-plane magnetization vector components as well as to lower sensitivity to the Kerr rotation due to the perpendicular magnetization vector component.

(Structure 5)

The divisional polarization rotation element described above is structured to be divided by a straight line intersecting the optical axis in the cross sectional region, on which the light flux acts, as a boundary in which a polarization rotation angle of one region is different from a polarization rotation angle of the other region. The polarization rotation angle of one region may be zero.

Only action of the Kerr rotation will be especially considered below. The light flux from the light source for outputting linearly polarized light, whose (equalized intensity line of) intensity distribution in the cross section of the light Flux has an elliptic shape and whose polarization azimuths are in principal axis azimuths of the ellipse, is perpendicularly focused and irradiated to the magnetic substance to be measured by the focusing unit with its center axis being aligned with the optical axis of the optical system, and the reflected light is focused by the focusing unit. Polarization state distribution of the reflected focused light flux will be considered.

It is supposed that a direction of the boundary of the divisional polarization rotation element is aligned with the polarization azimuth of the light source (or the incident polarization azimuth on the element when there is no Kerr effect). Virtual reflection with respect to a boundary plane including the boundary of the divisional polarization rotation element and the optical axis will be considered. About this reflection, incident polarization distribution on the magnetic substance is symmetric. The in-plane magnetization vector component perpendicular to the reflectional plane is not inverted by this reflection. Therefore, polarization distribution of the reflected light by this magnetization vector component becomes reflectionally symmetric and symmetric points about the reflection in the cross section of the reflected light flux have opposite directions of the Kerr rotation and equal reflective ratios.

Accordingly, if polarization of the reflected light on two sides divided by the reflectional plane is rotated by different angles through the divisional polarization rotation element and the polarization split direction of the polarization split detector is set to an angle in the middle of both rotation, output properties of the polarization split detector by the polarization rotation in symmetric minute regions on both sides about the reflection can be obtained with opposite polarities so that outputs of the polarization split detector by the Kerr rotation in opposite directions to each other on both sides are not canceled but summed.

On the other hand, since the in-plane magnetization vector component along the reflectional planes and the magnetization vector component perpendicular to the surface of the magnetic substance are inverted by the reflection, they are equal to a state in which they are reflected after inverting their magnetization, and the Kerr rotation becomes the same while the change in reflectivity is shown with an opposite sign. Therefore, outputs of the polarization split detector by the Kerr rotation in the symmetric minute regions about the reflection on both sides are canceled.

Accordingly, the Kerr rotation due to the perpendicular magnetization vector component and the magnetic component along the reflectional plane is canceled and the Kerr rotation by the in-plane magnetization vector component perpendicular to the reflectional plane is detected.

(Structure 6) An absolute value of difference between the polarization rotation angles which are different in the regions of the divisional polarization rotation element described above is preferably 10 degrees or smaller. The output light from the light source is the linearly polarized light and the polarization split direction of the polarization split detector is aligned with a middle direction between the different directions of the polarization of lights after acting on the divisional polarization rotation element when there is no Kerr effect or a perpendicular direction thereto so that detection becomes possible in a state corresponding to the state slightly deviated from the so-called cross-Nicol state. As a result, a ratio of a detection light amount to the signal amount by the Kerr rotation can be greatly suppressed. Accordingly, a direct-current offset component after photoelectric conversion can be reduced and contrast in detection signal can be increased.

(Structure 7) The difference between the polarization rotation angles different in the regions of the divisional polarization rotation element described above is preferably 90 degrees. In this case, when polarization split directions of the polarization split detector are suitably set and differential polarization is detected, output of the differential polarization detector in the state without the Kerr effect can be made substantially zero, and change in light amount can be prevented from appearing in the detection signal. Therefore, only the Kerr rotation can be detected by removing the change in reflectivity caused by the magneto-optical effect and, particularly, it becomes also possible to detect only the in-plane magnetization vector component perpendicular to the reflectional plane under the conditions described above (Structure 5). Further, when light amount noise is large or the like, a signal component by the Kerr rotation can be measured with a high S/N.

Fourth Embodiment

Figure 4:
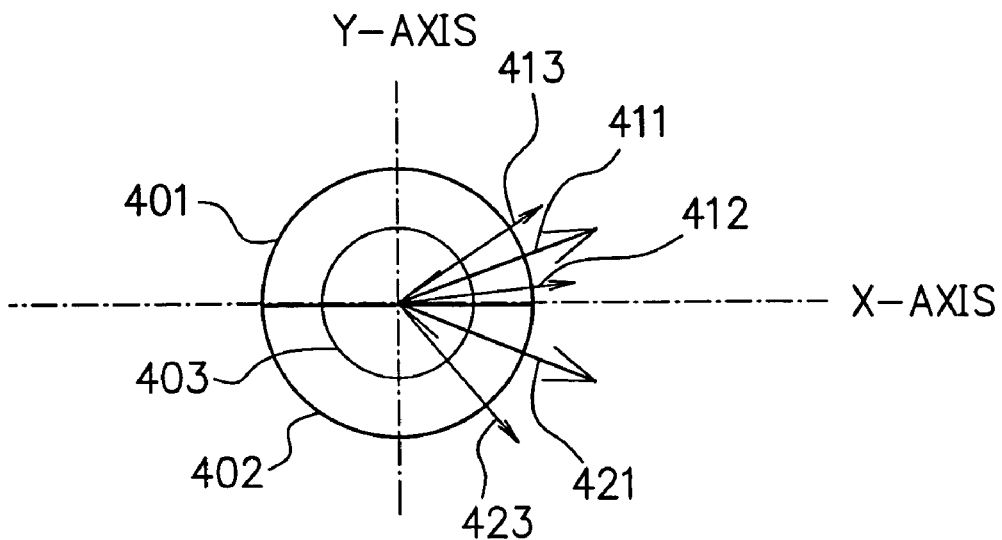
FIG. 4 is a diagram showing an example of a divisional half-wave element as a typical example of a half-turn asymmetric reflectional symmetry polarizing element according to a fourth embodiment of the present invention.

FIG. 4 shows an example of a divisional half-wave element as a typical example of the half-turn asymmetric reflectional symmetry polarizing element 111 (FIG. 1) according to a fourth embodiment of the present invention. In this example, an azimuth angle of a neutral axis 411 of an upper-half first divisional half-wave plate 401 is set to $\theta 1 = \pi/8$ radian, and an azimuth angle of a neutral axis 421 of a lower-half second divisional half-wave plate 402 is set to $\theta 2 = -\pi/8$ radian. The output light flux from the light source is the linearly polarized light and it has half-turn symmetry nature around the optical axis of the optical system and reflectional symmetry nature with respect to a plane including the optical axis and a polarization azimuth. The polarization azimuth is defined as the X-axis and a polarization azimuth angle incident on the divisional half-wave plates in a state in which there is no Kerr effect is defined as 0 radian.

It is supposed that the polarization split direction of the polarization split detector is set to the X- and the Y-axis direction to perform the differential detection of polarization. When the light having a polarization azimuth 412 after receiving a Kerr rotation angle of $+\delta$ radian is incident on the first and second divisional half-wave plates 401, 402, a polarization azimuth angle 413 of the light passed through the first divisional half-wave plate 401 becomes $\phi 1' = -\pi/4 - \delta$ radian, and a polarization azimuth angle 423 of the light passed through the second divisional half-wave plate 402 becomes $\phi 2' = -\pi/4 - \delta$ radian. When differential detection of polarization between the polarization azimuths 413, 423 of the lights passed through the first and second divisional half-wave plates 401, 402 is performed, the Kerr rotation of the polarization azimuths 413, 423 of the light passed through the first and second divisional half-wave plates 401, 402 is detected as signals with opposite signs to each other.

In the case of the Kerr effect by the in-plane magnetization vector component in the Y-axis direction, since the Kerr rotation is caused in a reflectional symmetry manner with respect to the X-axis as a reflectional line, directions of the Kerr rotation at symmetric points about the reflection become opposite, but they are detected with opposite signs to each other through the action of the divisional half-wave element and therefore the Kerr rotation is detected by being summed.

Further, in the case of the Kerr effects by the perpendicular magnetization vector component and the in-plane magnetization vector component in the X-axis direction, since the Kerr rotation is the same in symmetric minute regions about the reflection with respect to the X-axis and they are detected with opposite signs to each other through the action of the divisional half-wave element and canceled. Therefore, only the in-plane magnetization vector component in the Y-axis direction is detected.

In the explanations above, change in polarization in the focusing unit and due to metallic reflection on the magnetic substance to be measured is neglected. However, more strictly, it is directly understood that other components than the in-plane magnetization vector component in the Y-axis direction are not detected considering the reflectional symmetry nature of the light source, the focusing unit, the divisional half-wave element, the polarization split detector, and other optical elements with respect to the X-axis.

[Divisional Polarizing Operation to Reflected Light (Half-turn Asymmetry and Reflectional Symmetry)]

(Structure 8) This is the magnetization measuring device for measuring the magnetization state of the magnetic substance to be measured by focusing the light flux from the light source 101 by the focusing unit 106, irradiating it to the magnetic substance to be measured 107, and detecting change in polarization state or light amount of the reflected light caused by the magneto-optical effect by the polarization split detector 113 to 117, 119 to 121 for detecting a light amount of a polarization component in one direction or separated each component of polarization components orthogonal to each other, and the "half-turn asymmetric reflectional symmetry polarizing element" 111 which acts only on the light flux reflected by the magnetic substance to be measured 107 and whose action on the polarization distribution in the cross section of the light flux has asymmetry nature about half-turn around the optical axis of the optical system and reflectional symmetry nature with respect to a certain flat plane including the optical axis is provided so that sensitivity to the in-plane magnetization vector components of the magnetic substance to be measured 107 is given. A multi-divided plate used by moving is also included.

When the reflection with respect to the reflectional plane of the aforesaid half-turn asymmetric reflectional symmetry polarizing element 111 is considered, the in-plane magnetization vector component perpendicular to the reflectional plane is not changed in direction by the reflection, the in-plane magnetization vector component along the reflectional plane is inverted in direction by the reflection, and the perpendicular magnetization vector component of the magnetic substance is inverted in direction by the reflection.

It is supposed that the intensity distribution and the polarization distribution of the light source are currently symmetric about the reflection. The polarization split detector whose polarization detecting characteristics have symmetry nature about the aforesaid reflection is used so that sensitivity to the in-plane magnetization vector component along the reflectional plane and the perpendicular magnetization vector component of the magnetic substance can be made zero and only the magnetization vector component perpendicular to the reflectional plane can be detected.

Further, the polarization split detector whose polarization detecting characteristics are inverted about the aforesaid reflection is used so that sensitivity to the magnetization vector component perpendicular to the reflectional plane is made zero and only the in-plane magnetization vector component along the reflectional plane and the perpendicular magnetization vector component of the magnetic substance can be detected.

Since this half-turn asymmetric reflectional symmetry polarizing element 111 generates the asymmetry nature not by distribution of light transmittance or reflectivity or partial shielding but utilizing its polarization characteristics, light amount loss can be nearly made zero, which can increase light utilization efficiency and detectivity.

(Structure 9) An angle between the polarization detection azimuth of the polarization split detector described above and the reflectional plane described above is preferably set to an integral multiple of 90 degrees. When the angle between the polarization detection azimuth angle of the polarization split detector and the reflectional plane is set to the integral multiple of 90 degrees, detected characteristics by the polarization detector have symmetry nature about the reflection. Therefore, in this case, the Kerr effects by the perpendicular magnetization vector component of the magnetic substance and the in-plane magnetization vector component along the reflectional plane are not detected and only the Kerr effect by the in-plane magnetization vector component perpendicular to the reflectional plane is detected.

(Structure 10) An angle between the polarization detection azimuth angle of the polarization split detector described above and the reflectional plane described above is preferably set to an angle of ±45 degrees so as to make the polarization split detector serve as the differential polarization detector. When the angle between the polarization detection azimuth angle of the polarization split detector and the reflectional plane is set to the angle of ±45 degrees, detection polarities of the Kerr effect by the differential polarization detector are inverted about reflectional conversion. Accordingly, on the contrary to the case of Structure 9 described above, the Kerr effects by the perpendicular magnetization vector component of the magnetic substance and the in-plane magnetization vector component along the reflectional plane are detected and the Kerr effect by the in-plane magnetization vector component perpendicular to the reflectional plane is not detected.

[Divisional Polarizing Operation To Reflected Light (Detection Polarities Are Inverted By Divisional Half-wave Plate)]

(Structure 11) The "half-turn asymmetric reflectional symmetry polarizing element" 111 described above is a divisional half-wave element including as components elements which, in a region on which the light flux acts, have two or more different neutral axis azimuth angles in two or more divided regions and generates half-wave phase difference.

A flat region is divided into four regions by two lines perpendicular to each other as boundaries. Two adjacent regions among the regions are filled with a half-wave plate so that they do not have reflectional symmetry nature with respect to a first boundary therebetween. Next, the other two regions are filled with a half-wave plate in a symmetric manner with respect to the other second boundary so that an optical element can be made which is reflectionally symmetric with respect to the second boundary and asymmetric about half-turn around a point where the first and second boundaries intersect. This is because repetition of the reflection with respect to the first and second boundaries becomes half-turn operation around the intersection point.

The half-turn asymmetric reflectional symmetry polarizing element constituted of the half-wave plates and satisfying the conditions of Structure 8 can be thus made, which enables detection of the in-plane magnetization vector components. Further, the magnetization vector component to be measured can be selected by the methods of Structure 9 and Structure 10.

(Structure 12) The divisional half-wave element of Structure 11 described above is structured to be divided by a straight line passing through the optical axis in the cross sectional region, on which the light flux acts, as a boundary in which neutral axis azimuths of both regions make predetermined angles except 0 degree of the same absolute value and different signs from each other with respect to the boundary.

Since such divisional half-wave plates have reflectional symmetry nature with respect to the boundary while do not have symmetry nature about half-turn, they serve as the half-turn asymmetric reflectional symmetry polarizing element of Structure 8, which enables detection of the in-plane magnetization vector components. Further, the magnetization vector component to be measured can be selected by the methods of Structure 9 and Structure 10. Furthermore, it can be easily made by cutting one half-wave plate at a tilted angle with respect to a neutral axis azimuth and bonding cut faces thereof with one piece being reversed.

(Structure 13) In the divisional half-wave element of Structure 11 and Structure 12 described above, angles between the neutral axis azimuths in the regions divided in the cross sectional region on which the light flux acts and a line where a reflectional symmetric plane and the cross section of the light flux intersect or the aforesaid divisional boundary have absolute values of 5 degrees or smaller except 0 degree.

The output light from the light source is supposed to be the liner polarized light, its polarization azimuth is aligned with a direction of a reflectional symmetry line of the divisional half-wave element or a direction perpendicular thereto, and the polarization detection azimuth of the polarization split detector is aligned with a direction perpendicular to the polarization azimuth of the light source (that is, the polarization azimuth of the light incident on the polarization detector when there is no Kerr effect nor the divisional half-wave element) so that the ratio of the detection light amount to the signal amount by the Kerr rotation can be greatly suppressed. Therefore, the direct-current offset component after photoelectric conversion can be reduced and contrast in detection signal can be increased.

(Structure 14) In the divisional half-wave element of Structure 11 and Structure 12 described above, angles between the neutral axis azimuths in the regions divided in the cross sectional region on which the light flux acts and a line where a reflectional symmetric plane and the cross section of the light flux incident on the divisional half-wave elements intersect, or the aforesaid divisional boundary, are ±22.5 degrees.

When the output light from the light source is the liner polarized light, and the azimuth of the reflectional symmetry line of the divisional half-wave element are aligned with the polarization azimuth of the light source (that is, the polarization azimuth of the light incident on the divisional half-wave element when there is no Kerr effect), angle difference between different polarization azimuths of the passing light can be made approximately 90 degrees. By aligning the polarization split direction of the differential polarization detection with the reflectional symmetry line of the divisional half-wave element and a direction perpendicular thereto, the differential polarization detection signal in the state in which there is no Kerr effect can be made substantially zero, which can prevent change in light amount from appearing in the detection signal. Accordingly, when light amount noise is large or the like, the signal component due to the Kerr effect can be measured with a high S/N.

Fifth Embodiment

Figure 5:
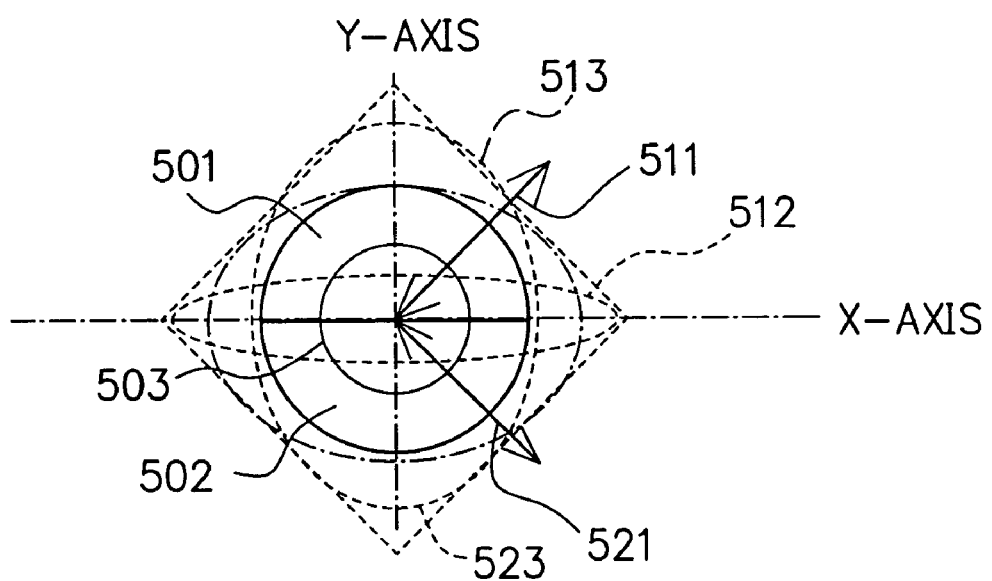
FIG. 5 is a diagram showing an examples of a divisional ¼ wave element as a typical example of the half-turn asymmetric reflectional symmetry polarizing element according to a fifth embodiment of the present invention.

FIG. 5 shows an example of a divisional ¼ wave element as a typical example of the half-turn asymmetric reflectional symmetry polarizing element 111 (FIG. 1) according to a fifth embodiment of the present invention. In this example, an azimuth angle of a neutral axis (either a slow axis or a fast axis) 511 of an upper-half first divisional quarter-wave plate 501 is θ1=π/4 radian, and an azimuth angle of a neutral axis 521 of a lower-half second divisional quarter-wave plate 502 is θ2=−π/4 radian. A polarization azimuth angle of the linearly polarized light incident on the divisional quarter-wave plates 501, 502 in the state without the Kerr effect is 0 radian.

Differential polarization is detected by setting the polarization split direction of the polarization split detector to the X- and the Y-axis direction. When the case where the linearly polarized light received the Kerr rotation of +δ radian is incident is considered, the light passed through the first and second divisional quarter-wave plates 501, 502 becomes elliptically polarized light rotating to the right and to the left having elliptic principal axis azimuths in ±45-degree directions, and sensitivity to the Kerr rotation is not generated.

When only ellipticity of polarization by the Kerr effect is considered, it becomes elliptic polarization in a certain rotational direction having elliptic principal axis azimuths at 0-degree and 90-degree directions, and ellipses of polarization 513, 523 of the light passed through the first and second divisional quarter-wave plants 501, 502 have reciprocal aspect ratios. Further, when rotational directions of electric vectors rotating on the ellipses of the elliptic polarization (hereinafter referred to as elliptic rotational direction) are reversed, the aspect ratios of the ellipses of the passing light become reciprocal.

In the case of the Kerr effect by the perpendicular magnetization vector component of the magnetic substance to be measured, the same Kerr ellipticity and elliptic rotational directions are generated in symmetric minute regions about half-turn around the optical axis in the reflected light flux, and the light passed through the first and second divisional quarter-wave plates 501, 502 has opposite elliptic aspect ratios to be canceled in output of the differential polarization detector and also in the whole of the light flux cross section.

In the case of the Kerr effect by the in-plane magnetization vector component in the Y-axis direction, since the Kerr effects are symmetrically generated due to the reflection with the X-axis as the reflectional line, the Kerr ellipticity is the same while the elliptic rotational directions are inverted in symmetric minute regions about the reflection, and the aspect ratios of the ellipses of the light passed through the first and second divisional quarter-wave plates 501, 502 become the same so that the Kerr elliptic polarization in the two minute regions is summed to be detected by the differential polarization detector and also summed in the whole of the light flux cross section.

Further, in the case of the Kerr effect by the in-plane magnetization vector component in the X-axis direction, both the Kerr ellipticity and the elliptic rotational directions are the same in the symmetric minute regions about the reflection, and the aspect ratios of the ellipses of the light passed through the first and second divisional quarter-wave plates 501, 502 become opposite and canceled in output of the differential polarization detector and also canceled in the whole of the light flux cross section. Therefore, only the in-plane magnetization vector component in the Y-axis direction is detected.

Furthermore, it is also directly understood that other components than the in-plane magnetization vector component in the Y-axis direction are not detected considering the reflectional symmetry nature of the light source, the focusing unit, the divisional ¼ wave element, the polarization split detector, and other optical elements with respect to the X-axis.

[Divisional Polarizing Operation to Reflective Light (Detection Polarities Are Inverted by Divisional ¼ wave Element)]

(Structure 15) The "half-turn asymmetric reflectional symmetry polarizing element" 111 in Structure 8 described above is a divisional ¼ wave element including as components elements having two or more different neutral axis azimuth angles in two or more divided regions in a region on which the light flux acts and generating quarter-wave phase difference.

A flat region is divided into four regions by two lines perpendicular to each other as boundaries. Two adjacent regions among the regions are filled with a quarter-wave plate so that they do not have reflectional symmetry nature with respect to a first boundary sandwiched between those regions. Next, the other two regions are filled with a quarter-wave plate in a reflectionally symmetric manner with respect to the other second boundary as a reflectional line so that an optical element can be made which is reflectionally symmetric with respect to the second boundary and asymmetric about half-turn around a point where the first and second boundaries intersect. The half-turn asymmetric reflectional symmetry polarizing element constituted of quarter-wave plates and satisfying the conditions of Structure 8 can be thus made, which enables detection of the in-plane magnetization vector components. Further, the magnetization vector component to be measured can be selected by the methods of Structure 9 and Structure 10.

(Structure 16) The divisional ¼ wave element of Structure 15 described above is structured to be divided by a straight line intersecting the optical axis in the cross sectional region on which the light flux acts as a boundary, in which neutral axis azimuths of quarter-wave elements in both regions make predetermined angles except zero degree of the same absolute value and different signs from each other with respect to the boundary.

Since such divisional quarter-wave elements have reflectional symmetry nature with respect to the boundary while not having symmetric nature about half-turn, they serve as the half-turn asymmetric reflectional symmetry polarizing element of Structure 8, which enables detection of the in-plane magnetization vector components. Further, they can be easily made by cutting one quarter-wave plate at a tilted angle with respect to a neutral axis azimuth and bonding cut faces thereof with one piece being reversed.

(Structure 17) In the divisional ¼ wave element of Structure 15 and Structure 16 described above, angles between the neutral axis azimuths in the regions divided in the cross sectional region on which the light flux acts and a line where a reflectional symmetry plane and the light flux cross section intersect, or the aforesaid boundary, are ±45 degrees.

When the output light of the light source is the liner polarized light, polarized light incident on the divisional quarter-wave elements in the state without the Kerr effect becomes approximately linearly polarized light and, when the reflectional symmetry plane of the divisional ¼ wave element is aligned with this polarization azimuth, the light passing through both regions can be made to be approximately circularly polarized light. Therefore, the differential polarization detection signal in the state without the Kerr effect can be made substantially zero, which can prevent change in light amount from appearing in the detection signal. Accordingly, when light amount noise is large or the like, the signal component by the Kerr effect can be measured with a high S/N.

Sixth Embodiment

Figure 6:
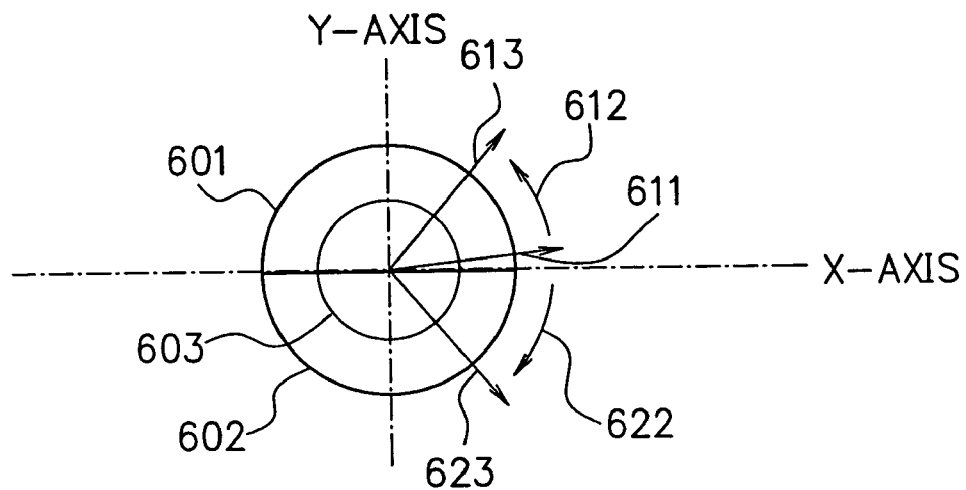
FIG. 6 is a diagram showing an example of a divisional polarization rotation element as a typical example of the half-turn asymmetric reflectional symmetry polarizing element according to a sixth embodiment of the present invention.

FIG. 6 shows an example of a divisional polarization rotation element as the half-turn asymmetric reflectional symmetry polarizing element 111 (FIG. 1) according to a sixth embodiment of the present invention. In this example, a divisional optically active element structured by two semicircular optically active plates 601 and 602 which have opposite rotation angles to each other is used as the divisional polarization rotation element. The semicircular first divisional optically active element 601 in the upper side in the drawing has action of giving +45-degree ($\pi/4$ radian) rotation 612 to polarization of the passing light, and the semicircular second divisional optically active element 602 in the lower side has action of giving −45-degree ($-\pi/4$ radian) rotation 622 to polarization of the passing light. An upper half of a light beam 603 passes through the first divisional optically active element 601 and a lower half thereof passes through the second divisional optically active element 602.

A polarization azimuth angle of the light incident on the divisional optically active element in the state without the Kerr rotation is supposed to be 0 degree (0 radian). When the light having a polarization azimuth 611 whose polarization azimuth angle has become δ radian after received a Kerr rotation angle of +δ radian is incident on the first and second divisional optically active elements 601, 602, an angle of a polarization azimuth 613 of the light passed through the first divisional optically active element 601 becomes $\pi/4+\delta$ radian while an angle of a polarization azimuth 623 of the light passed through the second divisional optically active element 602 becomes $-\pi/4+\delta$ radian. When differential of orthogonal X- and Y-polarization components of the light passed through the first and second divisional optically active elements 601, 602 are detected, their Kerr signals are detected with opposite signs to each other. Accordingly, similarly to the explanations of FIG. 4 described above, only the in-plane magnetization vector component in the Y-axis direction is detected.

Further, it is also directly understood that other components than the in-plane magnetization vector component in the Y-axis direction are not detected considering the reflectional symmetry nature of the light source, the focusing unit, this divisional polarization rotation element, the polarization split detector, and other optical elements with respect to the X-axis.

[Divisional Polarizing Operation to Reflected Light (Detection Polarities are Inverted By Polarization Rotation Element)

(Structure 18) The "half-turn asymmetric reflectional symmetry polarizing element" 111 of Structure 8 described above is a divisional polarization rotation element whose polarization rotation action has ununiform distribution in the region on which the light flux acts.

A flat region is divided into four regions by two lines perpendicular to each other as boundaries. Two adjacent regions among the regions are filled with a polarization rotation element so that they do not have reflectional symmetry nature with respect to a first boundary sandwiched between those regions.

Then, the other two regions are filled with a polarization rotation element in a reflectionally symmetric manner with respect to the other second boundary as a reflectional line so that an optical element can be made which is reflectionally symmetric with respect to the second boundary and asymmetric about half-turn around a point where the first and second boundaries intersect. The half-turn asymmetric reflectional symmetry polarizing element constituted of the polarization rotation elements and satisfying the conditions of Structure 8 can be thus made, which enables detection of the in-plane magnetization vector components. Further, the magnetization vector component to be measured can be selected by the methods of Structure 9 and Structure 10.

(Structure 19) The divisional polarization rotation element of Structure 18 described above is structured to be divided by a straight line intersecting the optical axis in the cross sectional region on which the light flux acts as a boundary, in which one polarization rotation angle and the other polarization rotation angle thereof have the values of the same absolute value with different signs except zero.

First, since polarization characteristics of such a divisional polarization rotation element have reflectional symmetry nature with respect to the divisional boundary and do not have symmetry nature about half-turn, it serves as the half-turn asymmetric reflectional symmetry polarizing element of Structure 8, which enables detection of the in-plane magnetization vector components. Further, the magnetization vector component to be measured can be selected by the methods of Structure 9 and Structure 10.

(Structure 20) An absolute value of angle difference between the polarization rotation angles which are different in each region of the divisional polarization rotation element of Structure 18 described above is 10 degrees or smaller.

When the output light of the light source is the linearly polarized light, and the polarization azimuth thereof is aligned with a direction of a reflectional symmetry line or a direction perpendicular thereto, as well as the polarization detection azimuth of the polarization split detector is aligned with a direction perpendicular to the middle of the polarization azimuths of the light source (that is, the polarization azimuth of the light incident on the polarization detector when there is no Kerr effect nor the divisional polarization rotation element), the ratio of the detection light amount to the signal amount by the Kerr rotation can be greatly suppressed. Therefore, the direct-current offset component after photoelectric conversion can be reduced and contrast in detection signal can be increased. Even when the divisional polarization rotation element does not have reflectional symmetry nature, the same effect as described above can be obtained by substantially aligning the polarization azimuth of the light source orthogonal to the polarization detecting direction of the polarization detector.

(Structure 21) Angle difference between the polarization rotation angles which are different in each region of the divisional polarization rotation element of Structure 18 described above is ±90 degrees.

When the output light of the light source is the linearly polarized light, the polarization rotation angle difference between the different polarization azimuths of the light past through the divisional polarization rotation element can be made to ±90 degrees in the state without the Kerr effect. The polarization split direction of the differential polarization detector is adjusted to make ±45 degrees with respect to the polarization azimuths so that the differential polarization detection signal in the state without the Kerr effect can be made substantially zero, which can prevent change in light amount from appearing in the detection signal. Therefore, when light amount noise is large or the like, the signal component by the Kerr effect can be measured with a high S/N.

Seventh Embodiment

Figure 7:
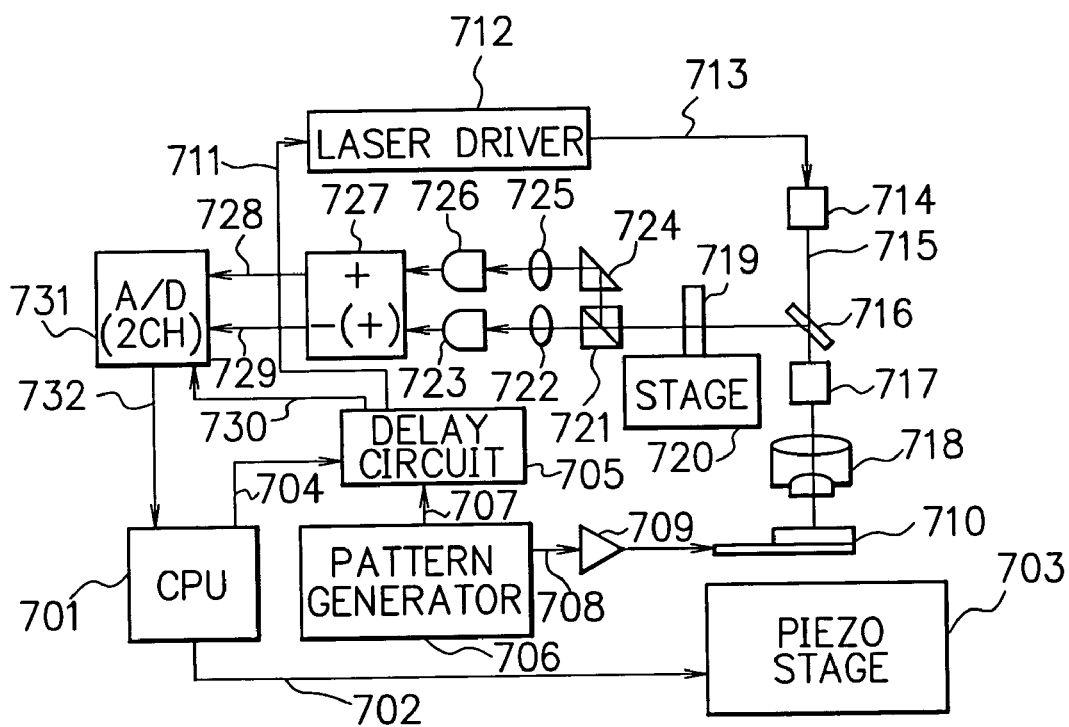
FIG. 7 is a diagram showing an example of a sampling-type scanning Kerr microscope using a divisional half-wave element as the half-turn asymmetric reflectional symmetry polarizing element according to a seventh embodiment of the present invention.

FIG. 7 shows an example of a sampling-type scanning Kerr microscope using a divisional half-wave element 719 which is the half-turn asymmetric reflectional symmetry polarizing element according to a seventh embodiment of the present invention. This device mainly aims at measuring high-speed magnetization response of a write magnetic pole of a magnetic recording head 710 used in a magnetic recording device. The magnetic head 710 is driven with a current by a head driver 709 according to a pattern signal 708 from a pattern generator 706. On the other hand, the pattern generator 706 inputs a trigger signal 707 synchronized with the pattern signal to a delay circuit 705. The delay circuit 705 inputs triggers 711 and 730, to which any (changeable) delay time has been given according to a control signal 704 from a CPU 701, to a laser driver 712 and an A/D converter 731. The laser driver 712 generates a drive pulse 713 by the inputted trigger 711 to drive a semiconductor laser 714 with a pulse. The semiconductor laser 714 generates a light pulse 715 by the pulse drive. Here, the semiconductor laser 714 having wavelength of 400 nm is used and the laser pulse 715 having full-width of half maximum of 30 ps is generated.

The laser pulse 715 collimated by a collimate optical system, which is omitted in the drawing, passes through a beam splitter 716 and a Faraday cell 717 and becomes incident on an object lens 718 as a focusing unit. The object lens 718 can be switched by a revolver which is omitted in the drawing, and the object lens (NA: 2.0) 718 with a solid immersion lens (SIL) as shown in the drawing is used when high spatial resolution is to be obtained. The laser pulse focused and reflected by the magnetic pole of the magnetic head 710 is again focused by the object lens 718 to become collimated light, passes through the Faraday cell 717, and thereafter is reflected by the beam splitter 716 to pass through the divisional half-wave element 719. Thereafter, the light is split into two orthogonal polarization components by a polarization beam splitter (PBS) 721, one of which is reflected by a prism mirror 724, and they are focused by lenses 722 and 725 and become incident on photo-detectors 723 and 726 respectively. Avalanche photodiodes (APD) are used as the photo-detectors 723, 726. Each output current from the APDs is inputted to an amplifier 727 after being converted to a voltage value by an I/V conversion amplifier omitted in the drawing, and a sum signal 728 and a differential signal 729 are calculated, amplified, and outputted.

The sum signal 728 and the differential signal 729 are A/D-converted in a two-channel A/D converter 731 at timing, which resulted from giving appropriate delay to the trigger signal 730 from the delay circuit 705, and their converted data 732 is transferred the CPU 701. As a result, a magnetization state at any timing at a laser pulse focusing spot position on the magnetic pole of the magnetic head 710 can be measured with time resolution of about 30 ps. The measurement is repeated while shifting delay time generated in the delay circuit 705 through the control from the CPU 701 so that a time change waveform of magnetization can be measured. Further, the measurement is repeated while scanning a piezo stage 703, to which the magnetic head 710 is fixed, by a control signal 702 from the CPU 701 so that magnetized distribution at any timing and time change of magnetized distribution can be also measured.

Here, the Faraday cell 717 is structured by winding a current coil around a material having a Faraday effect so that a magnetic field can be applied thereto, and relationship between a coil current and a polarization rotation angle by the Faraday effect is measured in advance. The coil current can be controlled by the CPU 701 and relationship between the coil current and the A/D convert data 732 can be measured in a perpendicular magnetization measuring mode. Accordingly, the A/D convert data 732 can be converted to the polarization rotation angle. The relationship measured in the perpendicular magnetization measuring mode is also used in an in-plane magnetization measuring mode so that the conversion to the polarization rotation angle becomes also possible in measuring in-plane magnetization. This is an example of Structure 60 to be explained later.

The divisional half-wave element 719 is fixed to a stage 720 and, by its movement, modes are switched among the perpendicular magnetization measuring mode, an in-plane magnetization Y-vector component measuring mode, and an in-plane magnetization X-vector component measuring mode.

Figure 8B:
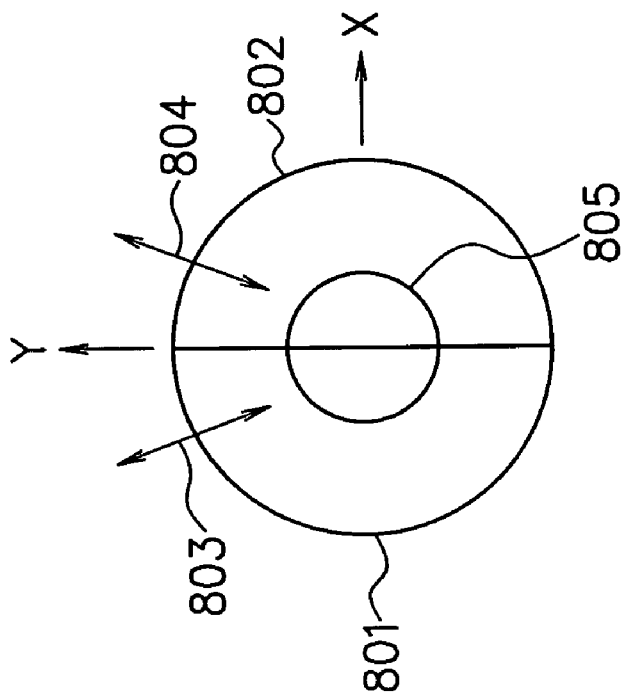
FIGS. 8A and 8B are diagrams showing a two-divided half-wave plate as a first constitutional example of the divisional half-wave element mounted in the microscope in FIG. 7.
Figure 8A:
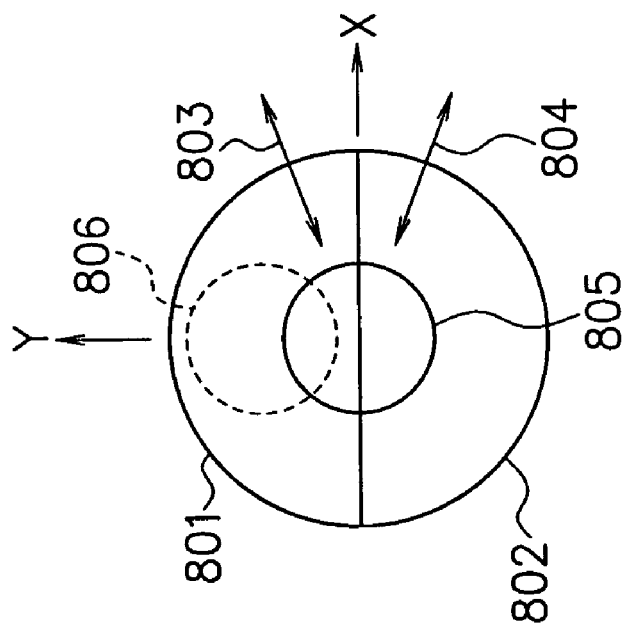

FIGS. 8A and 8B show a two-divided half-wave plate as a first constitutional example of the divisional half-wave element 719 mounted in this device. In FIG. 8A, the two-divided half-wave plate is made by cutting one circular half-wave plate along a straight line tilted 22.5 degrees with respect to its neutral axis azimuth into halves and bonding cut surfaces thereof with one piece being reversed. A neutral axis 803 of a half-wave plate 801 is +22.5 degrees and a neutral axis 804 of a half-wave plate 802 is −22.5 degrees. A position of the two-divided half-wave plate is adjusted by the stage so that a laser beam 805 passes through a center position of a boundary being a bonded line so that the in-plane magnetization Y-vector component measuring mode can be set. Further, the position of the two-divided half-wave plate is shifted to an upper or lower position so that a laser beam 806 does not pass through the boundary so that the perpendicular magnetization component measuring mode can be set. Furthermore, as shown in FIG. 8B, the two-divided half-wave plate is rotated by 90 degrees and the position of the two-divided half-wave plate by the stage is adjusted so that the laser beam 805 passes through the center position of the boundary, which can set the in-plane magnetization X-vector component measuring mode. In this case, the neutral axis 803 of the half-wave plate 801 is +22.5+90 degrees and the neutral axis 804 of the half-wave plate 802 is −22.5+90 degrees.

Figure 9:
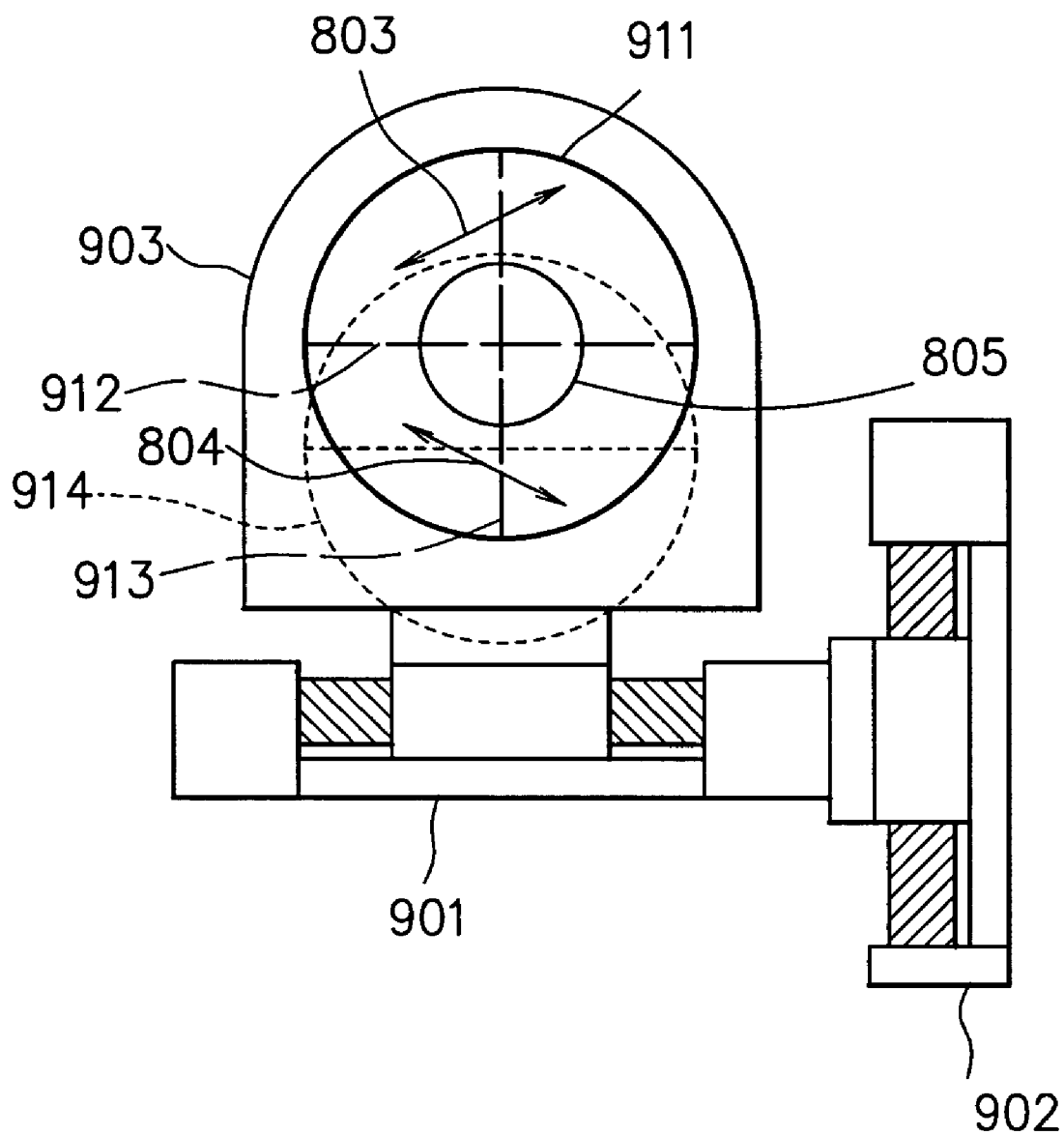
FIG. 9 is a diagram showing a state in which the two-divided half-wave plate is fixed to a stage.

FIG. 9 shows a state in which the two-divided half-wave plate is fixed to the stage. A divisional half-wave plate 911 is rotatably fixed to a rotational stage 903. They are further fixed to a Y-axis stage 902 and an X-axis stage 901 so that they can move vertically and horizontally. When a boundary 912 of the divisional half-wave plate 911 is aligned in a horizontal direction, which corresponds to FIG. 8A, the in-plane Y-component measuring mode is set. When the divisional half-wave plate 911 is rotated to align a boundary 913 in a vertical direction, which corresponds to FIG. 8B, the in-plane X-component measuring mode is set. Further, when a divisional half-wave plate 914 is moved in a downward direction, the perpendicular magnetization component measuring mode is set.

Next, a result of observing a magnetic domain of a permalloy film in a state in which the two-divided half-wave plate is mounted will be explained. In order to remove background noise to observe clear magnetized distribution, difference is measured between a state in which magnetic field intensity applied to the permalloy film is made approximately zero by switching on/off a current passed through an electromagnet provided near a permalloy film and a state in which magnetization of the permalloy film is aligned in the horizontal direction by applying a magnetic field in an in-plane direction of the permalloy film. Obtained is Kerr signal distribution measured in the in-plane magnetization X-vector component measuring mode and the in-plane magnetization Y-vector component measuring mode. A magnetized direction is estimated from the images. After this measurement, also obtained is a magnetic wall pattern observed by a Bitter method, which is a method of observing a magnetic wall by applying liquid including magnetic particles thereto, in the state in which the magnetic field intensity applied to the permalloy film is made approximately zero. The similar magnetic domain structure to the magnetic domain structure obtained in the Kerr effect measurement is observed. Difference in details is unavoidable because of hysteresis. Thus, it can be confirmed that the in-plane magnetization X-vector and Y-components can be separately measured by the method of this embodiment.

Figure 10A:
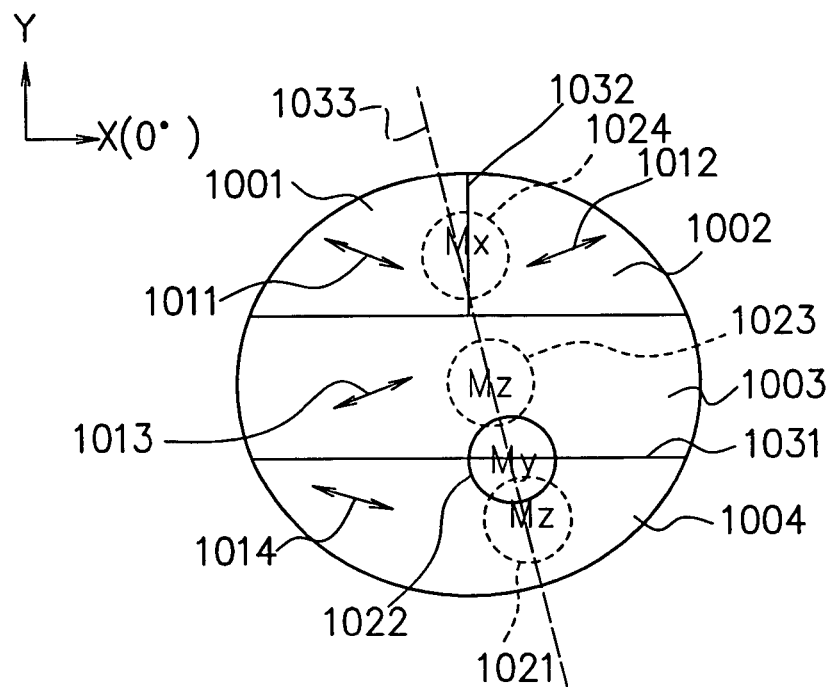
FIGS. 10A and 10B are diagrams showing a four-divided half-wave plate as a second constitutional example of the divisional half-wave element mounted in the microscope in FIG. 7.
Figure 10B:
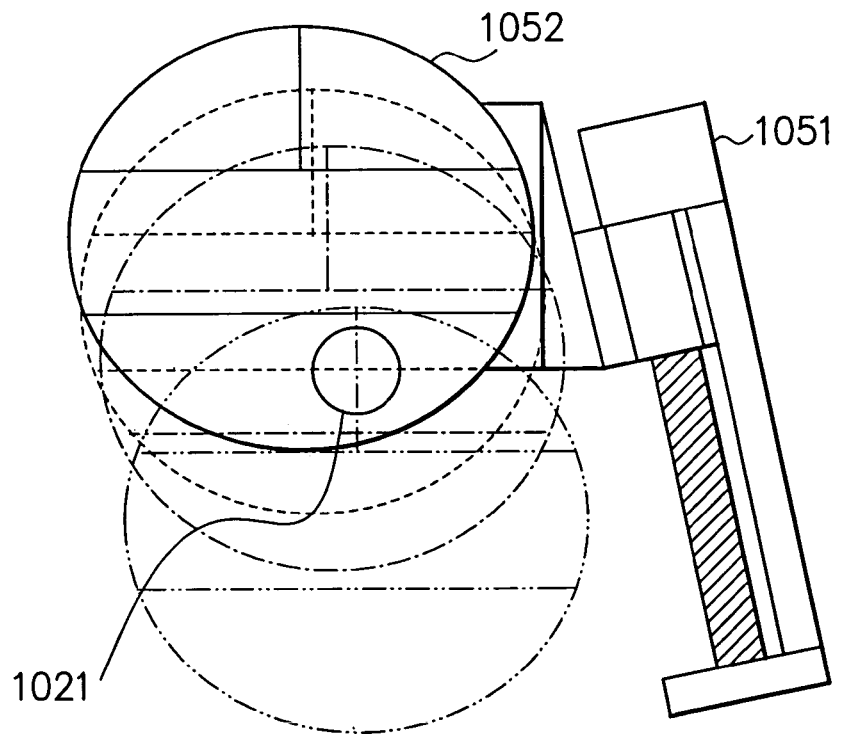

FIG. 10A shows a four-divided half-wave plate as a second constitutional example of the divisional half-wave element mounted in the device. This is particularly an example of Structure 37 to be explained later. A neutral axis 1011 of a half-wave plate 1001 is −22.5 degrees, a neutral axis 1012 of a half-wave plate 1002 is +22.5 degrees, a neutral axis 1013 of a half-wave plate 1003 is +22.5 degrees, and a neutral axis 1014 of a half-wave plate 1004 is −22.5 degrees. The half-wave plates having the neutral axis azimuth angles of ±22.5 degrees are separated by a first boundary 1031 and a second boundary 1032 perpendicular to each other. These two boundaries 1031, 1032 intersect one straight line 1033 as shown in the drawing. As shown in FIG. 10B, a motor stage 1051 capable of moving this four-divided half-wave plate 1052 is provided so that the four-divided half-wave plate is movable in a direction along the straight line 1033. Only the movement of this stage makes it possible to switch a position of this optical element passed by the light flux between positions on the first boundary 1031 and on the second boundary 1032, and a region without the boundaries. Consequently, positions of light flux 1021, 1022, 1023, 1024 passing through the four-divided half-wave plate can be switched only by the uniaxial motor stage 1051. The position of the light flux 1021 is for the perpendicular magnetization component measuring mode, the position of the light flux 1022 is for the in-plane magnetization Y-vector component measuring mode, the position of the light flux 1023 is for the perpendicular magnetization component measuring mode in which a detection polarity is opposite to that of the light flux 1021, and the position of the light flux 1024 is for the in-plane magnetization X-vector component measuring mode.

Figure 11A:
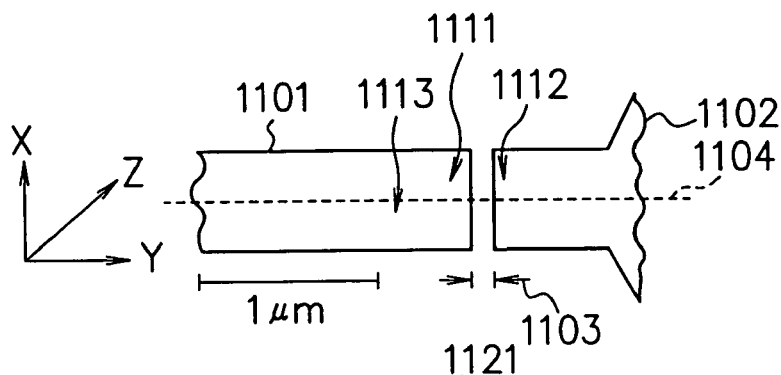
FIGS. 11A to 11D are diagrams showing examples in which magnetized distribution and time response waveforms of magnetization of a magnetic head are measured using a four-divided half-wave plates fixed to a motor stage.
Figure 11B:
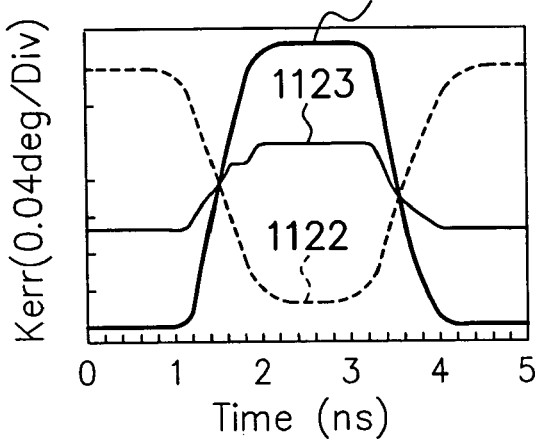
Figure 11C:
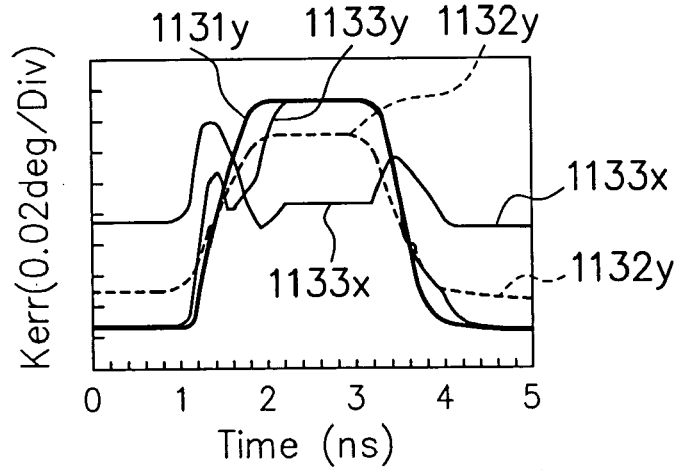
Figure 11D:
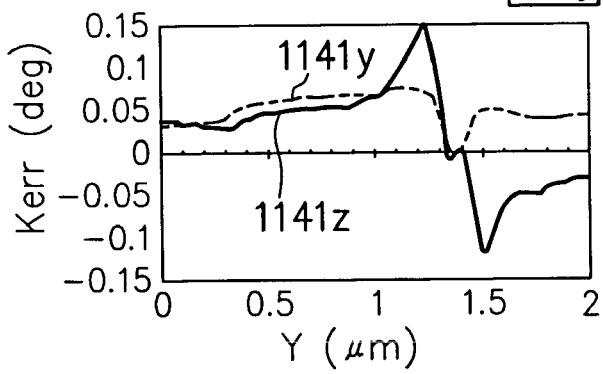

FIGS. 11A to 11D show examples in which magnetized distribution and time response waveforms of magnetization of the magnetic head are measured using the four-divided half-wave plate 1052 fixed to the motor stage 1051 described above. The object lens with a solid immersion lens (SIL) of a high refractive index is used, and its numerical aperture NA is 2.0. FIG. 11A is a schematic diagram showing a result of measuring distribution of the perpendicular magnetization vector component of the magnetic head. Further, shown in FIG. 11D is a distribution chart obtained by measuring a perpendicular magnetization vector component 1141z and an in-plane magnetization Y-vector component 1141y along a line 1104 in FIG. 11A. Magnetized distribution with opposite signs intensely concentrated toward a write gap 1103 is observed in an upper magnetic pole 1101 and a lower magnetic pole 1102 positioned to sandwich the write gap 1103, which shows an expected result as the perpendicular magnetization vector component. Furthermore, as a result of observing distribution of the in-plane magnetization Y-vector component (horizontal direction in the drawing), different from the case of the perpendicular magnetization vector component, magnetized distribution with the same signs is observed in the upper magnetic pole 1101 and the lower magnetic pole 1102 sandwiching the write gap 1103, which also shows an expected result as distribution of the in-plane magnetization Y-vector component. From these results, it can be confirmed that this device can surely measure the perpendicular magnetization vector component and the in-plane magnetization vector components separately. High spatial resolution is obtained not only in perpendicular magnetization measurement but also in in-plane magnetization measurement, and an image of a high S/N is also obtained.

FIG. 11B shows a result of measuring time response waveforms of the perpendicular magnetization (Z) vector component at positions 1111, 1112, and 1113 on the magnetic head. A horizontal axis shows time and a vertical axis shows Kerr rotation. Waveforms 1121, 1122, and 1123 indicate waveforms of the perpendicular magnetization vector components at the positions 1111, 1112, and 1113 of the magnetic head respectively.

FIG. 11C shows a result of measuring time response waveforms of magnetization of the in-plane magnetization X- and Y-vector components at the positions 1111, 1112, and 1113 on the magnetic head. A horizontal axis shows time and a vertical axis shows Kerr rotation. Waveforms 1131$y$, 1132$y$, and 1133$y$ indicate waveforms of the in-plane magnetization Y-vector components at the positions 1111, 1112, and 1113 of the magnetic head. A waveform 1133$x$ indicates a waveform of the in-plane magnetization X-vector component at the position 1113 of the magnetic head.

Different time response is measured for each component. As stated above, it can be confirmed that the perpendicular magnetization vector component and the in-plane magnetization X- and Y-vector components can be separately measured even if the SIL is used. Since the measurement method of this embodiment is a method whose principle is fundamentally based on symmetry nature of the physical law, it effectively functions even using the SIL in which a Photon tunneling phenomenon or such a complicated phenomenon as a magneto-optical interaction between evanescent fields and a magnetic substance can occur.

Eighth Embodiment

Figure 12:
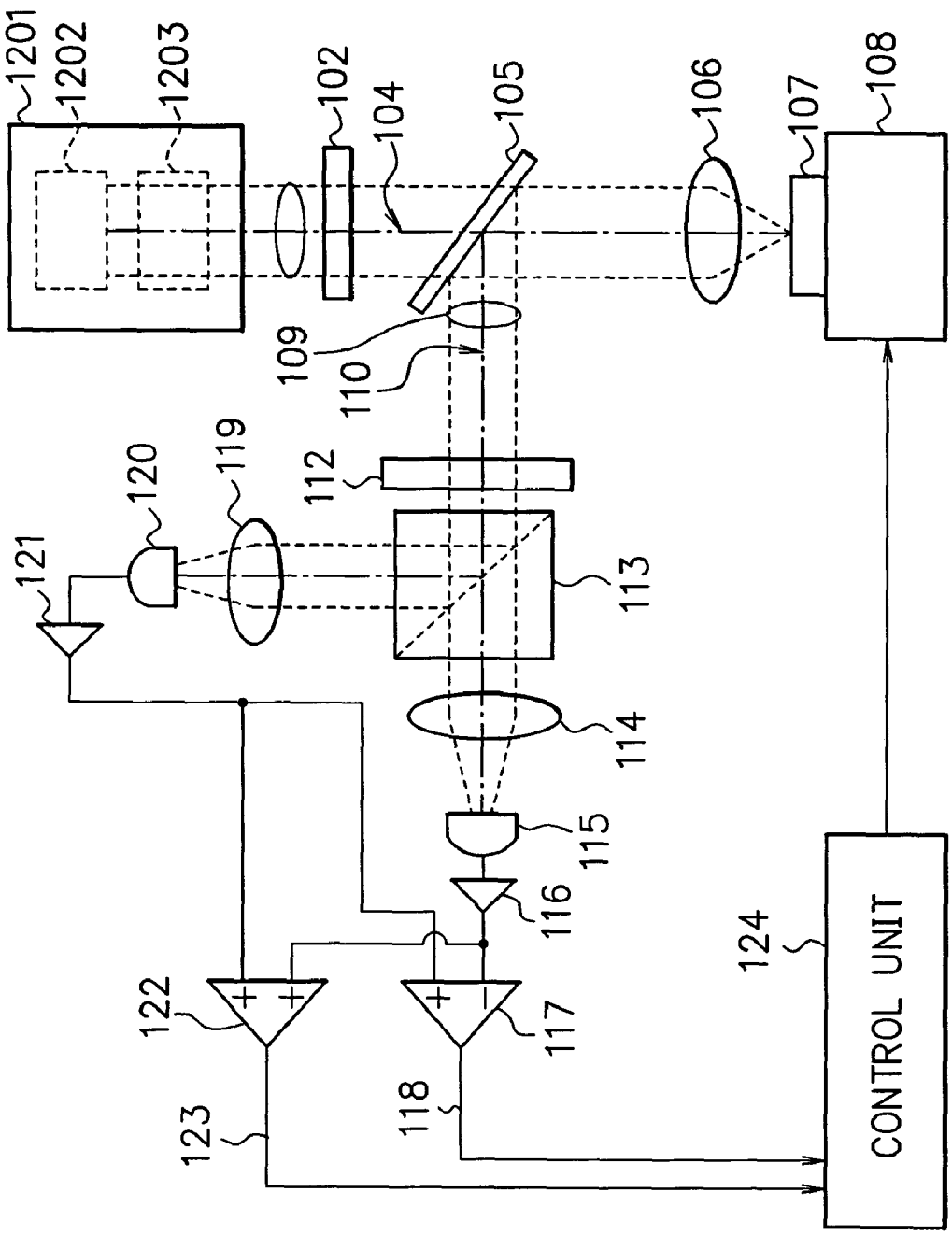
FIG. 12 is a diagram showing a measuring device according to an eighth embodiment of the present invention.

FIG. 12 shows a measuring device according to an eighth embodiment of the present invention. A "half-turn asymmetric reflectional symmetry polarized light source" 1201 is provided as a light source in place of the "half-turn asymmetric polarizing element" 111 in FIG. 1. It is desirable that a reflecting direction of the beam splitter 105 should be aligned in a direction along a reflectional symmetry plane of the light source 1201 or a direction perpendicular thereto so as not to disturb the reflectional symmetry nature by polarization characteristics of the beam splitter 105. Further, it is desirable that the beam splitter 105 of the nonpolarization-nonretardation property should be used. Furthermore, such arrangement is also possible that the light from the light source 1201 is reflected by the beam splitter 105 and the light reflected by the magnetic substance to be measured 107 passes through the beam splitter 105. This optical system substantially has half-turn asymmetry nature around the optical axis and reflectional symmetry nature so that the in-plane magnetization vector component in a direction perpendicular to the reflectional plane can be measured.

Incidentally, the "half-turn asymmetric reflectional symmetry polarized light sources" may be constituted of a linearly polarized light source 1202 and a divisional polarization element (divisional half-wave element or divisional polarization rotation element) 1203. Further, a half-wave plate may be inserted at an appropriate position in the optical path.

Ninth Embodiment

Figure 13:
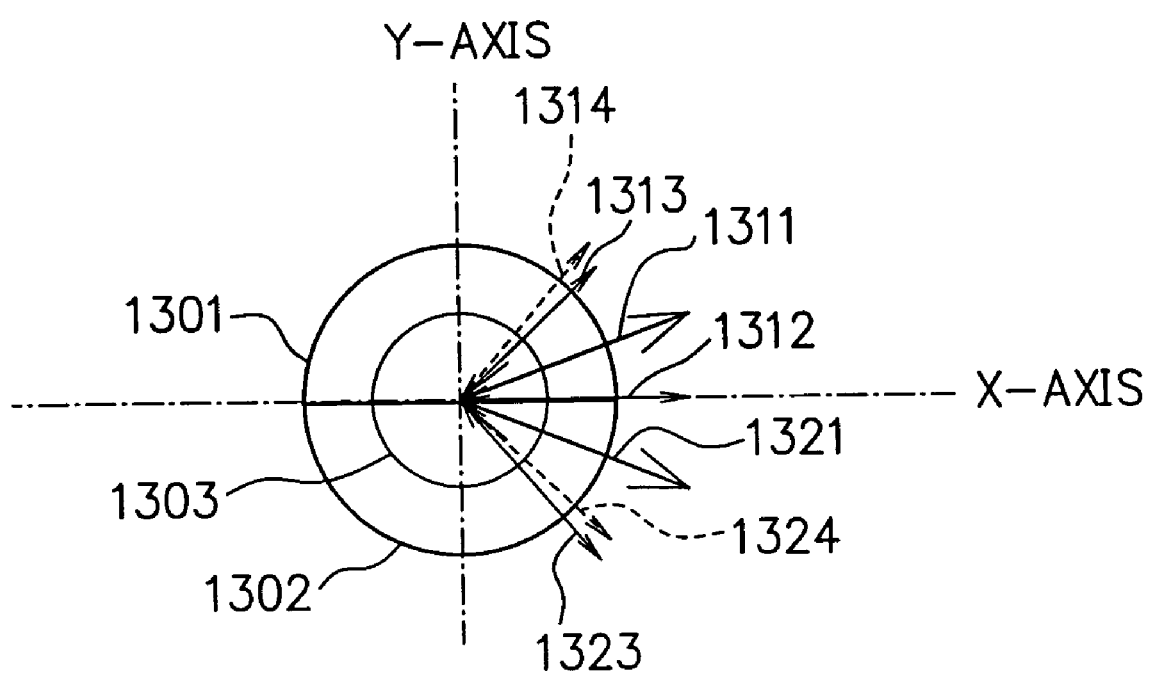
FIG. 13 is a diagram showing an example of a divisional half-wave element according to a ninth embodiment of the present invention.

FIG. 13 shows an example of the divisional half-wave element 1203 (FIG. 12) according to a ninth embodiment of the present invention. An azimuth angle of a neutral axis (slow axis or fast axis) 1311 of an upper-half first divisional half-wave plate 1301 is $\pi/8$ radian, and an azimuth angle of a neutral axis 1321 of a lower-half second divisional half-wave plate 1302 is $-\pi/8$ radian. The light source 1202 outputs linearly polarized light and its polarization azimuth 1312 is 0 degree. When the light having the polarization azimuth 1312 is incident on the first and second divisional half-wave plates 1301, 1302, an angle of a polarization azimuth 1313 of the light passed through the first divisional half-wave plate 1301 becomes $\pi/4$ radian, and an angle of a polarization azimuth 1323 of the light passed through the second divisional half-wave plate 1302 becomes $-\pi/4$ radian. Thereafter, receiving the Kerr rotation of $\delta$ by the magnetic substance to be measured 107, an angle of a polarization azimuth 1314 of the light passed through the first divisional half-wave plate 1301 becomes $\pi/4+\delta$ radian, and an angle of a polarization azimuth 1324 of the light passed through the second divisional half-wave plate 1302 becomes $-\pi/4+\delta$ radian. When the orthogonal X- and Y-polarization components are detected, the Kerr rotation of the light passed through the first and second divisional half-wave plates 1301, 1302 is detected with opposite signs to each other. Therefore, similarly to the aforesaid explanations of the fourth embodiment, only the in-plane magnetization vector component in the Y-axis direction is detected.

Further, it is also directly understood that other components than the in-plane magnetization vector component in the Y-axis direction are not detected considering the reflectional symmetry nature of the light source, the focusing unit, the divisional half-wave element, the polarization split detector, and other optical elements with respect to the X-axis.

[Divisional Polarizing Operation To Light Source (To Invert Kerr Rotation Detection Polarities)]

(Structure 22) Used as a light source is the "half-turn asymmetric reflectional symmetry polarized light source" 1201 for outputting light flux whose intensity distribution in a cross section of the light flux perpendicular to the optical axis has half-turn symmetry nature around the optical axis while whose polarization state distribution thereof does not have the half-turn symmetry nature, in which both the intensity distribution and the polarization state distribution in the light flux cross section are symmetric about reflection with a certain plane including the optical axis as a boundary plane. In an optical element existing in an optical path from output of the light of the aforesaid light source to immediately before the polarization split detector and acting on the light flux, its action on the light intensity distribution and polarization distribution of the light flux has symmetry nature about half-turn around the optical axis and reflection with respect to the reflectional plane described above. Angles between one or two polarization split detection azimuths orthogonal to each other of the polarization split detector and the reflectional plane described above, or a reflectional symmetry plane of the light flux incident when there is no magneto-optical action by the magnetic substance to be measured, are made to integral multiples (naturally including 0 time) of 90 degrees, which enables separate measurement of only one component of in-plane magnetization of the magnetic substance to be measured.

Even if the intensity distribution of the light source is axially symmetric or half-turn symmetric with respect to the optical axis of the optical system and polarization of the reflected light is uniformly detected in the cross section of the light flux, the in-plane magnetization vector components can be detected by making polarization state distribution of the incident light flux asymmetric about the half-turn.

Accordingly, the output light of the light source is set so that its intensity distribution in the light flux cross section is symmetric and its polarization state distribution is asymmetric about the half-turn around the optical axis of the optical system, and the intensity distribution and the polarization distribution in the light flux cross section of the output light from the light source are set to be symmetric about the reflection with respect to the certain plane including the optical axis. Further, the action of the optical element, which exists in the optical path from the output of the light of the light source to immediately before the polarization split detector and acts on the light flux, to the light intensity distribution and polarization distribution of the light flux is set to be symmetric about half-turn around the optical axis and reflection with respect to the reflectional plane describe above, and the angles between the one or two polarization split detection azimuths perpendicular to each other of the polarization split detector and the reflectional plane described above, or the reflectional symmetry plane of the light flux incident when there is no magneto-optical action by the magnetic substance to be measured, are set to be the integral multiples of 90 degrees. As a result, characteristics of the polarization split detector also become symmetric about the reflection. Therefore, characteristics of the measuring device are actually symmetric (unchanged) about the reflection.

On the other hand, the perpendicular magnetization vector component and the in-plane magnetization vector component along the reflectional plane are inverted by the reflection while only the in-plane magnetization vector component perpendicular to the reflectional plane is unchanged by the reflection. Therefore, in this case, sensitivity to the perpendicular magnetization vector component and the in-plane magnetization vector component along the reflectional plane becomes zero and only the magnetization vector component perpendicular to the reflectional plane can be selected and measured.

In this method, since the light can be irradiated to the whole of an incident pupil of the object lens, light utilization efficiency is high and only one component of the in-plane magnetization can be measured while lowering degradation of spatial resolution. Further, simple polarization split detection system, photoreceptor, photoelectric converting circuit, and operational amplifier used in a general perpendicular magnetization vector component measuring system can be used as they are. Furthermore, since this embodiment can be applied to a magneto-optical measuring microscope device for measuring the perpendicular magnetization vector component only by changing a light source, it becomes possible to easily switch between measurement of the perpendicular magnetization vector component and measurement of the in-plane magnetization vector components, which offers convenience.

(Structure 23) The "half-turn asymmetric reflectional symmetry polarized light sources" 1201 of Structure 22 described above is structured so that the polarization distribution in the cross section of the light flux of the light output has different polarization states with a straight line passing through the optical axis perpendicularly to the optical axis as a boundary, the light is linearly polarized light in each of the regions, and angles between polarization azimuth angles thereof and the aforesaid boundary are not zero and have the same absolute value with opposite signs.

Such polarization distribution satisfies the conditions of Structure 22 described above. Further, since the polarization distribution is simple, such a light source can be easily realized. Furthermore, ununiformity in light amount can be decreased in each of the regions and detectivity to the Kerr effect can be comparatively uniform in separating and detecting the polarization components of the reflected light, which can make detected properties excellent.

(Structure 24) The absolute value of the angle difference between the different polarization azimuths of the "half-turn asymmetric reflectional symmetry polarized light source" of Structure 23 described above is 10 degrees or smaller. When the angle difference between the polarization azimuths is made that small, the state slightly deviating from the so-called cross-Nicol state in which the polarization azimuth of the light source and the polarization azimuth of the analyzer are made perpendicular to each other can be realized by aligning polarization detecting direction of the polarization split detector with a reflectional boundary or a line perpendicular thereto, and the detection light amount can be suppressed without greatly reducing the signal amount by the Kerr rotation. Therefore, a direct-current offset component after photoelectric conversion can be reduced and contrast in detection signal can be increased.

(Structure 25) The angle difference between the different polarization azimuths of the "half-turn asymmetric reflectional symmetry polarized light source" of Structure 23 described above is ±90 degrees. The differential polarization detector for splitting the light into two orthogonal polarization components and detecting the difference in light amount between both polarization components is used as the polarization split detector so that a differential polarization detection signal under the state without the Kerr effect can be made exactly zero, which can prevent change in light amount from appearing in the detection signal. Accordingly, when light amount noise is large or the like, the signal component by the Kerr rotation can be measured with a high S/N.

(Structure 26) The "half-turn asymmetric reflectional symmetry polarized light source" 1201 of Structures 22 to 25 described above is constituted of a natural light source, a partially polarized light source, or the linearly polarized light source 1202, and a divisional polarizer 1203 which is constituted of polarizers for taking one polarization component and ununiformly acts in the cross section of the output light flux of the light source.

A divisional polarizer, which is structured to be divided into two regions by a straight boundary and whose polarization transmission axes are tilted by ±θ degree with respect to the boundary, is made to act on a light source for outputting light flux whose intensity distribution and polarization distribution are half-turn symmetric around the optical axis and reflectionally symmetric with respect to a certain plane including the optical axis, with the boundary being aligned with the reflectional symmetry plane of the light source so that the light source of Structures 23 to 25 described above can be constituted.

When a flat region is divided into four regions by two orthogonal lines as boundaries, and two adjacent regions among the regions are filled with a polarizer so that they do not have reflectional symmetry nature with respect to a first boundary sandwiched between these regions. Then, the other two regions are filled with a polarizer in a reflectionally symmetric manner with respect to the other second boundary as a reflectional line so that a divisional polarizer which is reflectionally symmetric with respect to the second boundary and asymmetric about half-turn around a point where the first and second boundaries intersect can be made. The divisional polarizer is made to act with its reflectional symmetry line being aligned with the reflectional symmetry plane of the light source and the intersection point of the first and second boundaries being aligned with a half-turn symmetry axis of the light source so that a light source having different polarization azimuth angles in plural regions and satisfying the conditions of Structure 22 described above can be made.

For example, a divisional polarizer having ±θ polarization transmission axes can be made by cutting a polarizer such as a Polaroid sheet along a line tilted by θ degree with respect to a polarization transmittance azimuth thereof and bonding their cut lines with each other with one piece being reversed. This divisional polarizer is mounted in such a manner that the dividing line (reflectional symmetry line) of the divisional polarizer is aligned with a reflectional symmetry plane of output of a lamp light source or a laser light source for outputting light flux whose intensity distribution and polarization distribution are half-turn symmetric around an optical axis and reflectionally symmetric in a certain plane including the optical axis and the optical axis of the light flux intersects the dividing line so that a "half-turn asymmetric reflectional symmetry polarized light source" can be made whose polarization azimuths are ±θ degree on both sides of a boundary passing through the optical axis.

(Structure 27) The "half-turn asymmetric reflectional symmetry polarized light sources" 1201 of Structures 23 to 25 described above is constituted of a linearly polarized light source and a divisional half-wave element which includes as components elements generating half-wave phase difference and ununiformly acts in a cross section of output light flux of the linearly polarized light source.

A divisional half-wave element which is structured to be divided into two regions by a straight boundary and whose neutral axis azimuths are tilted by ±θ/2 degree with respect to the boundary is made to act on a light source for outputting light flux, whose intensity distribution and polarization distribution have half-turn symmetry nature around the optical axis and reflectional symmetry nature in a certain plane including the optical axis, with the boundary being aligned with the reflectional symmetry plane of the light source so that the light source of Structures 23 to 25 described above can be constituted.

A flat region is divided into four regions by two perpendicular lines as boundaries, and two adjacent regions among the regions are filled with a half-wave element so that they do not have reflectional symmetry nature with respect to a first boundary sandwiched between these regions. Then, the other two regions are filled with a half-wave element in a reflectionally symmetric manner with respect to the other second boundary as a reflectional line so that a divisional half-wave element can be made which is reflectionally symmetric with respect to the second boundary and asymmetric about half-turn around a point where the first and second boundaries intersect. By making the divisional half-wave element act with the reflectional symmetry line thereof being aligned with the reflectional symmetry plane of the light source and the intersection point of the first and second boundaries being aligned with a half-turn symmetry axis of the light source, a light source having different polarization azimuth angles in plural regions and satisfying the conditions of Structure 22 described above can be made.

For example, a divisional half-wave element having regions whose neutral axis azimuths are ±θ/2 degree in upper and lower regions is made by cutting one half-wave element made of quartz or the like along a straight line having a θ/2 angle with respect to its neutral axis azimuth and bonding their cut surfaces with each other with one piece being reversed. When the light is passed through the divisional half-wave element so that a polarization azimuth of the light source for outputting linearly polarizied light, whose intensity distribution is half-turn symmetric around the optical axis and reflectionally symmetric with respect to a plane including the optical axis and the polarization azimuth, is aligned with the dividing line of the divisional half-wave element and the optical axis of the light flux intersects the dividing line, the "half-turn asymmetric reflectional symmetry polarized light sources" can be made which has polarization azimuths of ±θ degree on both sides of a boundary passing through the optical axis.

(Structure 28) The "half-turn asymmetric reflectional symmetry polarized light source" 1201 of Structures 22 to 25 described above is constituted of a linearly polarized light source 1202 and a divisional polarization rotation element 1203 which includes as components elements for rotating polarization and ununiformly acts in a cross section of output light flux of the linearly polarized light source.

A divisional polarization rotation element divided into two regions by a straight boundary and rotating polarization by ±θ degree in each of the regions is made to act on a light source for outputting light flux, whose intensity distribution and polarization distribution have half-turn symmetry nature around the optical axis and reflectional symmetry nature in a plane including the optical axis, with the boundary being aligned with the reflectional symmetry plane of the light source so that the light source of Structures 23 to 25 described above can be constituted.

A flat region is divided into four regions by two perpendicular lines as boundaries, and two adjacent regions among the regions are filled with a polarization rotation element so that they do not have reflectional symmetry nature with respect to a first boundary sandwiched between these regions. Then, the other two regions are filled with a polarization rotation elements in a reflectionally symmetric manner with respect to the other second boundary as a reflectional line so that a divisional polarization rotation element can be made which is reflectionally symmetric with respect to the second boundary and asymmetric about half-turn around a point where the first and second boundaries intersect. By making the divisional polarization rotation element act with the reflectional symmetry line thereof being aligned with the reflectional symmetry plane of the light source and the intersection point of the first and second boundaries being aligned with a half-turn symmetry axis of the light source, a light source having different polarization azimuth angles in plural regions and satisfying the conditions of Structure 22 described above can be made.

For example, a divisional polarization rotation element having rotation angles of ±θ degree in two regions can be made by bonding optically active elements which have optical rotation angles of ±θ degrees with a straight line as a boundary. When the light is passed through the divisional polarization rotation element so that a polarization azimuth of the light source for outputting linearly polarized light, whose intensity distribution is half-turn symmetry around the optical axis and reflectionally symmetric with respect to a plane including the optical axis and the polarization azimuth, is aligned with a bonding line of the divisional polarization rotation element and the optical axis of the light flux intersects the bonding line, the "half-turn asymmetric reflectional symmetry polarized light source" which has polarization azimuths of ±θ degree on both sides of a boundary passing through the optical axis can be made.

However, it is becoming difficult to obtain optically active elements made of optically active substance such as quartz except those with rotation of one polarity. Therefore, the divisional polarization rotation element may be made of two polarization rotation elements having polarization rotation angles with the same sign by, in stead of making the ±θ polarization rotation angles, adding an integral multiple of 180 degrees to the angles.

Further, there is also no problem if a Faraday rotation element providing the same polarization rotation action to the incident light is used in place of the optically active element because it gives equivalent action as long as the light is passed from one direction.

Tenth Embodiment

FIGS. 14A to 14D show examples of a divisional modulator according to a tenth embodiment of the present invention. Here, examples of a divisional liquid crystal modulator constituted of a liquid crystal modulator are shown as the divisional modulator.

Figure 14A:
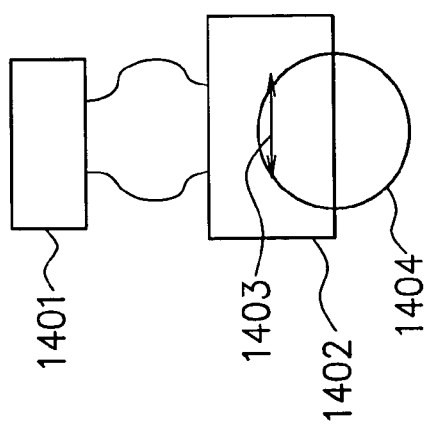
FIGS. 14A to 14D are diagrams showing examples of a divisional modulator according to a tenth embodiment of the present invention.

In FIG. 14A, an outer control voltage source 1401 controls generated phase difference of a divisional liquid crystal phase modulator 1402. A neutral axis 1403 of the divisional liquid crystal phase modulator 1402 is set to θ degree and the divisional liquid crystal phase modulator 1402 acts only on a half of light flux 1404.

Figure 14B:
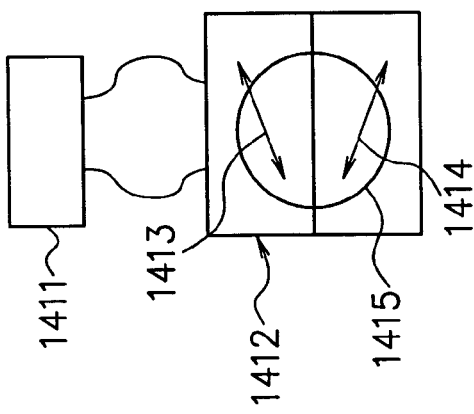

In FIG. 14B, an outer control voltage source 1411 controls generated phase difference in two-divided regions of a divisional liquid crystal phase modulator 1412. Respective neutral axis azimuths 1413 and 1414 of the two-divided regions of the divisional liquid crystal phase modulator 1412 are +22.5 degrees and −22.5 degrees. The neutral axis azimuths 1413 and 1414 may be ±45 degrees or the like. The divisional liquid crystal phase modulator 1412 having the different neutral axis azimuths 1413 and 1414 acts on upper and lower halves of light flux 1415. If necessary, a liquid crystal phase modulator acting on the whole of the light flux and having a neutral axis azimuth angle of, for example, +22.5 degrees is further provided in an optical path to be utilized for polarization rotation of 45 degrees which is required when a mode is switched to perpendicular magnetization vector component measurement.

Figure 14C:
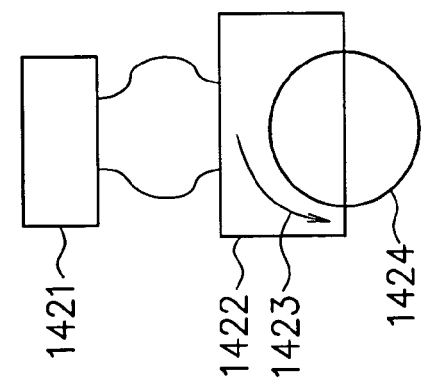

In FIG. 14C, an outer control voltage source 1421 controls a divisional liquid crystal polarization rotation modulator 1422. By the control, a polarization rotation angle 1423 of the divisional liquid crystal polarization rotation modulator 1422 can be controlled to be, for example, 0 degree, 90 degrees, or the like. The divisional liquid crystal polarization rotation modulator 1422 acts only on a half of light flux 1424.

Figure 14D:
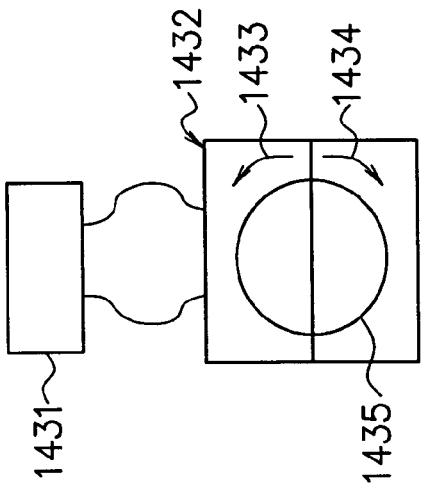

In FIG. 14D, an outer control voltage source 1431 controls two-divided regions of a divisional liquid crystal polarization rotation modulator 1432. By the control, polarization rotation angles 1433 and 1434 in the respective two-divided regions of the divisional liquid crystal polarization rotation modulator 1432 can be controlled to be, for example, 0 degree, +45 and −45 degrees, or the like. The divisional liquid crystal polarization rotation modulator 1432 having the different polarization rotation angles 1433 and 1434 acts on upper and lower halves of light flux 1435.

In the liquid crystal phase modulator, the generated phase difference between two orthogonal polarization components of the passing light can be controlled by a voltage applied from the outer control voltage source, and it is possible to continuously change or switch between phase difference of 0 and half-wave by overlaying a compensational phase plate if necessary. When the applied voltage has an alternating current waveform such as a rectangular waveform in order to prevent degradation of liquid crystal due to ionization, the phase difference is controlled by alternating current voltage amplitude.

This divisional liquid crystal phase modulator is used in place of the divisional half-wave element so that the in-plane magnetization vector components can be measured when the generated phase difference of the liquid crystal phase modulator is set to be controlled to half-wave while the perpendicular magnetization vector component can be measured when the generated phase difference of the liquid crystal phase modulator is controlled to zero. By controlling the outer control voltage source for applying a voltage to the liquid crystal, the perpendicular magnetization vector component and the in-plane magnetization vector components can be measured by electrical switching.

Eleventh Embodiment

FIG. 15 shows an example of a spatial phase modulator according to an eleventh embodiment of the present invention. Here, an example of using a liquid crystal spatial phase modulator 1501 as the spatial phase modulator is shown. The liquid crystal spatial phase modulator 1501 in this example is constituted of 6×6=36 liquid crystal elements, and generated phase difference of each of the liquid crystal elements can be independently controlled from a liquid crystal spatial phase modulator controller 1504. The drawing shows an example in which a high-voltage is applied to an upper half 1502 of the 36 elements and a low-voltage is applied to a lower half 1503 so that phase difference of the upper half 1502 is made to zero and generated phase difference of the lower half 1503 is made to half-wave. From the principle explained in Structure 3 described above, the in-plane magnetic Y-axis vector component can be measured separately from the in-plane magnetic X-axis vector component and the perpendicular magnetization vector component. Further, when a high-voltage is applied to a right half of the liquid crystal elements and a low-voltage is applied to a left half thereof so that phase difference of the right half is made to zero and generated phase difference of the left half is made to a half-wave, the in-plane magnetic X-axis vector component can be measured separately from the in-plane magnetic Y-axis vector component and the perpendicular magnetization vector component. Furthermore, when a high-voltage is applied to all of the liquid crystal elements, the perpendicular magnetization vector component can be measured.

Moreover, when the liquid crystal elements are sufficiently smaller than the size of an incident light beam 1505, an in-plane magnetization vector component of any direction can be measured by separating the liquid crystal elements by a boundary at any angle passing through the center of the light beam 1505, setting phase difference of one of them to be zero and phase difference of the other to half-wave, and further, if required, controlling them by a polarization rotation element or a half-wave element to align a polarization azimuth of the light source with the boundary or in a direction perpendicular thereto and placing a polarization rotation element or a half-wave element also before the polarization split detector to control a polarization split direction to be ±45 degrees with respect to the boundary.

In addition, a liquid crystal spatial polarization rotation modulator can be also similarly used as a spatial polarization rotation modulator in place of the liquid crystal spatial phase modulator 1501.

[Divisional Modulator]

(Structure 29) A divisional phase modulator in which generated phase difference in each divided region can be controlled from the outside is used in place of the "divisional half-wave element or divisional ¼ wave element" described above so that generated phase difference in each region is controlled from the outside.

The generated phase difference is switched to zero by the control from the outside so that the measurement having sensitivity to the in-plane magnetization vector components can be switched to the normal measurement having sensitivity only to the perpendicular magnetization vector component.

For example, when the divisional phase modulator is used in place of the divisional half-wave element in Structure 3, the measurement having sensitivity to the in-plane magnetization vector components can be switched to the measurement having sensitivity to the perpendicular magnetization vector component by switching the generated phase difference from half-wave to zero by the control from the outside. As the divisional phase modulator, the divisional liquid crystal phase modulator, a divisional electrooptic phase modulator, a divisional phtoelasticity phase modulator, or the like can be used.

(Structure 30) A spatial phase modulator in which spatial distribution of phase difference can be controlled from the outside is used in place of the "divisional half-wave element or divisional ¼ wave element" described above so that generation distribution of the phase difference is controlled from the outside.

The generated phase difference is switched to zero by the control from the outside so that the measurement having sensitivity to the in-plane magnetization vector components can be switched to the normal measurement having sensitivity only to the perpendicular magnetization vector component.

Further, by switching the generation distribution of the phase difference, measurement sensitivity to the two orthogonal in-plane magnetization vector components can be switched. Furthermore, by finely adjusting the generation distribution of the phase difference, adjustment to minimize sensitivity to the perpendicular magnetization vector component becomes also possible. As the spatial phase modulator, for example, the liquid crystal spatial phase modulator can be used.

(Structure 31) A divisional polarization rotation modulator in which a polarization rotation angle in each divided region can be controlled from the outside is used in place of the "divisional polarization rotation element" described above so that the polarization rotation angle in each of the regions is controlled from the outside.

The polarization rotation angle is switched to zero by the control from the outside, the measurement having sensitivity to the in-plane magnetization vector components can be switched to the measurement having sensitivity only to the perpendicular magnetization vector component. As the divisional polarization rotation modulator, for example, a divisional Faraday rotation modulator or the divisional liquid crystal polarization rotation modulator can be used.

(Structure 32) A spatial polarization rotation modulator in which spatial distribution of a polarization rotation angle can be controlled from the outside is used in place of the "divisional polarization rotation element" described above so that generation distribution of the polarization rotation angle is controlled from the outside.

The polarization rotation angle is switched to zero by the control from the outside, the measurement having sensitivity to the in-plane magnetization vector components can be switched to the normal measurement having sensitivity only to the perpendicular magnetization vector component.

Further, by switching generation distribution of the polarization rotation angle, measurement sensitivity to the two orthogonal in-plane magnetization vector components can be switched. Furthermore, by finely adjusting the generation distribution of the polarization rotation angle, adjustment to minimize sensitivity to the perpendicular magnetization vector component is also possible. As the spatial polarization rotation modulator, for example the liquid crystal spatial polarization rotation modulator or Faraday spatial rotation modulator can be used.

[Transverse Kerr Effect]

(Structure 33) Provided in Structures 25, 14, or 21 described above is a mechanism for inserting a half-wave element, in which an angle between its neutral axis azimuth and the reflectional symmetry line of the "half-turn asymmetric reflectional symmetry polarized light source" described above or the reflectional symmetry line of the "half-turn asymmetric reflectional symmetry polarizing element" described above is +22.5 degrees or −22.5 degrees, in the optical path between the magnetic substance to be measured and the polarization split detector.

As a result, the polarization azimuths in the cross section of the light flux incident on the differential polarization split detector when there is no Kerr effect are aligned with the polarization split azimuths orthogonal to each other in two regions divided by the reflectional symmetry line in the light flux cross section so that the optical system for detecting the polarization rotation in the two divided regions can be switched to an optical system for detecting difference in light amount between the two regions. In the latter case, difference of change in reflectivity by a transverse Kerr effect between the two regions can be detected and only the in-plane magnetization vector component along the dividing line can be measured.

(Structure 34) Provided in Structures 25, 14, or 21 described above is a mechanism for inserting a polarization rotation element whose rotational angle is +45 degrees or −45 degrees in the optical path between the magnetic substance to be measured and the polarization split detector.

As a result, similarly to Structure 33 described above, the optical system for detecting the polarization rotation in the two regions divided by the reflectional symmetry line in the cross section of the light flux can be switched to the optical system for detecting difference in light amount. In this case, difference of change in reflectivity by the transverse Kerr effect between the two regions can be detected and only the in-plane magnetization vector component along the dividing line can be measured.

[Switching Of Rotation, Movement, and X- and Y-components]

(Structure 35) Provided is a "divisional optical element rotation control stage" for rotating and controlling the azimuth angle around the optical axis of the aforesaid "half-turn asymmetric polarized light source, divisional polarizer, divisional half-wave element, divisional polarization rotation element, divisional ¼ wave element, divisional phase modulator, divisional polarization rotation modulator, spatial phase modulator, or spatial polarization rotation modulator". The stage is a manual or automatic stage.

By the rotation control of the azimuth angle of each element, generation distribution of the polarization azimuth, phase difference, and polarization rotation can be switched and measurement sensitivity to the two orthogonal in-plane magnetization vector components can be switched. Further, half-wave plates whose neutral axis azimuth angle can be rotated and controlled manually or automatically are added in the optical path as required so that the in-plane magnetization vector component in any direction can be also measured by switching.

(Structure 36) Provided is a "divisional optical element position control stage" for moving and controlling a position of the aforesaid "half-turn asymmetric polarized light source, divisional polarizer, divisional half-wave element, divisional polarization rotation element, divisional ¼ wave element, divisional phase modulator, divisional polarization rotation modulator, spatial phase modulator, or spatial polarization rotation modulator" so that a position passed by the light flux in the element can be controlled. The stage is a manual or automatic stage. The position of the element is controlled so that sensitivity to the perpendicular magnetization vector component can be controlled to a minimum.

(Structure 37) The aforesaid "divisional polarizer, divisional half-wave element, divisional polarization rotation element, divisional ¼ wave element, divisional phase modulator, divisional polarization rotation modulator, spatial phase modulator, or spatial polarization rotation modulator" includes at least two of first and second boundaries orthogonal to each other as divisional boundaries whose both sides are different in optical characteristic, in which the first and second boundaries are arranged in such a manner that a certain one straight line is aligned with one of them and intersects the other or intersects both of them, and has a stage capable of moving the optical element in a direction along the straight line so that the position of the optical element where the light flux is incident can be switched between positions on the first boundary and on the second boundary and a region without the boundaries only by the movement of this stage.

It becomes possible to switch the position passed by the light flux between the positions on the first boundary and on the second boundary and the region without the boundaries only by the uniaxial manual or automatic stage. Consequently, for example, the uniaxial stage enables switching of measurement of three components, that is, the two orthogonal in-plane magnetization vector components and the perpendicular magnetization vector component. Further, a moving direction of the uniaxial stage is made parallel to neither of the first nor second boundary, which also makes it possible to finely adjust positions of the first and second boundaries passed by the light flux or on which it acts only by this uniaxial stage.

Twelfth Embodiment

Figure 16:
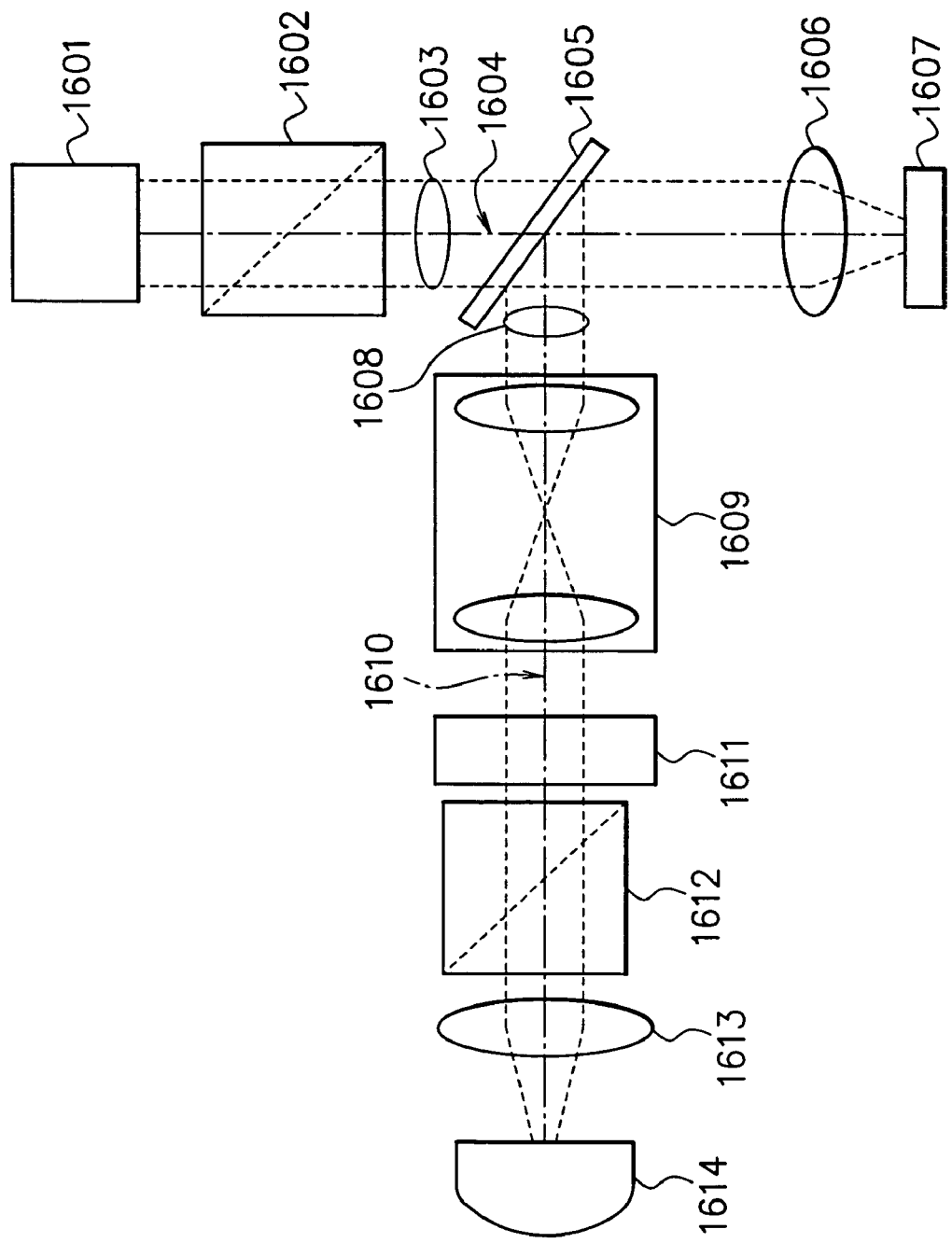
FIG. 16 is a diagram showing an example of a measuring device according to a twelfth embodiment of the present invention.

FIG. 16 shows an example of a measuring device according to a twelfth embodiment of the present invention. First, the case without a relay lens 1609 will be explained. Light from an illuminating optical system 1601 is passed through a polarizing prism (or polarizing plate) 1602 to be linearly polarized light 1603, and then passed through a beam splitter 1605 and an object lens 1606 to illuminate a magnetic substance to be measured 1607 as a sample. The optical system described above has an optical axis 1604.

The light reflected by the sample 1607 is focused by the object lens 1606, reflected by the beam splitter 1605, passed through a divisional half-wave element (or divisional polarizer or divisional polarization rotation element) 1611, and passed through a polarizing prism (polarizing plate) 1612 to be focused on a camera 1614 by an imaging lens 1613.

As a result, an image of the in-plane magnetization vector components can be observed separately from the perpendicular magnetization vector component. The divisional half-wave element (or divisional polarizer or divisional polarization rotation element) 1611 makes it possible to observe an image of only either the in-plane magnetization X-vector component or the in-plane magnetization Y-vector component. The fact that the image can be observed without conducting laser scanning or sample scanning is one of the prominent advantages of this embodiment as compared with the conventional principle that different magnetization vector components are detected by using the divisional photo-detector. The polarizing prisms 1602, 1612 are, for example, Glan-Thompson prisms.

Incidentally, depending on an observing position, a position of the reflected light flux in the divisional half-wave element or the divisional polarization rotation element slightly deviates from the observing position and, if this causes a problem, the relay lens 1609 is provided between the beam splitter 1605 and the divisional half-wave plate 1611. A pupil surface of the object lens is mapped on a surface of the divisional half-wave plate (or a surface of the divisional polarization rotation element) by the relay lens 1609 so that influence of position deviation of the reflected light flux from each observing position can be eliminated. It is also possible to provide an eyepiece lens for visual inspection in place of the camera 1614. It is needless to say that an image output of the camera 1614 may be captured in a signal processing system or a computer to perform appropriate signal processing or image processing if required.

Thirteenth Embodiment

Figure 17:
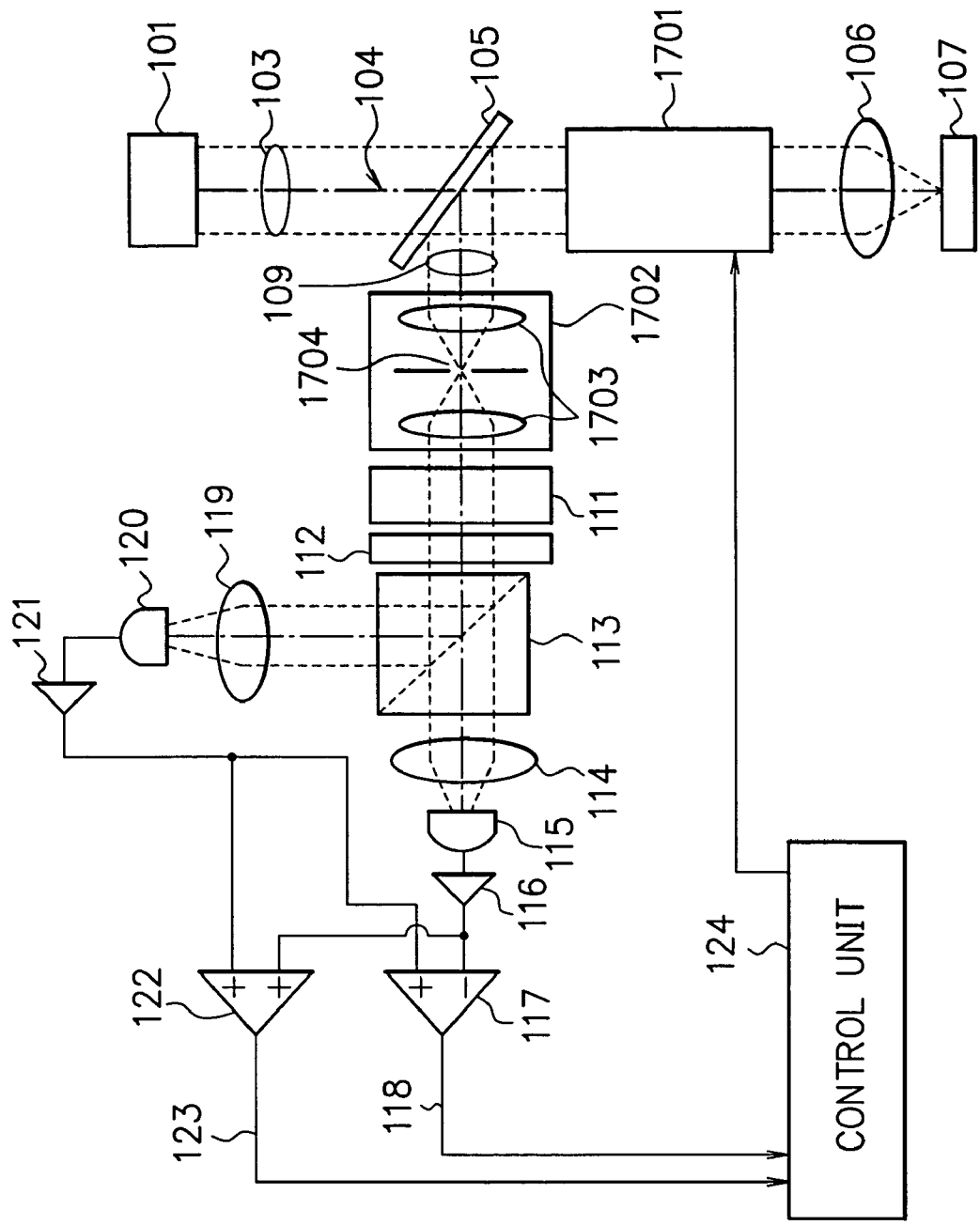
FIG. 17 is a diagram showing an example of a measuring device according to a thirteenth embodiment of the present invention.

FIG. 17 shows an example of a measuring device according to a thirteenth embodiment of the present invention. A laser scanning system 1701 and a spacial filter 1702 for confocal measurement are provided in place of the stage 108 in FIG. 1. In the laser scanning system 1701, a relay lens for preventing shift of a reflected laser beam due to scanning is also incorporated. The spacial filter 1702 has two lenses 1703 and a pinhole 1704 therebetween and blocks reflective light and dispersed light from a position out of focus as well as has an effect of improving in-plane spatial resolution.

[Camera, Laser Scanning, and Short-pulsed Light]

(Structure 38) In place of the photo-detector described above, the imaging lens 1613 and the image detecting element 1614 such as, for example, a image pickup tube, a CCD camera, or a cooling CCD camera are used to detect the light incident on each pixel, which makes it possible to obtain magnetized distribution image data. It is possible to use two cameras in place of the two photo-detectors.

When this method is applied, the light passed through the polarization split element is imaged on a light receiving surface of the image detecting element so that image observation of the in-plane magnetization vector components becomes possible. If a sample observing position deviates from the optical axis of the optical system (namely, the center axis of the object lens), the aforesaid reflectional symmetry nature necessary for completely separating only one component of in-plane magnetization is disturbed in the strict sense while it is approximately kept near the optical axis.

(Structure 39) The imaging lens and the eyepiece lens are provided in place of the aforesaid photo-detector and focusing lens, which enables visual inspection of the magnetized distribution.

When this method is applied, it becomes possible to visually inspect an image, which is obtained by imaging the light passed through the polarization split element by the imaging lens, through the eyepiece lens.

(Structure 40) Used as the aforesaid light source is a short-pulsed laser light source having pulse width of 100 ps or smaller which emits light in synchronization with operation of changing the magnetization state of the magnetic substance or operation of moving the magnetic substance.

In order to measure time change of the magnetization state in high-speed operation of a write magnetic pole of a magnetic head of a magnetic recording device or the like, a general method of increasing measurement bandwidth of light detection using a continuous light source makes the measurement difficult for the following reasons: bandwidth and accuracy of a photo-detector, subsequent I/V amplifier, and operational amplifier become insufficient, noise of the photo-detector and a wideband I/V amplifier becomes large, and so on. Accordingly, the magnetizing operation is cyclically operated and a pulsed light is irradiated at any timing of the cycle for detection so that the magnetization state at the timing can be measured with time resolution of the light pulsed-width without being restricted by the bandwidth of the photo-detector. Further, the measurement is repeated while shifting the irradiation timing of the short-pulsed light in the cycle of the magnetization change so that a state of high-speed change over time of magnetization can be measured. This measurement method is called as a sampling measurement method.

Although it is general to use as the short-pulsed light source a mode-locked laser which generates an ultrashort-pulsed light having pulse width of approximately 100 fs, short-pulsed light having pulse width of several tens ps and obtained by pulse-driving a semiconductor laser can be also used.

However, in the conventionally-known method of measuring the in-plane magnetization vector components using the divisional photo-detector, it is difficult that, when such a short pulse of light is incident, all of the divisional photo-detector, many I/V conversion amplifiers working for many electric pulse signals outputted by each element of the divisional photo-detector, and outputs of a computing circuit working for each output of the I/V conversion amplifiers operate linearly and precisely for light input to each divided part. Since the precise operation of these items becomes more difficult as response operation speed becomes higher, measurement accuracy can be increased by sufficiently lowering detection circuit bandwidth than a sampling frequency using an element, a circuit, a low-pass filter, or the like whose response is slowed down on purpose. However, when measurement is conducted by greatly changing the sampling frequency, an average of received light amount largely changes and therefore a dynamic range of the detection and signal processing system becomes insufficient, which makes measurement difficult. Further, since the plural I/V conversion amplifiers corresponding to each element of the divisional photo-detector are required, noise is increased.

In the method of this embodiment, since the method of controlling the polarization state of the light by the polarization element is taken, it functions well even if such a pulsed light source having the extremely short pulse width is used, without increase in noise, and ultra-high-speed time change of the perpendicular magnetization vector component and the orthogonal two components of in-plane magnetization of the magnetic substance can be measured accurately with high sensitivity. Further, the photo-detector does not need the divisional structure, and therefore a non-divisional avalanche photodiode or a photoelectron multiplier, which is easily manufactured or available, can be used.

(Structure 41) A laser scanning system for scanning a focusing spot position where the light beam from the aforesaid laser light source is focused by the focusing unit is provided, and the aforesaid "divisional optical element rotation control stage", "divisional optical element position control stage", or "divisional optical element position moving and control stage" is an automatic stage, in which the automatic stage is moved and controlled in synchronization with scanning of the laser scanning in at least one direction.

For example, when a mirror inclined by a piezo element is used to enable the laser scanning, a position where the reflected light from the magnetic substance is incident on the inclined mirror again also deviates, and a light flux position deviates according to a laser scanning position in the optical path of the reflected light after the inclined mirror. Therefore, a position of the aforesaid divisional optical element where the reflected light flux passes or acts deviates and the perpendicular magnetization vector component is mixed in measuring the in-plane magnetization vector components. Accordingly, the position of the divisional optical element is moved and controlled in synchronization with the laser scanning position by the automatic stages described above, thereby preventing the problem. Incidentally, if a sample observing position deviates from the optical axis of the optical system (center axis of the object lens), the aforesaid reflectional symmetry nature necessary for completely separating only one component of magnetization is disturbed in the strict sense while it is approximately kept near the optical axis.

(Structure 42) Provided is a relay lens system for optically aligning a position of the light flux incident on the aforesaid "divisional polarizer, divisional half-wave elements, divisional polarization rotation element, divisional ¼ wave elements, divisional phase modulator, divisional polarization rotation modulator, spatial phase modulator, or spatial polarization rotation modulator" with a pupil position of the focusing lens.

When image measurement of magnetized distribution is conducted by forming an image on a camera by an imaging lens using a spatially incoherent light source such as a lamp, the light reflected at different points of the magnetic substance passes in different optical paths. Therefore, they pass through different positions of the divisional optical element described above and magnetization vector components of two or more directions are mixed. A relay lens constituted of two or more lens systems is used to optically align the pupil position of the focusing lens with the position of the divisional optical element described above under appropriate magnification, which eliminates the difference and enables accurate measurement of the magnetization vector components.

Further, also when the image measurement is conducted using the laser light source and the laser scanning system, the light reflected at the different points of the magnetic substance passes in the different optical paths and through the different positions of the divisional optical element described above, and the magnetization vector components in two or more directions are mixed or sensitivity variation and measurement errors between each of the magnetization vector components arise. The relay lens constituted of the two or more lens systems is used to optically align the pupil position of the focusing lens with a scanning position of the laser scanning system described above under appropriate magnification, which eliminates the difference and enables accurate measurement.

Fourteenth Embodiment

Figure 18:
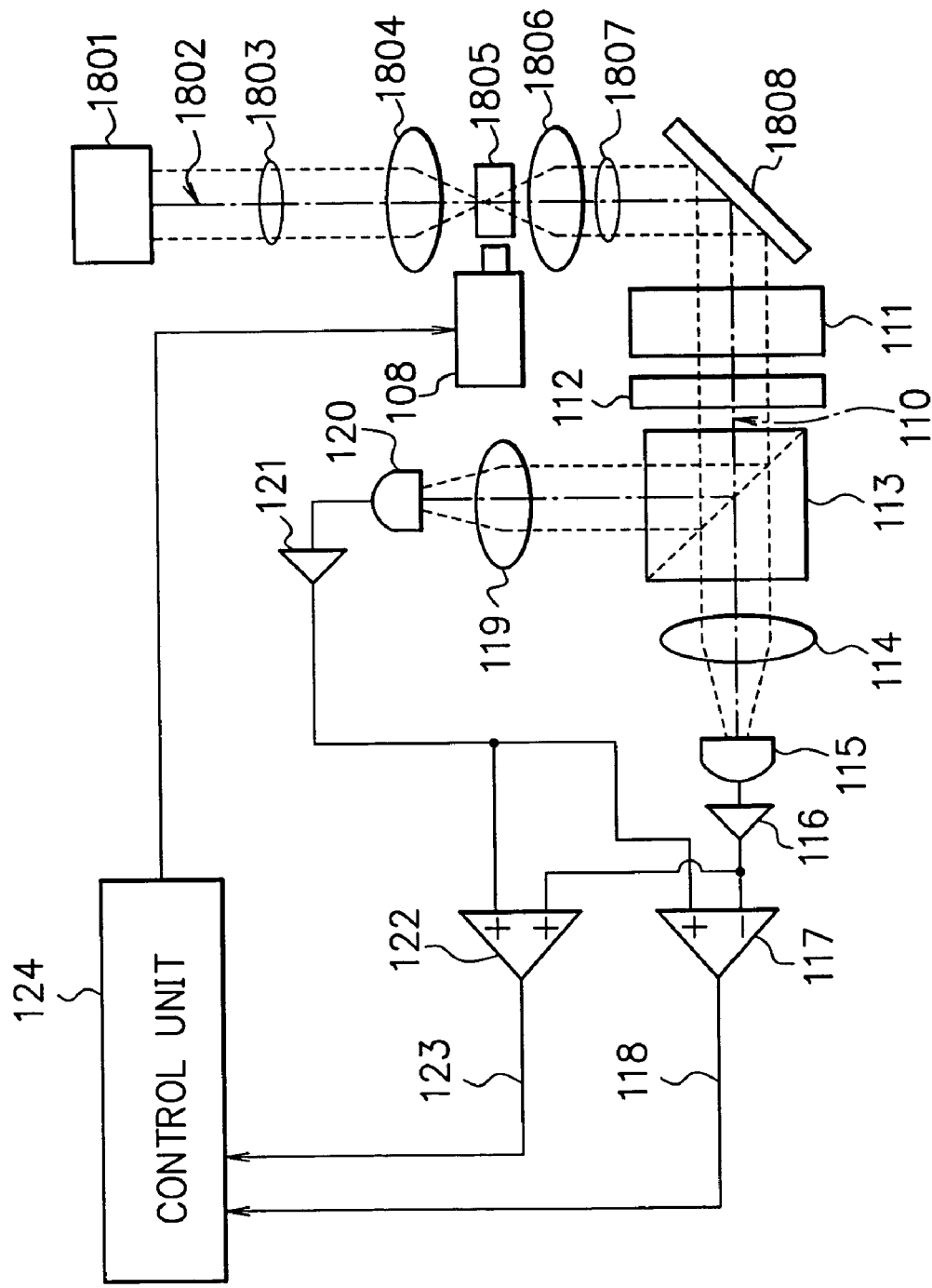
FIG. 18 is a diagram showing an example of a measuring device according to a fourteenth embodiment of the present invention.

FIG. 18 shows an example of a measuring device according to a fourteenth embodiment of the present invention. In this measuring device, the Faraday effect is measured instead of the magnetic Kerr effect. The Faraday effect is a phenomenon that, when the light having the linear polarization is irradiated to pass through a substance to be measured (magnetic substance) 1805, a polarization plane of the light is rotated under the influence of magnetization of the substance to be measured. The aforesaid method and device of separately measuring the in-plane magnetization vector components and the perpendicular magnetization vector component can be also applied to observation of the Faraday effect of a light transmission magnetic substance (including paramagnetic substance and diamagnetic substance).

A linearly polarized light source 1801 focuses linear polarization 1803 by a first object lens 1804 and irradiates it to the substance to be measured 1805. The substance to be measured 1805 is a magnetic substance or a Faraday element probe. The light passed through the substance to be measured 1805 is focused by a second object lens 1806 and made incident on the half-turn asymmetric reflectional symmetry polarizing element 111 by a mirror 1808. The operation thereafter is the same as in FIG. 1. As a result, a magnetic field and magnetization can be observed.

Incidentally, Faraday element probes in FIGS. 20A to 20C and FIGS. 21A and 21B to be explained later may be also used as Faraday element probes of a transmission type without forming light reflective surfaces. Further, in the drawing, the transmitting light is guided to the polarization split detection system after bending the optical path into 90 degrees by the mirror 1808, but it may be directly guided to the detection system without being bent.

[Faraday Effect]

(Structure 43) Change in polarization state or light amount of the light passed through or passed through and reciprocated in the magnetic substance to be measured by a Faraday effect is detected instead of detecting change in polarization state or light amount of the reflected light by the magnetic substance to be measured by the magneto-optical effect described above.

The Faraday effect is a kind of the magneto-optical effect and causes polarization rotation and different absorption of left and right circular polarization of the passing light in proportion to magnetization or the magnetic field. The physical law adhered by this effect has spatial rotational symmetry nature and spatial inversion symmetry nature, and therefore the aforesaid discussion based thereon holds. These effects are proportional to a component in a light passing direction of a magnetization vector or a magnetic field vector. Accordingly, when the light focused by the focusing lens is passed through the Faraday element, light components in different incident directions of the focused light receive effects proportional to different components of the magnetization vector or the magnetic field vector. The measurement method described above is applied so that perpendicular and in-plane direction components of the magnetization of the Faraday element or the magnetic field vector components acting thereon can be measured concerning the passing light.

Further, when the light reciprocates in the magnetic substance, a polarization rotation angle becomes twice, different from polarization rotation by optical activity. Therefore, it is also suitable to detect reflected light of the light irradiated to a Faraday element which has a reflective surface on one side and reflected by the reflective surface to be returned from the Faraday element.

Fifteenth Embodiment

Figure 19A:
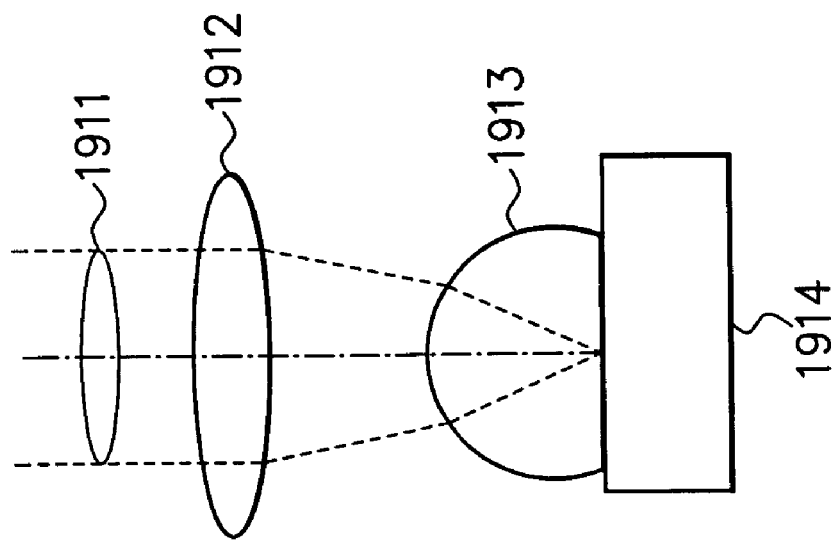
FIGS. 19A and 19B are diagrams showing examples of a solid immersion lens according to a fifteenth embodiment of the present invention.
Figure 19B:
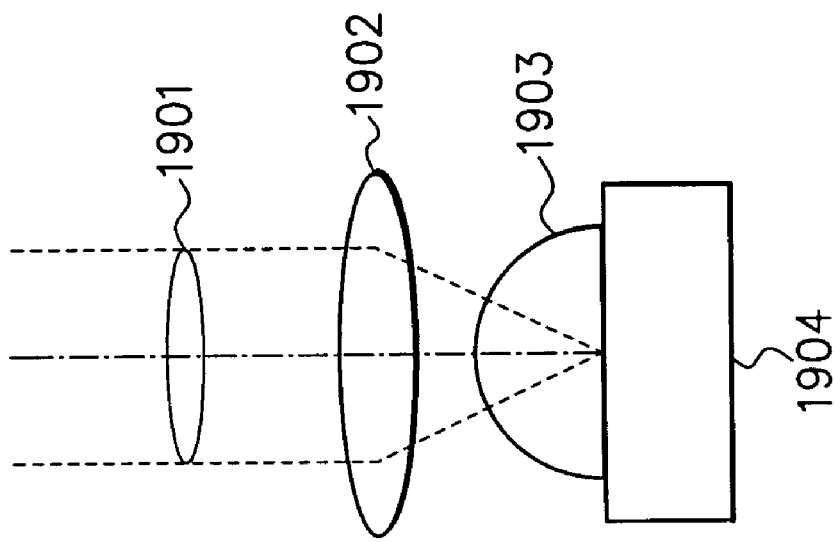

FIGS. 19A and 19B show examples of a solid immersion lens according to a fifteenth embodiment of the present invention. The light source and the light receiving optical system have the same structure as those in the first embodiment and so on, and a solid immersion lens (SIL) is used under the object lens. As a result, spatial resolution can be improved.

In FIG. 19A, a hemispherical SIL 1903 is provided under an object lens 1902. Incident light 1901 is irradiated to a substance to be measured 1904 through the object lens 1902 and the hemispherical SIL 1903.

In FIG. 19B, an super-hemispherical SIL 1913 is provided under an object lens 1912. Incident light 1911 is irradiated to a substance to be measured 1914 through the object lens 1912 and the super-hemispherical SIL 1913.

The super-hemispherical SIL 1913 has a shape obtained by increasing thickness of a semi-sphere by 1/n times (here, n is refractive index of a material of the SIL) of a spherical radius, and this shape can be also used as the SIL. In this case, the incident light is further focused and refracted when the light is incident on a spherical surface of the SIL, and spatial resolution can be improved by increasing NA of the object lens in the SIL even if the NA is not so large. Particularly, higher spatial resolution than the hemispherical SIL can be obtained when long distance is to be secured between the object lens and the SIL because it is difficult to secure large NA of the object lens.

[SIL]

(Structure 44) A solid immersion lens is provided to the focusing unit described above. As a method of improving general spatial resolution of a microscope, a method of using the solid immersion lens is known (for example, U.S. Pat. No. 5,004,307). As the focusing unit described above, for example, a solid immersion lens provided at the tip of a microscope object lens is used. A solid immersion lens made of a material which has high refractive index is used so that wavelength of the light passing therethrough is shortened. Supposing that the magnetic substance to be measured is completely adhered to the solid immersion lens, the diameter of a focusing spot irradiated to the magnetic substance is scaled down and spatial resolution is improved by the shortened wavelength due to the refractive index. Although a gap, albeit small, is actually generated between a bottom surface of the solid immersion lens and the magnetic substance, it is considered that the gap becomes closer to a completely adhered state when the gap is approximated to be sufficiently shorter than the light wavelength. In reality, this is explained by a Photon tunneling effect. Since the physical law adhered by the Photon tunneling effect and its magneto-optical effect has spatial rotational symmetry nature and spatial inversion symmetry nature, a part based thereon of the aforesaid discussion holds, and the perpendicular magnetization vector component and the in-plane magnetization vector components can be measured using the measurement methods described above as well as each component can be further separately measured using the methods described above.

Sixteenth Embodiment

FIGS. 20A to 20C show examples of a magnetic field probe according to a sixteenth embodiment of the present invention. The light source and the light receiving optical system have the same structure as those in the first embodiment and so on.

FIG. 20A shows an example of a light reflection type magnetic field probe in which a magnetic film 2004 is provided at the tip of a light transmission probe 2003. Incident light 2001 passes through an object lens 2002 and the probe 2003 and is reflected by the magnetic film 2004. Further, it is also suitable to make the light transmission probe 2003 itself of a material having the Faraday effect and provide a reflective film or reflective magnetic film 2004 on a lower surface thereof. This probe is placed on magnetization of a sample to be measured or in a magnetic field generated by a current and the aforesaid measurement method and detection unit are applied so that in-plane magnetic field vector components and perpendicular magnetic field vector component can be separately measured. Further, the probe is made finer and combined with a probe scanning unit or a sample scanning unit so that a scanning-type magnetic field vector measuring device can be constituted.

FIG. 20B is an example of a light reflection type magnetic field probe in which a finely protruding magnetic substance 2014 is provided at the tip of a light transmission probe 2013. Incident light 2011 passes through an object lens 2012 and the probe 2013 and is reflected by the finely protruding magnetic substance 2014. Further, it is also suitable to make the light transmission probe 2013 itself of a material having the Faraday effect and provide a finely protruding reflective substance or reflective magnetic film substance on a lower surface thereof.

FIG. 20C shows a probe 2023 having a spherical shape in which a magnetic film 2024 is formed on the lower side thereof to constitute a light reflection type magnetic field probe. Incident light 2021 passes through an object lens 2022 and the spherical probe 2023 and is reflected by the magnetic film 2024. Further, it is also suitable to make the probe 2023 itself of a material having the Faraday effect and form a light reflective film or reflective magnetic film 2024 on a lower surface thereof. The aforesaid measurement method and detection unit are applied so that the in-plane magnetic field vector components and the perpendicular magnetic field vector component can be separately detected.

Since a fine sphere can be made comparatively easily, an extremely small magnetic field probe having several μm diameter to sub-micron diameter can be made, which enables realization of a scanning-type probe microscope capable of separately measuring the in-plane magnetic field vector components and the perpendicular magnetic field vector component with high spatial resolution.

It should be noted that, when a film made of a ferromagnetic material film or a Faraday material made of a ferromagnetic material is used in the aforesaid cases, its own magnetic anisotropy, shape magnetic anisotropy, and magnetic domain structure may disturb the conditions for symmetry nature which enables complete separating measurement of the magnetic field vector components in some cases, but information to some extent of the magnetic field vector can be expected to be obtained.

Seventeenth Embodiment

Figure 21A:
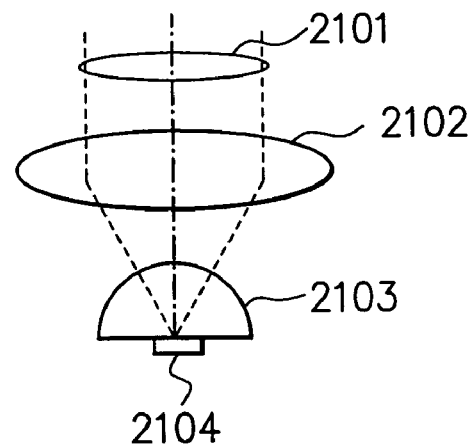
FIGS. 21A and 21B are diagrams showing examples of an SIL magnetic field probe according to a seventeenth embodiment of the present invention.
Figure 21B:
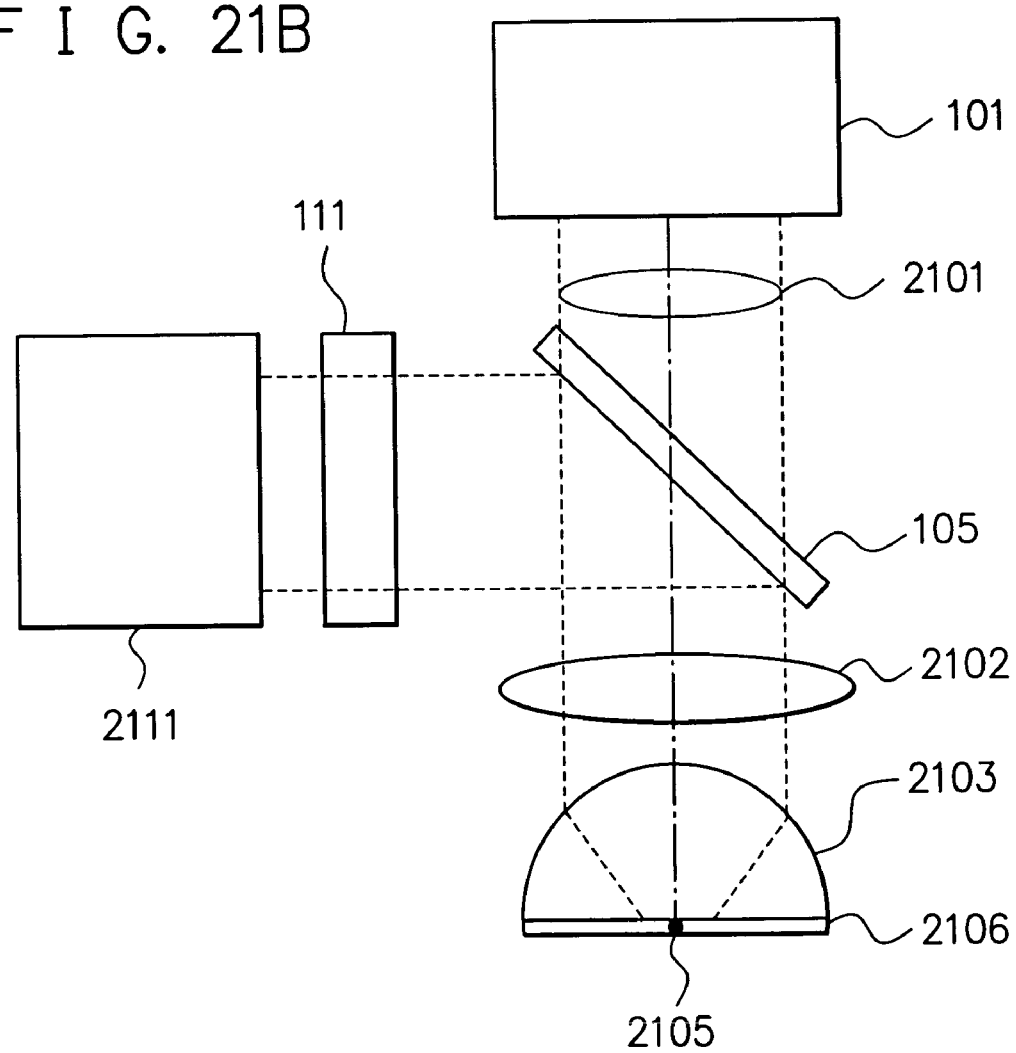

FIGS. 21A and 21B show examples of an SIL magnetic field probe according to a seventeenth embodiment of the present invention. The light source and the light receiving optical system have the same structure as those in the first embodiment and so on. A magnetic film 2104 is provided on a light irradiating part of a bottom surface of a hemispherical SIL (or super-hemispherical SIL) 2103. Incident light 2101 passes through an object lens 2102 and the hemispherical SIL 2103 and is reflected by the magnetic film 2104. Further, it is suitable to make the hemispherical SIL or super-hemispherical SIL 2103 itself of a material having the Faraday effect and provide the reflective film 2104 on the light irradiating part of its bottom surface. Furthermore, as shown in FIG. 21B, it is also suitable to form a fine magnetic substance 2105 on the bottom surface of the SIL 2103 and cover its periphery with a shielding film 2106. The shielding film 2106 may also covers over the fine magnetic substance 2105 and the SIL 2103. The incident light 2101 from the light source 101 is incident on the SIL through the beam splitter 105 and the object lens 2102. A polarization split detector 2111 corresponds to the polarization split detector 113 to 117, 119 to 121.

By applying the aforesaid measurement method and detection unit and placing this probe on magnetization of a sample to be measured or in a magnetic field generated by a current, in-plane magnetic field vector components and perpendicular magnetic field vector component can be separately measured. Since the SIL makes it possible to focus the light at a smaller focusing spot than general, spatial resolution can be improved. Further, spatial resolution beyond light diffraction limit can be also obtained by making the fine magnetic substance 2105 smaller than the focusing spot in the SIL.

Higher spatial resolution can be obtained with the super-hemispherical SIL than the hemispherical SIL when long distance is to be secured between the object lens and a Faraday probe because it is difficult to secure large NA of the object lens.

In the magnetic field probes in FIGS. 20A to 20C and FIGS. 21A and 21B described above, although an antireflection film may be formed on the upper surface side where the light is incident, it is also possible to conversely provide a reflective film to repeat reciprocation and reflection of the incident light in the probe or increase the magneto-optical effect such as the Kerr rotation or the Faraday rotation utilizing an optical resonator phenomenon to light having specific wavelength so that magnetic field measurement sensitivity is improved. Further, a multi-layer film can be also used as the magnetic film to increase sensitivity utilizing a resonance phenomenon.

[Magnetic Field Measurement]

(Structure 45) In the magnetization measuring device described above, a probe having the magnetic substance is provided in the focusing part in place of the magnetic substance to be measured, and each component of a magnetization vector of the magnetic substance is measured by the aforesaid measurement method and detection device so that spatial magnetic field vector components at a position where the magnetic substance is placed can be measured.

For example, the probe having the magnetic substance can be made by forming a magnetic film on a thin glass plate by vapor deposition or sputtering and processing it into a fine shape. This probe is placed in a magnetic field and perpendicular and in-plane magnetization vector components of the magnetic substance are measured by the aforesaid measurement method so that perpendicular and in-plane direction components of the magnetic field of a position where the magnetic substance is placed can be measured. The magnetic substance is formed in a needle shape, which can improve spatial resolution. Further, a concavo-convex image can be also measured by using a magnetic material protrusion as a needle of an atomic force microscope (AFM) and providing the same probe position control unit and scanning unit as those of the AFM. Furthermore, it can be also used as a magnetic force microscope (MFM).

(Structure 46) In the above description, the magnetic substance of the prove having the magnetic substance is a magnetic film with perpendicular magnetization. If a magnetic film with in-plane magnetization is used, hysteresis to an in-plane magnetic field is easily caused and response to the in-plane magnetic field does not become linear. Using the magnetic film with perpendicular magnetization, the hysteresis to the in-plane magnetic field decreases and the linearity of sensitivity becomes excellent. Further, high-frequency response characteristics to the in-plane magnetic field vector components can be made also excellent using strong perpendicular magnetic anisotropy.

(Structure 47) In the above description, a solid immersion lens having a magnetic substance on its bottom surface is provided to the focusing unit. The solid immersion lens having the magnetic substance on its bottom surface is used as a probe and the measurement method in the embodiments described above is applied so that a spatial magnetic field vector component can be measured. Since a smaller focusing spot than general can be obtained in the solid immersion lens, spatial resolution can be improved.

(Structure 48) In the above description, a solid immersion lens composed of a light transmission material which has a magneto-optical effect is provided to the focusing unit.

As a result, a spatial magnetic field vector component in a position where the solid immersion lens is placed can be measured. Its spatial resolution basically becomes to the same extent as the size of the solid immersion lens. However, spatial magnetic field distribution generated by the magnetic head and a spatial magnetic field generated by the magnetic film have surface distribution concentrated to a part extremely near a surface. Accordingly, distribution having resolution to the same extent as that of the focusing spot in the solid immersion lens can be measured and general spatial resolution can be improved.

Eighteenth Embodiment

Figure 22:
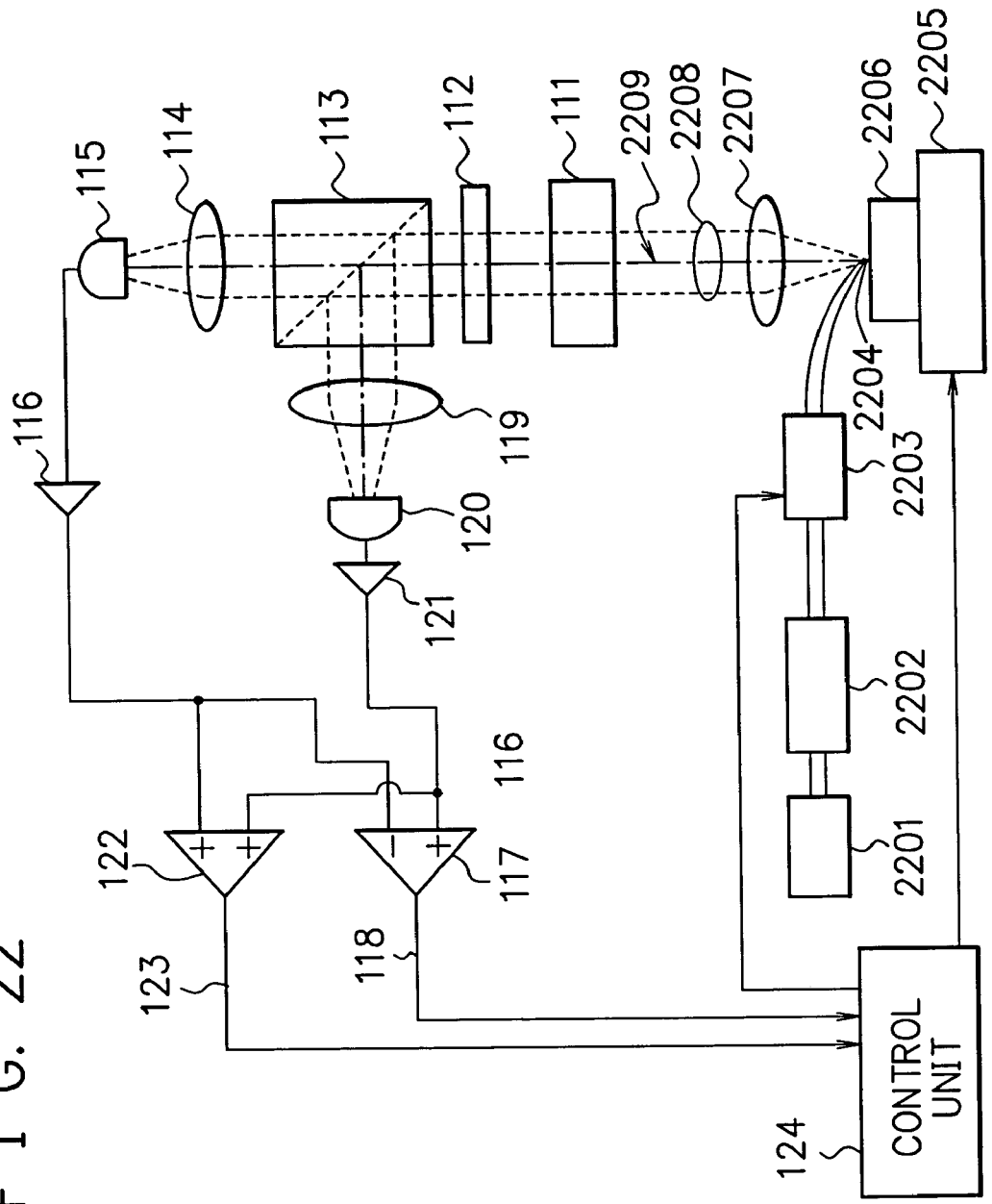
FIG. 22 is a diagram showing an example of a measuring device according to an eighteenth embodiment of the present invention.

FIG. 22 shows an example of a measuring device according to an eighteenth embodiment of the present invention. This is an example in which the present invention is applied to a reflection-type near-field microscope using an optical fiber probe 2204. The tip of the optical fiber probe 2204 as a first focusing unit is bent and substantially perpendicularly approximated to a surface of a magnetic substance to be measured 2206. A probe control unit 2203 controls a gap between the tip of the optical fiber probe 2204 and the magnetic substance to be measured 2206. For example, the fiber probe is vertically or horizontally oscillated by an oscillating device, and change in oscillation such as, for example, oscillation amplitude or an oscillation phase caused by force acting between the tip of the probe and the sample is detected by an oscillation sensor and fed back to a stage of the probe control unit 2203 or a sample stage 2205 for control.

Further, an object lens 2207 as a second focusing unit for focusing light reflected by the magnetic substance to be measured 2206 is arranged so that an optical axis 2209 is aligned with an axis perpendicular to a surface of the magnetic substance to be measured 2206. A polarization state of light from a light source 2201 is controlled and adjusted by a polarization controller 2202 so that polarization of the light outputted from the tip of the fiber probe 2204 becomes substantially linearly polarized light having a polarization azimuth at an angle along the reflectional symmetry plane of the half-turn asymmetric reflectional symmetry polarizing element 111 or perpendicular thereto. The light reflected by the magnetic substance to be measured 2206 is focused by the object lens 2207, the light 2208 is passed through the half-turn asymmetric reflectional symmetry polarizing element 111 such as the divisional half-wave element, divisional polarization rotation element, or divisional ¼ wave element, and then its polarization is detected in the polarization split and detection optical system constituted of the polarization beam splitter 113 and so on so that the differential polarization detection signal 118 and the sum signal 123 are taken into the control unit 124. In such a manner, irradiation of the near-field light, the focusing optical system for the reflected light, and the polarization split detection system can be made substantially reflectionally symmetric with respect to a plane including the polarization azimuth of the linearly polarized light outputted from the fiber probe 2204 and an optical axis of the reflected light. The structure stated above makes it possible in the near-field microscope to separately detect the in-plane magnetization vector components and the perpendicular magnetization vector component, and further to switch directions of the in-plane magnetization vector components to be measured or to switch to measurement of the perpendicular magnetization vector component.

Incidentally, providing a magnetic substance having light transmitting nature to the tip of the optical fiber probe also makes it possible to obtain information of components of different magnetic field vectors at the tip of the probe. Even a metal magnetic substance such as a permalloy generates light transmission nature if its thickness is made to several tens nm or smaller, and it can be used by being provided to the tip of the optical fiber probe. Further, it can be also used simply as the magnetic force microscope (MFM).

Nineteenth Embodiment

Figure 23:
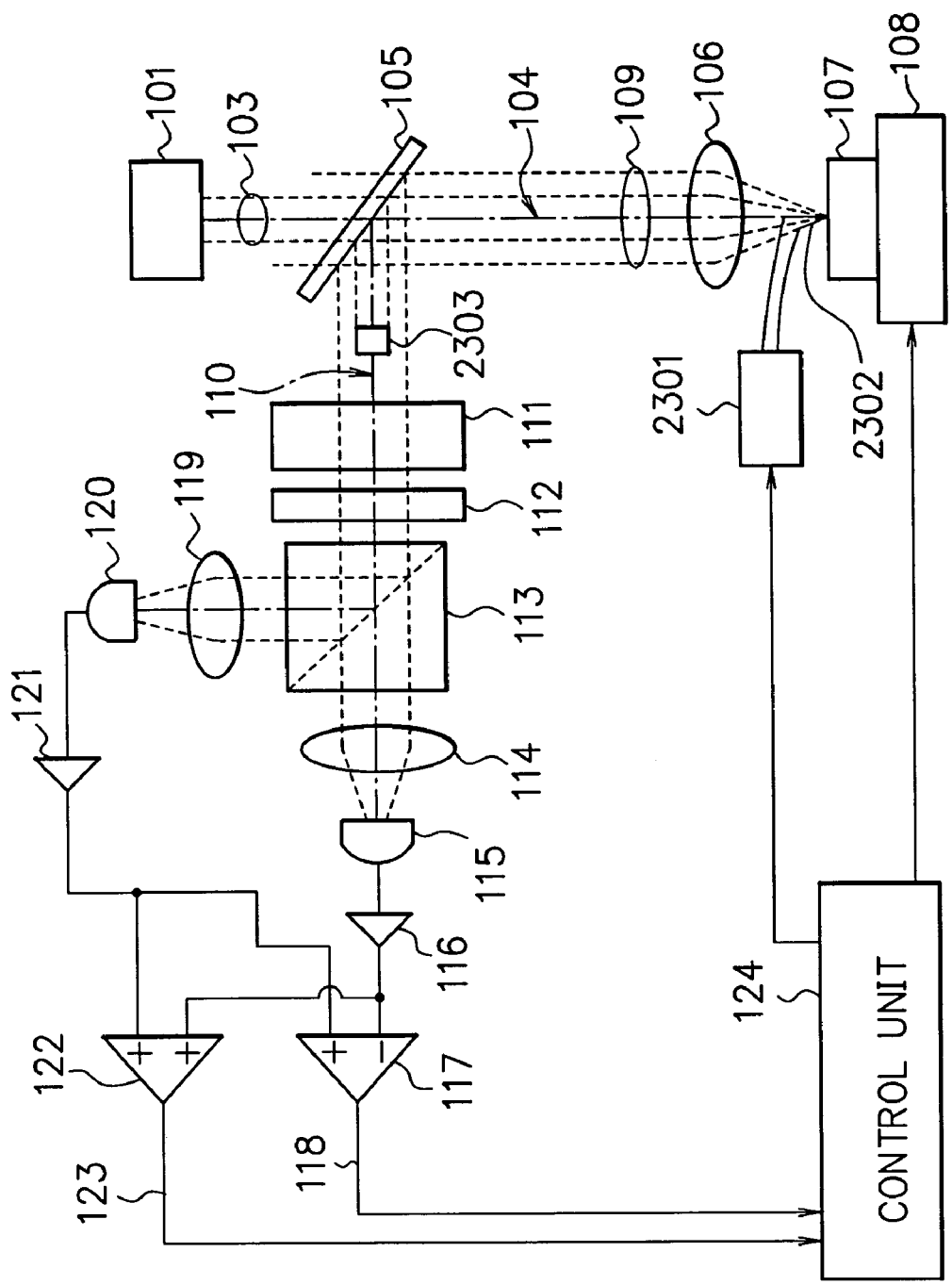
FIG. 23 is a diagram showing an example of a measuring device according to a nineteenth embodiment of the present invention.

FIG. 23 shows an example of a measuring device according to a nineteenth embodiment of the present invention. Used is a probe 2302 obtained by sharpening the tip of metal, silicon, or the like by etching or the like, and coating its surface with metal or the like if required, and its tip is directed substantially perpendicularly to the surface of the magnetic substance to be measured 107. The control unit 124 controls a probe control unit 2301 to control a position and scanning of the probe 2302 by the same method as that for the optical fiber probe 2204 and the atomic force microscope described above. Other parts are the same as those of the measuring device in FIG. 1.

The light 103 from the light source 101 is the linearly polarized light and focused by the object lens 106 to be irradiated to the tip of the probe 2302. The polarization azimuth of the irradiated linearly polarized light is aligned with the direction along the reflectional symmetry axis of the half-turn asymmetric reflectional symmetry polarizing element or the direction perpendicular thereto. The light scattered by the probe 2302 and the magnetic substance to be measured 107 is focused by the object lens 106, split by the beam splitter 105, passed through a shielding plate 2303 with not-dispersed light being blocked, and passed through the half-turn asymmetric reflectional symmetry polarizing element 111 such as the aforesaid divisional half-wave element, divisional polarization rotation element, or divisional ¼ wave element, and then polarization is detected by the polarization split detection optical system constituted of the polarization beam splitter 113 and so on so that the differential polarization detection signal 118 and the sum signal 123 are taken into the control unit 124. In such a manner, the probe 2302, the focusing optical system for the reflected light, and the polarization split detection system can be made substantially reflectionally symmetric with respect to the reflectional symmetry plane of the linearly polarized light from the light source 101. The structure stated above makes it possible in a scattering type near-field microscope to separately detect the in-plane magnetization vector components and the perpendicular magnetization vector component, and further to switch directions of the in-plane magnetization vector components to be measured or to switch to measurement of the perpendicular magnetization vector component.

Twentieth Embodiment

FIGS. 24A to 24E show examples of shielding plates 2403, 2415 according to a twentieth embodiment of the present invention. The shielding plates are installed in a position immediately before or after the half-turn asymmetric polarizing element 111 in FIG. 1, for example.

Figure 24A:
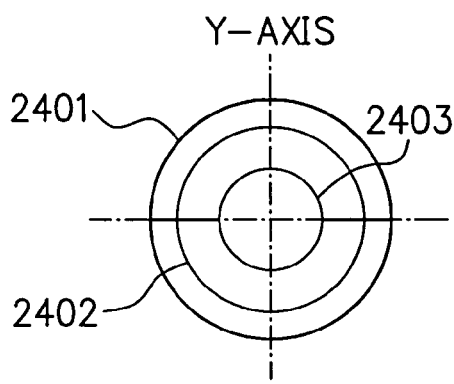
FIGS. 24A to 24E are diagrams showing examples of a shielding plate according to a twentieth embodiment of the present invention.

In FIG. 24A, a center part of a divisional optical element 2401 such as the divisional half-wave element, the divisional polarization rotation element, or the divisional ¼ wave element is shielded by the shielding plate 2403 having a disk shape. A region near the center of an optical axis of incident light 2402 where not many in-plane magnetization vector component signals exist is shielded so that measurement sensitivity and contrast in magnetization can be increased in some cases. Further, a super resolution effect is also generated. The shielding plate may have a rectangular shape. Moreover, the shielding plate may be a semitransparent plate for reducing transmittance of a partial region of the light.

Figure 24B:
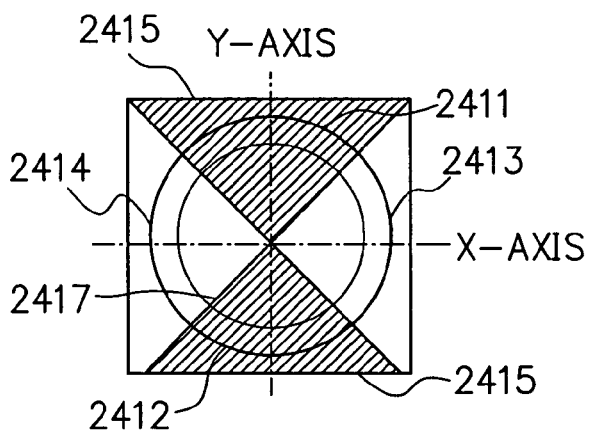
Figure 24C:
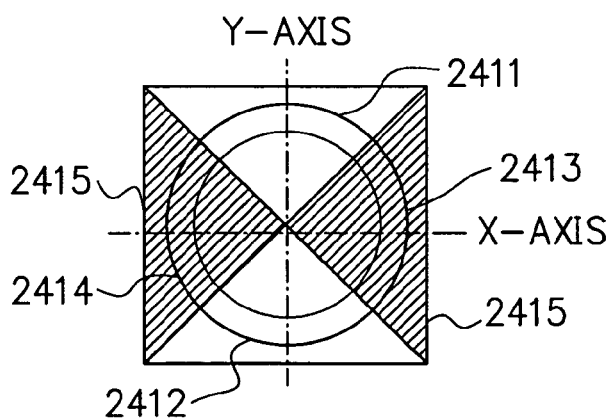

FIG. 24B shows a divisional optical element made so that the divisional half-wave element, the divisional polarization rotation element, the divisional ¼ wave element, or the like is constituted of different optical elements with ±45-degree lines intersecting in an optical axis of the incident light 2417 as boundaries, and upper and lower regions are shielded by the shielding plate 2415 having a shape as shown in the drawing. The circular divisional optical element has a first region 2411, a second region 2412, a third region 2413, and a fourth region 2414 respectively having a fan shape. The shielding plate 2415 shields the first region 2411 and the second region 2412 of the divisional optical element. Then, by rotating these shielding plates 2415 by 90 degrees as shown in FIG. 24C, the left and right regions can be shielded. In other words, the third region 2413 and the fourth region 2414 of the divisional optical element can be shielded.

Figure 24D:
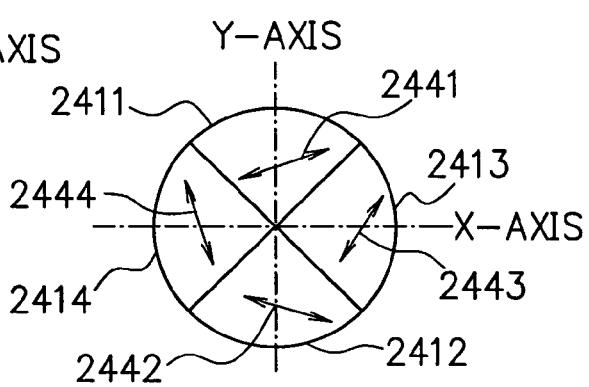
Figure 24E:
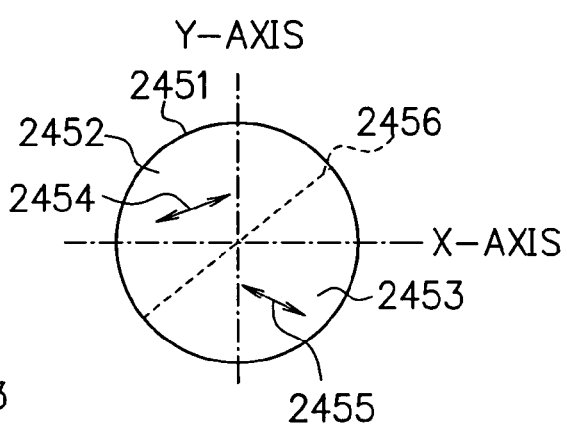

For example, in a divisional half-wave element shown in FIG. 24D, a neutral axis 2441 of a first region 2411 is 22.5 degrees, a neutral axis 2442 of a second region 2412 is −22.5 degrees, a neutral axis 2443 of a third region 2413 is 67.5 degrees, and a neutral axis 2444 of a fourth region 2414 is 112.5 degrees. When this divisional half-wave element is shielded, a magnetization vector component in the Y-axis direction can be measured in the upper and lower first and second regions 2411, 2412, while a magnetization vector component in the X-axis direction can be measured in the right and left third and fourth regions 2413, 2414, and therefore the X- and Y-magnetization vector components can be switched to be measured by proving shielding in FIGS. 24B and 24C to this divisional half-wave element by switching. Further, as a divisional half-wave element 2451 shown in FIG. 24E, it is also suitable to set a neutral axis 2454 of one half-wave plate region 2452 to +22.5 degrees and a neutral axis 2455 of the other half-wave plate region 2453 to −22.5 degrees with only a line of +45 degrees (−45 degrees is also possible) 2456 as a boundary. Furthermore, these main azimuths of ±22.5 degrees may be inverted in sign.

[Near-Field]

(Structure 49) In the above description, a near-field probe emitting light from a fine region is used as a first focusing unit for focusing the light from the light source and irradiating it to the magnetic substance, the light reflected by or passed through the magnetic substance is focused by a second focusing unit, and the aforesaid "divisional polarizer, divisional half-wave element, divisional polarization rotation element, divisional ¼ wave element, divisional phase modulator, divisional polarization rotation modulator, spatial phase modulator, or spatial polarization rotation modulator" is made to act on the focused light flux so that the magnetization vector components can be measured.

For example, such a near-field probe measurement method is known that a probe obtained by sharpening the tip of an optical fiber and coating it with a shielding film except its tip part so as to emit the near-field light from its tip opening part performs scanning to detect the light passed through or is scattered and reflected by a sample, and there is an example in which magnetized distribution of a magnetic film has been measured by a magneto-optical effect (E. Betzig et al., "Near-field magneto-optics and high density data storage", Appl. Phys. Lett. 61(2), 13, July 1992).

Since the physical law adhered by this near-field light and a magneto-optical interaction with the light has spatial rotational symmetry nature and spatial inversion symmetry nature, a part based thereon of the aforesaid discussion holds and, also in a near-field measurement method, it becomes possible to actively select directions of the in-plane magnetization vector components to be detected by applying the aforesaid measurement method to the part of the polarization detection system for the reflected light and the passed light. The perpendicular magnetization vector component and the two orthogonal in-plane components can be separately measured by using a near-field probe having the structure which can be approximately considered as axially symmetric.

Further, a method has been proposed in which spatial resolution is improved by the near-field light emitted at a fine opening which is provided at a bottom surface of a solid immersion lens and, also in this method, it becomes possible to actively select directions of the in-plane magnetization vector components to be detected. Furthermore, by giving the fine opening the approximately axially symmetric structure, the perpendicular magnetization vector component and the in-plane magnetization vector components can be separately measured by the methods of the embodiments described above.

Moreover, a method has been also proposed in which a saturable absorption layer whose transmittance increases by light irradiation is provided at a bottom surface of a solid immersion lens to form a fine opening by light irradiation and, also in this method, the perpendicular magnetization vector component and the in-plane magnetization vector components can be separately measured by the methods of the embodiments described above.

(Structure 50) The near-field probe described above includes a magnetic substance whose tip part has a magneto-optical effect so that spatial magnetic field vector components can be measured.

The magnetic substance is provided at the tip part of the near-field probe described above and its magnetization vector components are detected so that magnetic field vectors can be measured.

(Structure 51) A light scattering probe whose tip is arranged in a light spot position where light is focused by a focusing unit and the measurement method described above is applied so that magnetization vector components can be measured.

When a needle whose tip is sharpened or a fine sphere is used as a probe, the light is focused and irradiated to it, and the probe is made closer to a sample to be measured, the scattered light changes depending on a state of a surface of the sample. A scattering type near-field measurement method is known in which the probe conducts scanning at the surface of the sample and the scattered light is detected so as to measure the surface of the sample.

Since the physical law adhered by this near-field light and a magnetic optical interaction with the light has spatial rotational symmetry nature and spatial inversion symmetry nature, a part based thereon of the aforesaid discussion holds and, also in the near-field measurement method, it becomes possible to actively select directions of the in-plane magnetization vector components to be detected by applying the aforesaid measurement method to the part of the polarization detection system for the reflected light and the passed light. By using a probe having the structure which can be approximately considered as axially symmetric, it becomes also possible to separately measure the perpendicular magnetization vector component and the two orthogonal in-plane components.

(Structure 52) The aforesaid light scattering probe is constituted of a magnetic tip part with a magneto-optical effect so that spatial magnetic field vector components can be measured.

The tip part of the light scattering probe described above is constituted of the magnetic substance and its magnetization vector components are detected so that magnetic field vectors can be measured.

[Shielding]

(Structure 53) Provided is a shielding mask for shielding a part of the light flux or reducing transmission of the part of the light flux transmitted from or incident on the aforesaid "half-turn asymmetric polarized light source, divisional polarizer, divisional half-wave element, divisional polarization rotation element, divisional ¼ wave element, divisional phase modulator, divisional polarization rotation modulator, spatial phase modulator, or spatial polarization rotation modulator".

The polar Kerr effect becomes to maximum when the incident angle is zero while the effect decreases as the incident angle increases. On the other hand, the longitudinal and transverse Kerr effects become zero when the incident angle is zero while they reach peaks when the incident angle is a substantially large angel. Accordingly, by shielding a center part of the light flux, sensitivity to the perpendicular magnetization vector component can be reduced as compared with that to the in-plane magnetization vector components.

Further, even if the linearly polarized light is outputted from the light source, when the focused light is considered by separating it into the light having 360-degree different incident planes, each of the light has different P-polarization component and S-polarization component and, when the magneto-optical effect to the reflected light is considered by separating it into the longitudinal- and transverse Kerr effects, these effects are mixed. By shielding the light flux, measurement with changing their mixed ratio becomes possible.

(Structure 54) In Structure 53 described above, the shielding mask has the rotatable or movable structure to change its shielding region.

For example, the aforesaid divisional optical element is divided into four regions by ±45-degree lines with the optical axis as a center and these regions are classified into two regions having a symmetric shape. One of the regions has the structure for detecting one of the two orthogonal in-plane magnetization vector components and the other region has the structure for detecting the other one of the in-plane magnetization vector components. A shielding plate is made into such a shape as to shield only one of the regions and the shielding plate is rotated by 90 degrees so that measurement of the two orthogonal in-plane magnetization vector components can be switched.

[Modulation Detection]

(Structure 55) In the above description, a polarization modulator whose polarization state is controllable from the outside is provided at output of the light source.

For example, when a phase modulator capable of generating phase difference between zero and half-wave by setting its neutral axis azimuth angles to ±45 degrees with respect to the polarization azimuth of the light source, which outputs the linearly polarized light, is provided at output of the light source, the polarization azimuth of the light source can be changed by 90 degrees. The polarization modulator (phase modulator) in FIG. 15 is used as the half-wave plate 102 in FIG. 1, for example.

Even when the aforesaid optical system capable of detecting only the in-plane magnetization vector components is used, the perpendicular magnetization vector component is mixed by deviation of the optical system or ununiform distribution of the reflected light from the magnetic substance in some cases. In such a case, if measurement is conducted by changing the polarization of the light source by 90 degrees to obtain difference between results of both measurement, difference in polarization rotation angle by the perpendicular magnetization vector component between both polarization is small, but signs of polarization rotation angles are different in the case of the polarization rotation by the longitudinal Kerr effect to the in-plane magnetization vector components during when the incident angles of the P-polarization and the S-polarization are not so large. Accordingly, if difference in polarization rotation between both polarization is obtained, that is, actually a sum of outputs of the polarization detector is obtained because polarization rotation detection polarities of the polarization detector are inverted by the 90-degree switching of the light source polarization azimuth, the in-plane magnetization vector components can be detected while reducing the mixing of the perpendicular magnetization vector component.

Further, the sum of polarization rotation or the difference of outputs of the polarization detector between both measurement is obtained in a state of conducing perpendicular magnetization measurement, the perpendicular magnetization vector component can be measured while reducing mixing of the in-plane magnetization vector components and electromagnetic noise, offset, and the like of an amplifier which amplifies output of the photo-detector.

(Structure 56) In the above description, polarization modulators each of whose polarization states is controllable from the outside are provided at two positions in the optical path between the light source and the magnetic substance to be measured and in the optical path between the magnetic substance to be measured and the polarization split detector. For example, the polarization modulator in FIG. 15 is used as the half-wave plates 102 and 112 in FIG. 1. It is also suitable to provide the polarization modulator in FIG. 15 before half-turn asymmetric polarizing element 111.

When the polarization modulator is placed only at the output of the light from the light source and polarization is rotated by 90 degrees as in Structure 55 described above, it is necessary to obtain the sum of the outputs of the polarization split detector results of measurement between both polarization concerning the in-plane magnetization vector components, and electromagnetic noise, offset, and the like of a detective electric circuit cannot be canceled in this case. Therefore, if another polarization modulator is provided before the polarization split detector to cancel the rotation corresponding to polarization rotation by the polarization modulator on the light source side, inversion in polarity of the output from the polarization split detector caused by 90-degree rotation of polarization can be prevented. Accordingly, the in-plane magnetization vector components can be detected by difference of output from the polarization split detector between both polarization, and the perpendicular magnetization vector component is reduced as well as the electromagnetic noise, offset, and the like of the detective electric circuit can be canceled.

When the perpendicular magnetization vector component is measured, the operation of the polarization modulator on the polarization split detector side is stopped so that the perpendicular magnetization vector component can be detected by the difference of output from the polarization split detector between both polarization, and the in-plane magnetization vector components are reduced as well as the electromagnetic noise, offset, and the like of the detective electric circuit can be canceled.

(Structure 57) Modulation of the polarization modulator in Structures 55 and 56 described above is conducted cyclically to detect a signal component in synchronization with the modulation cycle.

Detectivity to any magnetization or magnetic field vector component is modulated and a signal in synchronization with the modulation is detected so that any magnetization or magnetic field element can be detected with high sensitivity. Further, a lock-in amplifier is used for the detection and modulation, which further increases the sensitivity.

(Structure 58) Modulation of modulation distribution characteristics of the aforesaid "divisional phase modulator, divisional polarization rotation modulator, spatial phase modulator, or spatial polarization rotation modulator" is conducted cyclically and a signal component is detected in synchronization with the modulation cycle.

For example, modulation for switching between two states, a state of measuring the perpendicular magnetization vector component and a state of measuring one component of the in-plane magnetization vector components is cyclically conducted and a signal component in synchronization with its modulation frequency is detected by calculating an average of difference between both measurement values or using a lock-in amplifier so that difference between both magnetization vector components can be detected with high sensitivity. In this case, if the magnetic substance to be measured is a magnetic film with perpendicular magnetization, the perpendicular magnetization vector component can be detected with high sensitivity because there is no in-plane magnetization vector component. If it is an in-plane magnetic film, the in-plane magnetization vector components can be detected with high sensitivity because there is no perpendicular magnetization vector component.

[Adjustment and Sensitivity Registration]

(Structure 59) A Faraday cell is provided before or after the magnetic substance to be measured or in the optical path where the light reflected by the magnetic substance to be measured reciprocates in the optical system described above, and a position and modulation spatial distribution of the aforesaid "half-turn asymmetric reflectional symmetry polarized light source, divisional polarizer, divisional half-wave element, divisional polarization rotation element, divisional ¼ wave element, divisional phase modulator, divisional polarization rotation modulator, spatial phase modulator, or spatial polarization rotation modulator" are adjusted so that a modulation amount of a polarization split detection signal according to modulation of the Faraday cell is minimized in order to find a position where detectivity to the perpendicular magnetization vector component is minimized.

When a Faraday cell placed in the optical path and uniformly causing polarization rotation in the whole of the light flux is modulated and the polarization detector makes output caused by the modulation, it is found that the optical system has axially symmetric sensitivity and sensitivity to the perpendicular magnetization vector component. By adjusting the position and the modulation distribution of the aforesaid divisional optical element so that a signal caused by the modulation of this Faraday cell becomes zero, the detection system can be adjusted so as to make the sensitivity to the perpendicular magnetization vector component zero. A method of adjustment is as follows, for example.

Adjustment algorism:
1: A proportional coefficient $\gamma$ of change dD in position D of the divisional optical element to change dF in signal modulation amount F caused by the modulation of the Faraday cell is measured and registered ($\gamma$=dD/dF).
2: i=1.
3: F(i) at a position D(i) is measured.
4: If an absolute value of F(i) is smaller than a designated value, adjustment is completed.
5: D(i+1)=D(i)–$\gamma$×F(i).
6: i=i+1. Repeat from the third line.

(Structure 60) A Faraday cell whose polarization rotation angle has been previously corrected or measured is provided before or after the magnetic substance to be measured or in the optical path where the light reflected by the magnetic substance to be measured reciprocates in the optical system described above, and the relationship between output of the polarization split detector and the polarization rotation angle is registered by the Faraday cell in the state of measuring the perpendicular magnetization vector component, and the output of the polarization split detector is converted to the polarization rotation angle using the registered relationship in measuring the in-plane magnetization vector components.

In measuring only the in-plane magnetization vector components separately, sensitivity of the polarization split detector to polarization rotation in the Faraday cell becomes zero and the Faraday cell cannot be used as it is for the conversion to the polarization rotation angle. Therefore, the relationship between the polarization rotation angle previously corrected or measured of the Faraday cell and the output of the polarization split detector is measured and registered so that measurement values of the in-plane magnetization vector components can be converted to the polarization rotation angle from the output of the polarization split detector in measuring the in-plane magnetization vector components and the registered relationship.

[Magnetic Recording Device]

(Structure 61) Provided is a magnetic recording device which includes a magnetic recording medium fixed to or detachably fixed to a position moving unit or a rotating unit and which is characterized in that magnetization vector components of the magnetic recording medium or surface magnetic field vector components of the magnetic recording medium is measured by the aforesaid measurement method or measuring device so as to read recording information.

Magnetization directions and magnetization intensity of the magnetic recoding medium, which have been magnetized in positive and negative directions along two orthogonal in-plane directions or plural different directions and recorded, can be read by the methods and devices in the embodiments described above. Further, magnetization directions and magnetization intensity of the magnetic recording medium, which have been magnetized in positive and negative directions along a perpendicular direction and recorded, can be also read by switching from the state of measuring the in-plane magnetization vector components by the methods and devices in the embodiments described above. Furthermore, magnetization directions and magnetization intensity of the magnetic recording medium, which have been magnetized in positive and negative directions along two orthogonal in-plane directions or plural different directions and a perpendicular direction and recorded, can be read by switching magnetization directions to be measured by the methods and devices in the embodiments described above. Moreover, magnetization directions and magnetization intensity of the magnetic recording medium, which have been magnetized in any direction and recorded, can be read by switching between several different magnetization vector components by the methods and devices in the embodiments described above.

Twenty-First Embodiment

Figure 25:
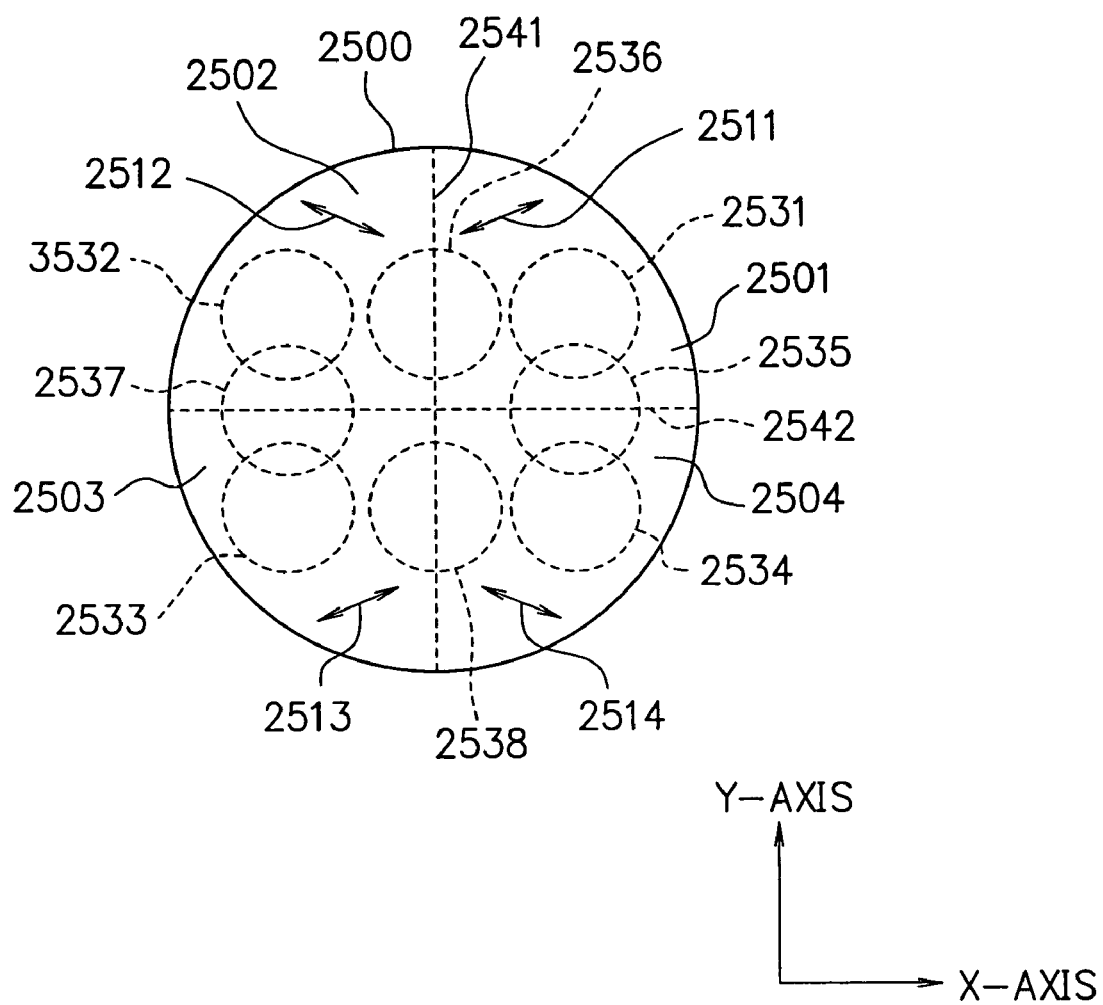
FIG. 25 is a diagram showing an orthogonal four-divided half-wave plate as a constitutional example of a divisional half-wave plate according to a twenty-first embodiment of the present invention.

FIG. 25 shows an orthogonal four-divided half-wave plate 2500 as a constitutional example of a divisional half-wave plate according to a twenty-first embodiment of the present invention. A neutral axis of a first half-wave plate 2501 is +22.5 degrees, a neutral axis of a second half-wave plate 2502 is −22.5 degrees, a neutral axis of a third half-wave plate 2503 is +22.5 degrees, and a neutral axis of a fourth half-wave plate 2504 is −22.5 degrees. The half-wave plates having the neutral axis azimuths of ±22.5 degrees have different neutral axis azimuths with a first divisional boundary 2541 and a second divisional boundary 2542 perpendicular to each other therebetween.

Figure 26:
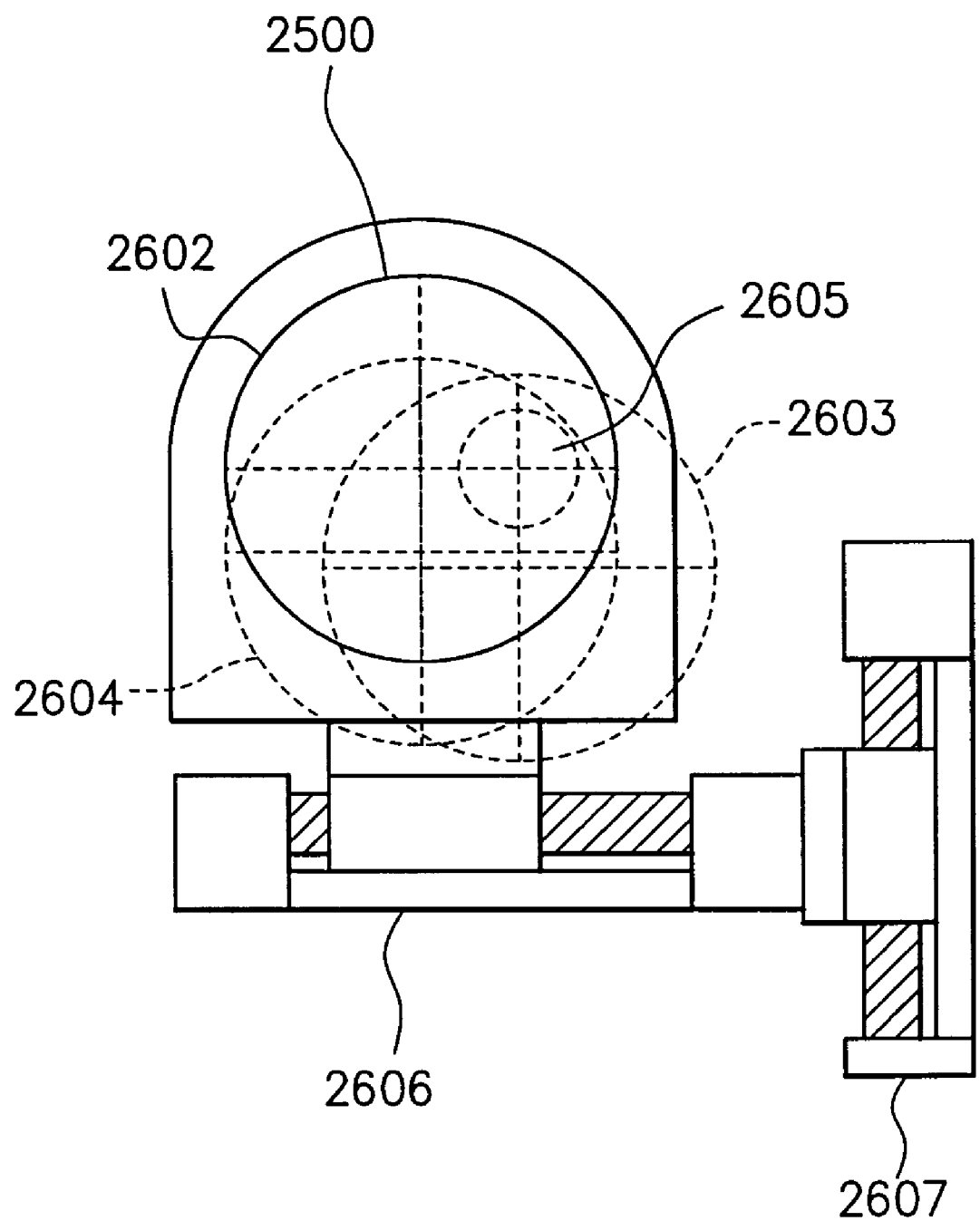
FIG. 26 is a diagram showing the orthogonal four-divided half-wave plate fixed to a moving stage.

As shown in FIG. 26, this orthogonal four-divided half-wave plate 2500 is fixed to two states 2606 and 2607 having perpendicular moving axes, and placed in the optical path passed by the reflected light flux from the magnetic substance to be measured (the position of 111 in FIG. 1, for example) or an output position of the light source (the position of 1203 in FIG. 12, for example). The movement of these two stages 2606 and 2607 makes it possible to switch a position of the orthogonal four-divided half-wave plate 2500 where light flux 2605 is incident between light beam cross-sectional positions 2531 to 2538 in FIG. 25. At the positions 2531 to 2534, the perpendicular magnetization vector component can be measured. At the positions 2535 and 2537, the in-plane magnetization vector Y-component can be measured. At the positions 2536 and 2538, the in-plane magnetization vector X-component can be measured. For example, the in-plane magnetization vector X-component can be measured at a position 2602 in FIG. 26, the in-plane magnetization vector Y-component can be measured at a position 2603, and the perpendicular magnetization vector component can be measured at a position 2604.

Polarities of sensitivity to the perpendicular magnetization vector component at the positions 2532 and 2534 are inverted from those at the positions 2531 and 2533 in FIG. 25. Further, polarities of sensitivity to the in-plane magnetization vector Y-component are inverted between the positions 2535 and 2537 while polarities of sensitivity to the in-plane magnetization vector X-component are inverted between the positions 2536 and 2538.

By obtaining difference in result of measuring distribution and over time change waveforms of the perpendicular magnetization vector component and the in-plane X- and Y-components at these positions where polarities are inverted from each other, an S/N of measurement can be improved while canceling background noise such as electromagnetic noise.

Further, the position where the light flux is incident can be set to an optical position by finely adjusting it with respect to the first boundary 2541 and the second boundary 2542. Furthermore, also when the incident light flux position deviates by laser scanning, the position where the light flux is incident can be adjusted afterward.

Incidentally, a rotational stage for rotating the orthogonal four-divided half-wave plate around the optical axis may be further provided.

[Orthogonal Four-divided Half-wave Plate+Biaxial Stage]

(Structure 62) The "half-turn asymmetric polarizing element" of Structure 1 described above at least includes two of a first and a second boundary orthogonally intersecting each other as divisional boundaries whose adjacent regions have different optical characteristics, has four regions divided by these two boundaries, and has a biaxial stage capable of moving this optical element in two different directions, in which the movement of this stage makes it possible to switch a position of the optical element passed by the light flux between positions on the first boundary and on the second boundary and a region without the boundaries. It is also suitable to divide into five or more regions instead of dividing into four regions.

Measurement of the two orthogonal in-plane magnetization vector components and measurement of the perpendicular magnetization vector component can be switched. Further, a position of the "half-turn asymmetric polarizing element" where the light flux is incident can be freely adjusted in two orthogonal directions in measuring the two orthogonal in-plane magnetization vector components. Further, even if the position of the "half-turn asymmetric polarizing element" where the light flux is incident deviates by laser scanning, the position can be freely adjusted to make the light flux incident on a right position.

Twenty-Second Embodiment

Figure 27:
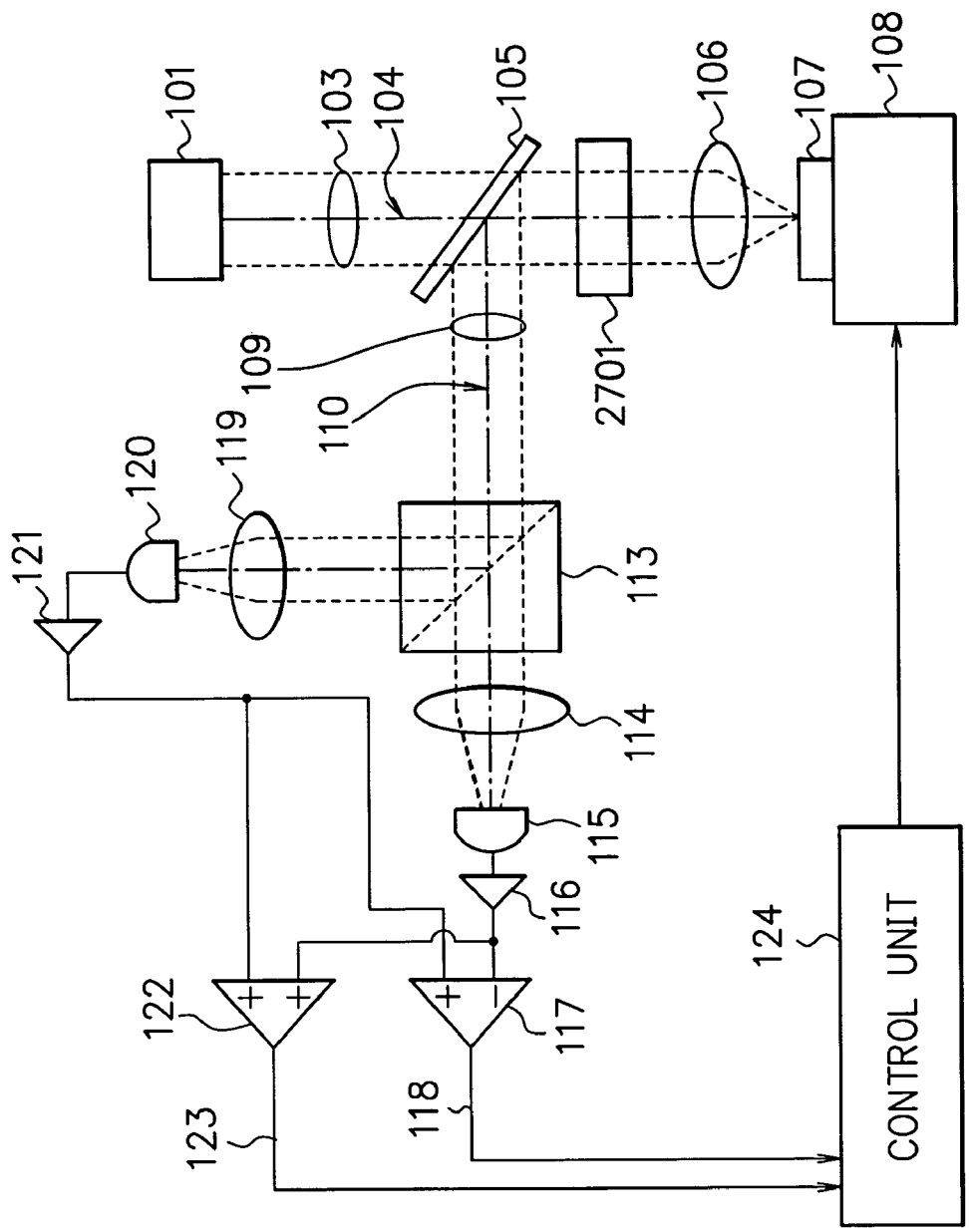
FIG. 27 is a diagram showing a measuring device according to a twenty-second embodiment of the present invention.

FIG. 27 shows a measuring device according to a twenty-second embodiment of the present invention and a variation example of the devices in FIG. 9, FIG. 10A, and FIG. 10B. A divisional half-wave element 2701 is included in the optical path above the object lens 106 as the focusing unit where the light flux reciprocates (between the object lens 106 and the beam splitter 105) in place of the "half-turn asymmetric polarizing elements"111 in FIG. 1. The divisional half-wave element 2701 is inserted at this position so that half-turn symmetry nature of the optical characteristics of the optical system can be disturbed and the in-plane magnetization vector components of the magnetic substance to be measured can be measured.

Figure 28B:
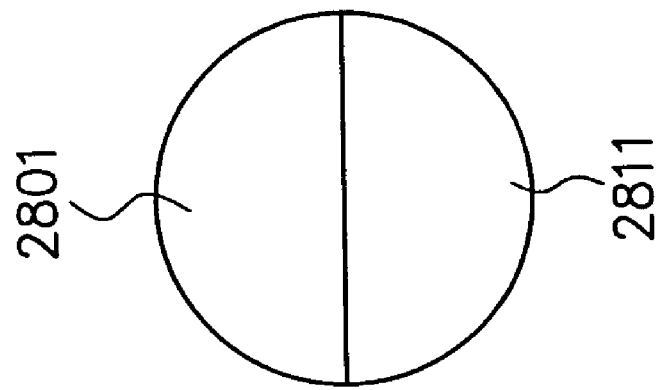
FIGS. 28A and 28B are diagrams showing examples of a divisional half-wave element provided above an object lens.
Figure 28A:
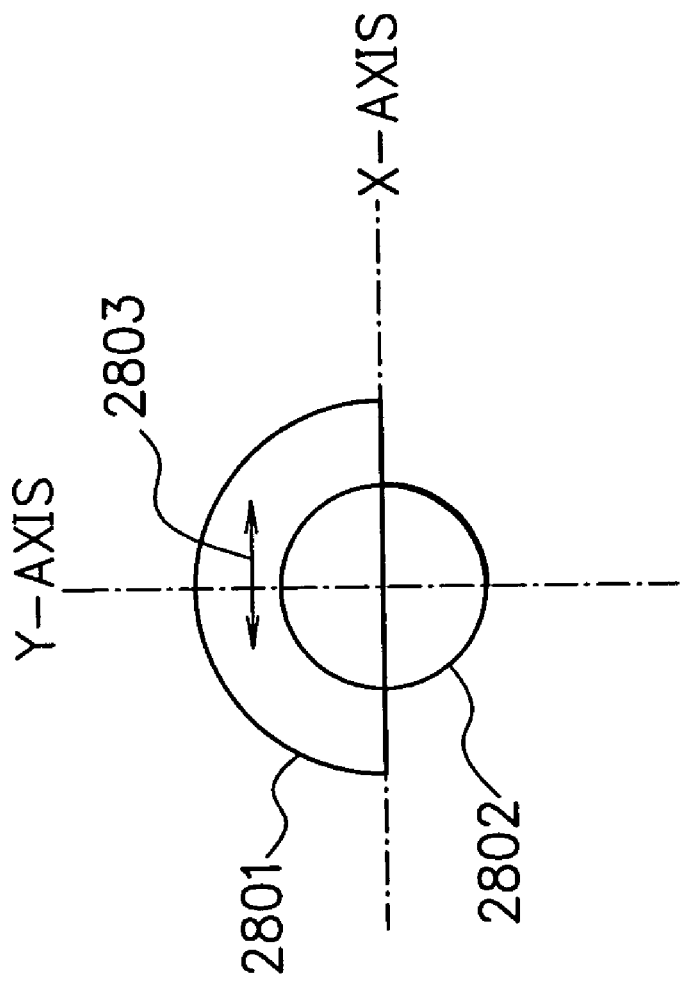

FIGS. 28A and 28B are examples of the divisional half-wave element 2701 provided above the object lens 106 in FIG. 27, and the structure itself is the same as that in FIGS. 2A and 2B. The light from the light source is linearly polarized light and its polarization azimuth is aligned with a neutral axis azimuth angle (0 degree) 2803 of a divisional half-wave element 2801. When light 2802 from the light source passes through the divisional half-wave element 2801, it is incident on the focusing unit without being changed in polarization. Therefore, the action on a polarization state becomes equivalent to the case when the divisional half-wave element 2801 is placed in the optical path passed only by the reflected light, and the in-plane magnetization vector components can be measured. In FIG. 28B, an upper-half divisional half-wave plate 2801 and a lower-half glass plate 2811 are bonded and appropriate refractive index and thickness are given to them so that wavefront characteristics of the incident light from the light source can be prevented from being disturbed.

Figure 29:
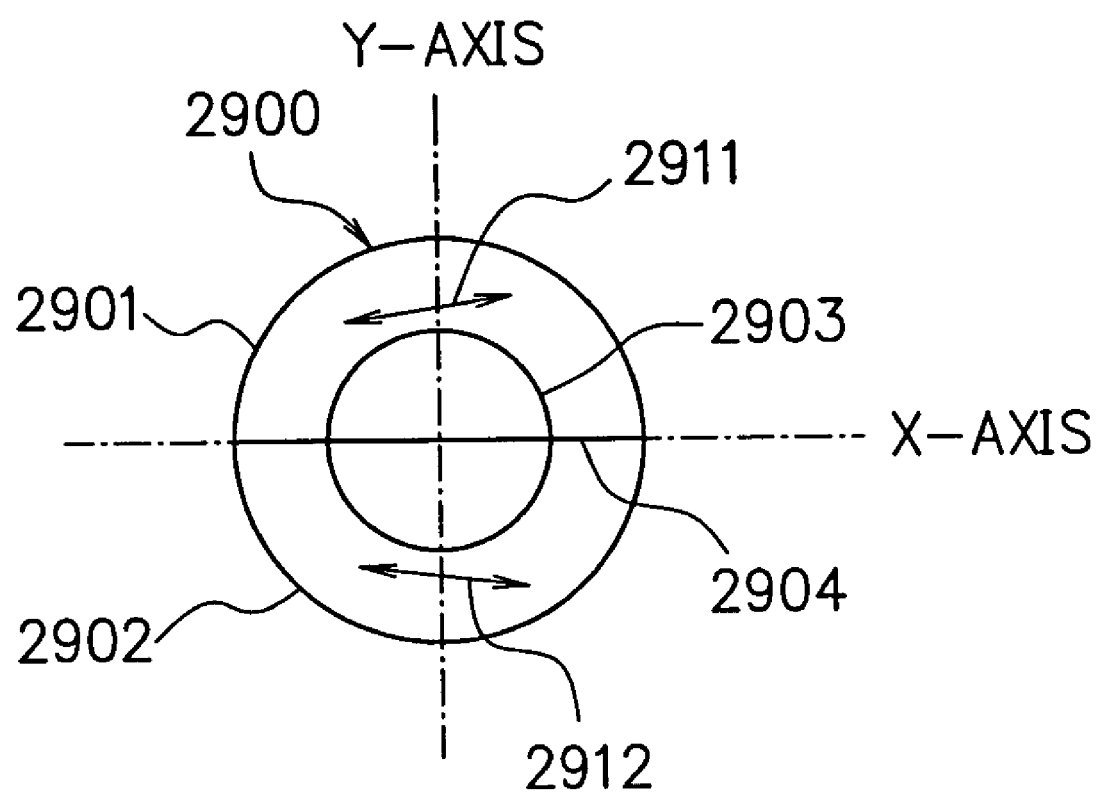
FIG. 29 is a diagram showing another example of the divisional half-wave element provided above the object lens.

FIG. 29 is another example of the divisional half-wave element 2701 provided above the object lens 106 in FIG. 27. This divisional half-wave element 2900 is constituted of a half-wave element divided into two half-wave element regions 2901 and 2902 with a straight line 2904 as a boundary in an incident light flux cross section 2903 in which neutral axes 2911 and 2912 of the respective two regions 2901 and 2902 make angles of ±θ having an equal absolute value with respect to the boundary 2904. This boundary 2904 is set to intersect the optical axis. For example, the neutral axis 2911 of the first half-wave plate 2901 is +θ (+11.25 degrees) and the neutral axis 2912 of the second half-wave plate 2902 is −θ (−11.25 degrees).

An example in which ±θ are ±11.25 degrees is particularly shown here. When the polarization azimuth of the incident light is 0 degree, a polarization azimuth of the light of the incident light flux passed through the first half-wave plate 2901 whose neutral axis azimuth is +11.25 degrees becomes +22.5 degrees, the light reflected by the magnetic substance to be measured passes through the second half-wave plate 2902 whose neutral axis azimuth is −11.25 degrees and, assuming that the Kerr rotation is δ degree, its polarization azimuth becomes −45−δ degree. As for the light of the incident light flux passed through the second half-wave plate 2902, its reflected light passes through the first half-wave plate 2901 and its polarization azimuth becomes +45−δ degree.

When change in polarization is detected by a polarization split detector for separating polarization into a 0-degree or 90-degree azimuth, the Kerr rotation in both regions is detected with opposite polarities. Accordingly, the perpendicular magnetization vector component is not detected and only the in-plane magnetization vector component of an azimuth perpendicular to the boundary of the divisional half-wave element is detected. When differential polarization is detected, it is suitable to set values of ±θ to ±11.25 degrees.

Figure 30:
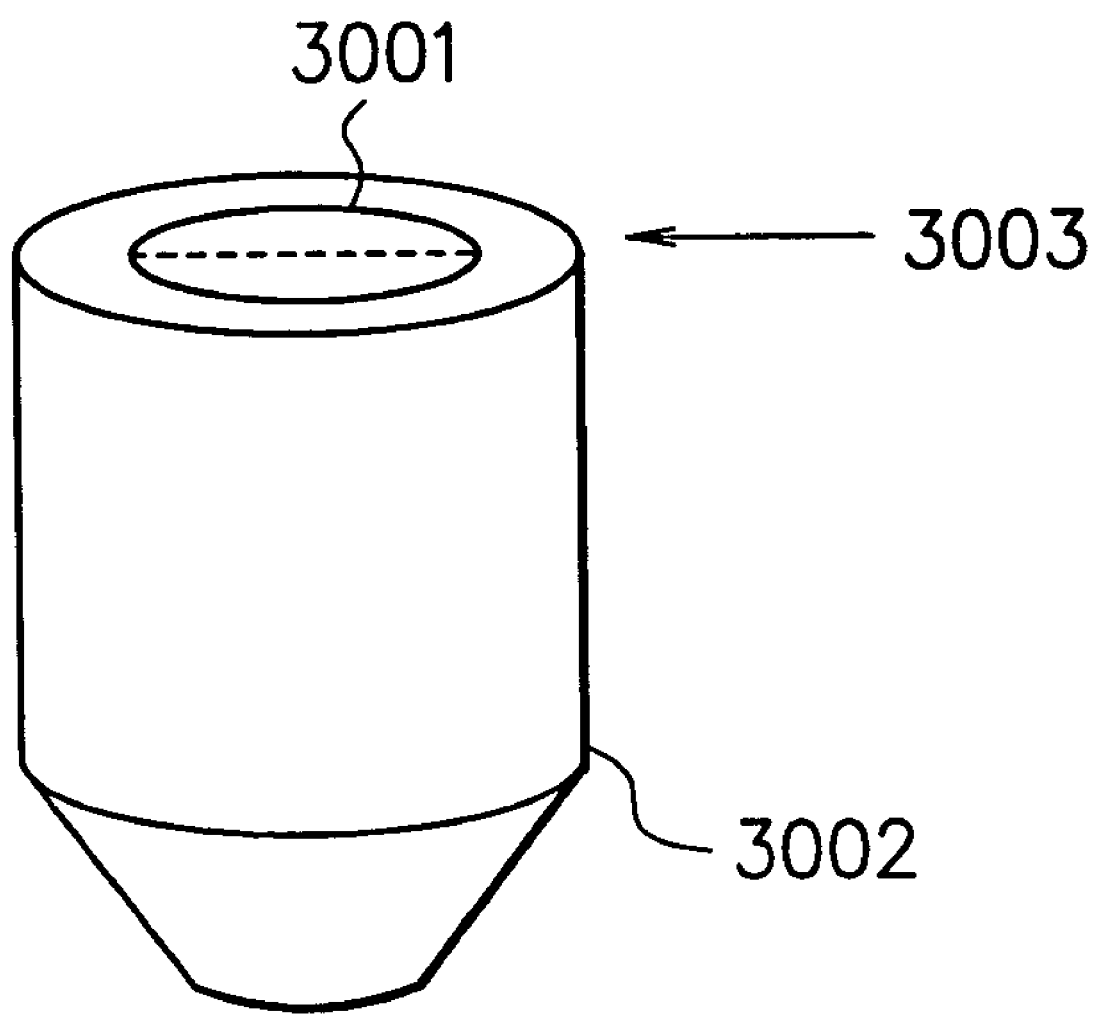
FIG. 30 is a diagram showing an example of a divisional half-wave element placed at an incident pupil position of the object lens.

In FIG. 30, the divisional half-wave element 3001 in FIG. 28A, FIG. 28B, and FIG. 29 is placed in an incident pupil position 3003 of an object lens 3002 as a focusing unit. By placing the divisional half-wave element 3001 at the position 3003, the center axis of the light flux passing through the divisional half-wave element 3001 does not deviate from the boundary of the divisional half-wave element 3001 if the incident beam diameter is sufficiently larger than the pupil diameter even when the light flux position diagonally incident on the pupil position 3003 deviates by laser scanning, and a position of the divisional half-wave element 3001 passed by the reflected light flux from the magnetic substance to be measured also does not deviate. Therefore, deviation of the light flux incident on the polarization split detector from the center axis of the position of the divisional half-wave element passed by the light flux can be reduced, which can reduce mixing of the perpendicular magnetization vector component.

[Divisional Half-wave Element Before Focusing Unit]

(Structure 63) A measuring device for measuring the in-plane magnetization vector components of the magnetic substance to be measured is provided by including the light source, the focusing unit for focusing the light flux from the light source and irradiating it to the magnetic substance to be measured, the polarization split detector for detecting a light amount of a polarization component in one direction, or each component of polarization components perpendicular to each other by separation, using a photo-detector, to detect change in polarization state or light amount of the light flux reflected by the magnetic substance to be measured due to the magneto-optical effect, and the divisional half-wave element placed in the optical path before the focusing unit where the light reciprocates and acting in such a manner that its action on polarization distribution in the light flux cross section has asymmetry nature about half-turn around the optical axis.

The divisional half-wave element for acting in such a manner that its action on polarization distribution in the light flux cross section has asymmetry nature about half-turn around the optical axis is included in the optical path before the focusing unit where the light reciprocates so that symmetry nature of the optical system about half-turn is disturbed and sensitivity to the in-plane magnetization vector components can be obtained.

[One-side Divisional Half-wave Element Before Focusing Unit]

(Structure 64) Provided is a measuring device in which the divisional half-wave element of Structure 63 described above is a divisional half-wave element having a half-wave element which acts only on one of two regions divided by a straight line intersecting the optical axis in the light flux cross section as a boundary and whose neutral axis azimuth is parallel to or perpendicular to the boundary.

The light from the light source is the linearly polarized light and its polarization azimuth is aligned with the neutral axis azimuth of the divisional half-wave element. The light from the light source is incident on the focusing unit without being changed in polarization state when the light passes through the divisional half-wave element while the light reflected by the magnetic substance to be measured is changed in polarization by the magneto-optical effect, and therefore polarization distribution receives action in passing through the divisional half-wave element. Accordingly, the action on the polarization state is equivalent to the state in which the divisional half-wave element is placed in the optical path passed only by the reflected light so that the in-plane magnetization vector components can be measured.

[±θ Divisional Half-wave Elements Before Focusing Unit]

(Structure 65) Provided is a measuring device in which the divisional half-wave element of Structure 63 described above is divisional half-wave elements divided into two regions in the light flux cross section with a straight line as a boundary and having neutral axes in the respective two regions which make angles of the same absolute value except zero with opposite signs with respect to the boundary.

The angles between the neutral axes of the two regions of the divisional half-wave element and the boundary are +θ degree and −θ degree and the element is placed so that the boundary intersects the optical axis of the optical system. The polarized light outputted from the light source is linearly polarized light parallel to or perpendicular to this boundary and have half-turn symmetry nature around the optical axis and reflectional symmetry nature. In this case, a polarization azimuth of the incident light passing through the region of the divisional half-wave element whose neutral axis is +θ degree becomes +2θ degree and a polarization azimuth of the reflected light passing through the focusing unit, reflected by the magnetic substance to be measured, and passing through the region of the divisional half-wave element whose neutral axis is −θ degree becomes −2θ−δ degree assuming that the Kerr rotation is δ degree. A polarization azimuth of the light passing through the region on the opposite side becomes +2θ−δ degree.

When change in polarization is detected by a polarization split detector for separating and detecting polarization of a 0-degree or 90-degree azimuth, the Kerr rotation in both regions is detected with opposite polarities. Accordingly, the perpendicular magnetization vector component is not detected and only the in-plane magnetization vector component of an azimuth perpendicular to the boundary of the divisional half-wave element is detected.

Further, more strictly speaking, considering that this divisional half-wave element is the "half-turn asymmetric reflectional symmetry polarizing elements" not having half-turn symmetry nature around the optical axis and having reflectional symmetry nature with respect to the plane which includes the boundary and the optical axis as the reflectional plane, it is directly understood that only the in-plane magnetization vector component in the azimuth perpendicular to the boundary of the divisional half-wave element is be detected.

[±11.25-degree Divisional Half-wave Elements In Reciprocated Optical Path]

(Structure 66) Provided is a measuring device which is characterized in that angles between the neutral axes of the divisional half-wave elements of Structure 65 described above and the aforesaid boundary are +11.25 degrees and −11.25 degrees.

In this case, a polarization azimuth of the incident light passing through the region of the divisional half-wave element whose neutral axis is +11.25 degrees becomes +22.5 degrees and a polarization azimuth of the reflected light passing through the focusing unit, reflected by the magnetic substance to be measured, and passing through the region of the divisional half-wave element whose neutral axis is −11.25 degrees becomes −45−δ degree assuming that the Kerr rotation is δ degree. A polarization azimuth of the light passing through the region on the opposite side becomes +45−δ degree. When change in polarization is detected by a differential polarization detector for separating polarization into 0-degree and 90-degree azimuths, its detected output becomes zero because orthogonal polarization have equal intensity when there is no Kerr rotation, and therefore the perpendicular magnetization vector component is not detected while only the in-plane magnetization vector component of the azimuth perpendicular to the boundary of the divisional half-wave element is detected similarly to Structure 63 described above. Since the output of the differential polarization detector when there is no Kerr rotation can be made zero, influence of light amount noise is not easily received and a high measurement S/N is obtained.

[±θ-degree Divisional Half-wave Elements At Focusing Unit Pupil Position]

(Structure 67) The divisional half-wave element of Structure 63 described above is positioned at a pupil of the focusing unit.

When laser scanning is conducted by providing the laser scanning system, a position of the light flux on which the divisional half-wave element acts can be prevented from deviating due to a laser scanning position even if the position of the light flux incident on the object lens deviates due to the laser scanning because the center of the laser light flux, which has been reflected by the magnetic substance to be measured and has passed through an object lens pupil, coincides with the boundary of the divisional half-wave element as long as the diameter of the light flux incident on the object lens is sufficiently larger than the pupil diameter of the object lens. Therefore, the in-plane magnetization vector components can be accurately measured in a wide viewing range. Further, also when an image of magnetized distribution is observed by an imaging lens and an image detecting element or when visual observation is conducted by the imaging lens and an eyepiece lens and eye, the in-plane magnetization vector components can be accurately measured in a wide viewing range.

[SIL Magnetic Field Measurement Device With Fine Magnetic Substance]

(Structure 68) In Structure 47 described above, the magnetic substance provided to the solid immersion lens is made smaller than the focusing spot diameter and a shielding film is provided around it.

By making the magnetic substance provided to the solid immersion lens smaller than the focusing spot diameter, spatial resolution of magnetic field measurement can be made smaller than the focusing spot diameter beyond light diffraction limit. Further, in the case of measuring magnetic field leakage generated from a magnetic film to be measured, or the like, it can be prevented that the light deviated from the magnetic substance of the solid immersion lens is irradiated to the magnetic substance to be measured and the reflected light which has received a magnetic Kerr effect is incident on the polarization split detector to disturb magnetic field measurement. Although light reflection at the magnetic substance is close to a light scattering phenomenon by fine magnetic substance particles in this case, the method of separately measuring the in-plane magnetization vector components based on symmetry nature of the physical law described above is effective also in such a case.

As stated above, according to the embodiments described above, the in-plane magnetization and/or magnetic field vector components can be measured separately from the perpendicular magnetization and/or magnetic field vector components while keeping the simple structure of the polarization split detector, which enables detection with a high S/N. Further, it becomes possible with the simple structure to measure the two orthogonal in-plane magnetization vector components and the perpendicular magnetization vector component, or the two orthogonal in-plane magnetic field vector components and the perpendicular magnetic field vector component by switching.

Furthermore, assuming that a two-divided or four-divided photo-detector is used, it can be applied only to the scanning-type laser microscope measurement method. In the embodiments of the present invention, not only the scanning-type laser microscope measurement method but also simultaneous observation of an image by the camera or visual check becomes possible. Moreover, the present invention can be also applied to the solid immersion lens and the near-field probe microscope, which makes it possible to measure the in-plane magnetization vector components separately from the perpendicular magnetization vector component with resolution beyond the limit of a general optical microscope.

As explained above, the in-plane magnetization and/or magnetic field vector components can be measured separately from the perpendicular magnetization and/or magnetic field vector components while keeping the simple structure of the polarization split detector, which enables detection with a high S/N. Further, it becomes possible with the simple structure to measure the two orthogonal in-plane magnetization vector components and the perpendicular magnetization vector component, or two orthogonal in-plane magnetic field vector components and the perpendicular magnetic field vector component by switching.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A measuring device for measuring an in-plane magnetization vector component of a magnetic substance to be measured, comprising:
    a light source;
    a focusing unit for focusing light flux from said light source and irradiating it to the magnetic substance to be measured;
    a polarization split detector for detecting a light amount of a polarization component in one direction or for separating each component of polarization components orthogonal to each other using a polarizer and photo-detectors in order to detect a change in polarization state or light amount of the light flux reflected by the magnetic substance to be measured due to a magneto-optical effect; and
    a half-turn asymmetric polarizing element acting only on the reflected light from the magnetic substance to be measured and acting in such a manner that its action on polarization distribution in a cross section of incident light flux has an asymmetric nature of about a half-turn around an optical axis.

2. The measuring device according to claim 1,
    wherein said half-turn asymmetric polarizing element is a half-turn asymmetric reflectional symmetry polarizing element whose action on the incident light flux has reflectional symmetry nature with respect to a certain plane including the optical axis so that only one component of the in-plane magnetization vectors of the magnetic substance to be measured can be measured separately from the other orthogonal components.

3. The measuring device according to claim 2,
    wherein said half-turn asymmetric reflectional symmetry polarizing element is divided by a straight line in two regions in the cross section of light flux, and each of the two regions is constituted of a half-wave element whose angles of a neutral axis from the straight line are +22.5 degree and −22.5 degree.

4. The measuring device according to claim 1,
    wherein said half-turn asymmetric polarizing element is a divisional half-wave element constituted of a half-wave element acting on a part of the cross section of the light flux to generate half-wave phase difference, or half-wave elements having different neutral axis azimuths in divided regions in the cross section of the light flux.

5. The measuring device according to claim 1,
    wherein said half-turn asymmetric polarizing element is a divisional polarization rotation element having non-uniform polarization rotation action in the cross section of the light flux.

6. The measuring device according to claim 1,
    wherein said half-turn asymmetric polarizing element is a divisional phase modulator capable of controlling a phase difference generated in each divisional region.

7. The measuring device according to claim 1,
    wherein the photo-detector has an image detection element and an imaging lens for forming an image on the image detection element so that image data of in-plane magnetized distribution of the magnetic substance to be measured can be obtained.

8. The measuring device according to claim 1,
    wherein said focusing unit includes a near-field probe for generating near-field light and a focusing part for focusing propagation light generated as a result of interaction of the near-field light and the magnetic substance to be measured.

9. The measuring device according to claim 1, further comprising:
    a probe having the magnetic substance,
    wherein the magnetization vector component of the magnetic substance of said probe is measured so that spatial magnetic field vector components at a probe position can be measured.

10. The measuring device according to claim 1, further comprising:
    a light scanning unit for scanning a focusing spot position where a light beam from said light source is focused by said focusing unit; and
    an automatic position control stage for moving and controlling a position of said half-turn asymmetric polarizing element in synchronization with scanning in at least one direction by said light scanning unit.

11. The measuring device according to claim 1, further comprising:
    a relay lens for optically aligning a position of the light flux incident on said half-turn asymmetric polarizing element with a position of a pupil of said focusing unit.

12. The measuring device according to claim 1,
    wherein said half-turn asymmetric polarizing element receives passed light or passed and reciprocated light through the magnetic substance to be measured, and measures polarization rotation of the magnetic substance to be measured due to a Faraday effect.

13. The measuring device according to claim 1,
    wherein said focusing unit includes a solid immersion lens.

14. The measuring device according to claim 1, further comprising:
    a probe having the magnetic substance in a focusing part of said focusing unit, wherein the magnetization vector component of the magnetic substance of said probe is measured so that spatial magnetic field vector components at a position where said probe is placed can be measured.

15. The measuring device according to claim 1,
wherein said focusing unit is constituted of a focusing lens or a focusing mirror, a light scattering type near-field probe arranged at a focusing position thereof and having a sharp tip, wherein the light scattered at the probe tip and the magnetic substance to be measured is focused to detect change in polarization state or reflectivity thereof.

16. The measuring device according to claim 1, further comprising:
a Faraday cell provided before the magnetic substance to be measured or in an optical path where the light reflected by the magnetic substance to be measured reciprocates,
wherein a position and modulation spatial distribution of said half-turn asymmetric polarizing element are controlled to minimize a modulation amount of an output signal of said polarization split detector caused by modulation of said Faraday cell so that a position where detection of perpendicular magnetization vector component is minimized can be found.

17. The measuring device according to claim 1, further comprising:
a Faraday cell which is provided before the magnetic substance to be measured or in an optical path where the light reflected by the magnetic substance to be measured reciprocates and whose polarization rotation angle is previously corrected; and
a conversion unit for registering a relationship between an output of said polarization split detector and a polarization rotation angle by said Faraday cell in a state of measuring a perpendicular magnetization vector component, and converting the output of said polarization split detector to the polarization rotation angle using the registered relationship in measuring the in-plane magnetization vector component.

18. The measuring device according to claim 1, further comprising:
a Faraday cell provided in an optical path before the polarization split detector,
wherein a position or modulation spatial distribution of said half-turn asymmetric polarization element are contolled to minimize a modulation amount of an output signal of said polarization split detector caused by modulation of said Faraday cell so that the position or modulation spatial distribution where detection of a perpendicular magnetization vector component is minimized can be found.

19. The measuring device according to claim 1, further comprising:
a Faraday cell provided in an optical path before the polarization split detector and whose polarization rotation angle is previously corrected; and
a conversion unit for registering a relationship between an output of said polarization split detector and a polarization rotation angle by said Faraday cell in a state of measuring a perpendicular magnetization vector component, and converting the output of said polarization split detector to the polarization rotation angle using the registered relationship in measuring the in-plane magnetization vector component.

20. A measuring device comprising:
a half-turn asymmetric reflectional symmetry polarized light source, as a light source, for outputting light flux whose intensity distribution has a symmetric nature while polarization state distribution does not have a symmetric nature of about a half-turn around an optical axis in a cross section of the light flux perpendicular to the optical axis, as well as whose intensity distribution and polarization state distribution in the cross section of the light flux are both symmetric about a reflection with respect to a certain plane including the optical axis as a boundary plane;
a focusing unit for focusing the light flux from said half-turn asymmetric reflectional symmetry polarized light source and irradiating it to a magnetic substance to be measured; and
a polarization split detector for detecting a light amount of a polarization component in one direction or for separating each component of polarization components orthogonal to each other using a polarizer and photodetectors in order to detect a change in polarization state or light amount of the light flux reflected by the magnetic substance to be measured due to a magneto-optical effect,
wherein an optical element, existing in an optical path from the light output of said light source to a position immediately before said polarization split detector and acting on the light flux, acts on light intensity distribution and polarization distribution in the light flux which is symmetric around half-turn around an optical axis and reflection with respect to the boundary plane, and one or two polarization split detection azimuths orthogonal to each other of said polarization split detector and the boundary plane or a reflectional symmetry plane of the light flux incident, when there is no magneto-optical action by the magnetic substance to be measured, is set to make angles of integral multiples of 90 degrees, so that only one component of in-plane magnetization vectors of the magnetic substance to be measured can be measured separately from the other orthogonal components.

21. The measuring device according to claim 18,
wherein said half-turn asymmetric reflectional symmetry polarized light source includes:
a natural light source, a partially polarized light source, or a linearly polarized light source; and
a divisional polarizer constituted of a polarizer which takes one of the polarization components and acting acts non-uniformly in a cross section of light flux outputted from the light source.

22. The measuring device according to claim 18,
wherein said half-turn asymmetric reflectional symmetry polarized light source includes:
a linearly polarized light source; and
a divisional half-wave element having an element which generates a half-wave phase difference and acts non-uniformly in a cross section of light flux outputted from the linearly polarized light source.

23. The measuring device according to claim 18,
wherein said half-turn asymmetric reflectional symmetry polarized light source includes:
a linearly polarized light source; and
a divisional polarization rotation element having an element which rotates the polarization and acts non-uniformly in a cross section of light flux outputted from the light source.

24. The measuring device according to claim 20, wherein the photo-detector has an image detection element and an imaging lens for forming an image on the image detection element so that image data of in-plane magnetized distribution of the magnetic substance to be measured can be obtained.

25. A measuring device for separately measuring only one component of in-plane magnetization vectors of a magnetic substance to be measured from the other orthogonal components, comprising:

a light source;

a focusing unit for focusing light flux from said light source and irradiating it to the magnetic substance to be measured;

a polarization split detector for detecting a light amount of a polarization component in one direction or for separating each component of polarization components orthogonal to each other using a polarizer and photo-detectors to detect change in polarization state or light amount of the light flux reflected by the magnetic substance to be measured due to a magneto-optical effect; and a divisional half-wave element placed in an optical path between said light source and said focusing unit where the light reciprocates, and constituted of half-wave elements which are divided into two regions with a straight line as a boundary in a cross section of the light flux and whose respective neutral axes in the two regions and the boundary make angles of the same absolute value with opposite signs.

26. The measuring device according to claim 25, wherein the photo-detector has an image detection element and an imaging lens for forming an image on the image detection element so that image data of in-plane magnetized distribution of the magnetic substance to be measured can be obtained.

27. A measuring device for measuring an in-plane magnetization vector component of a magnetic substance to be measured, comprising:

a light source;

a focusing unit for focusing light flux from said light source and irradiating it to the magnetic substance to be measured;

a polarization split detector for detecting a light amount of a polarization component in one direction or for separating each component of polarization components orthogonal to each other using a photo-detector to detect a change in polarization state or light amount of the light flux reflected by the magnetic substance to be measured due to a magneto-optical effect; and a divisional half-wave element in an optical path before said focusing unit where the light reciprocates, whose action on the polarization distribution in a cross section of the light flux has an asymmetric nature of about a half-turn around an optical axis.

28. The measuring device according to claim 27, wherein the photo-detector has an image detection element and an imaging lens for forming an image on the image detection element so that image data of in-plane magnetized distribution of the magnetic substance to be measured can be obtained.

* * * * *